United States Patent
Ohtsuki et al.

(10) Patent No.: US 7,098,992 B2
(45) Date of Patent: Aug. 29, 2006

(54) LIGHT SOURCE UNIT AND WAVELENGTH STABILIZING CONTROL METHOD, EXPOSURE APPARATUS AND EXPOSURE METHOD, METHOD OF MAKING EXPOSURE APPARATUS, AND DEVICE MANUFACTURING METHOD AND DEVICE

(75) Inventors: Tomoko Ohtsuki, Allentown, PA (US); Soichi Owa, Setagaya-ku (JP); Niichi Atsumi, Ota-ku (JP); Masaaki Doi, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/618,590

(22) Filed: Jul. 15, 2003

(65) Prior Publication Data

US 2004/0012844 A1 Jan. 22, 2004

Related U.S. Application Data

(63) Continuation of application No. 09/831,345, filed as application No. PCT/JP00/05875 on Aug. 30, 2000, now abandoned.

(30) Foreign Application Priority Data

| Sep. 10, 1999 | (JP) | 11-257969 |
| Sep. 10, 1999 | (JP) | 11-258089 |
| Sep. 13, 1999 | (JP) | 11-259615 |
| May 24, 2000 | (JP) | 2000-153320 |
| Jun. 26, 2000 | (JP) | 2000-190806 |

(51) Int. Cl.
*G03B 27/72* (2006.01)
*G03B 27/42* (2006.01)
*G03B 27/54* (2006.01)
*G02F 1/35* (2006.01)

(52) U.S. Cl. .............. 355/69; 355/53; 355/67; 359/326

(58) Field of Classification Search ............ 355/53, 355/69, 67; 372/68, 21; 250/492.22, 548; 385/34, 33; 359/820, 326

See application file for complete search history.

(56) References Cited

U.S. PATENT DOCUMENTS 4,790,619 A 12/1988 Lines et al.

(Continued)

FOREIGN PATENT DOCUMENTS

EP 0 859 435 8/1998

(Continued)

*Primary Examiner*—Peter B. Kim
(74) *Attorney, Agent, or Firm*—Oblon, Spivak, McClelland, Maier & Neustadt, P.C.

(57) ABSTRACT

The light source unit includes a single wavelength oscillation light source, a light generating portion which has an optical modulator converting and emitting light from the light source into a pulse light, a light amplifying portion made up of an optical fiber group in which each fiber has a fiber amplifier to amplify the pulse light from the optical modulator, and a light amount controller. The light amount controller performs a step-by-step light amount control by individually turning on/off the light output of each fiber making up the optical fiber group, and a light amount control of controlling at least either of the frequency or the peak power of the emitted pulse light of the optical modulator. Accordingly, in addition to the step-by-step light amount control, fine adjustment of the light amount in between the steps becomes possible due to the control of at least either the frequency or the peak power of the pulse light, and if the set light amount is within a predetermined range, the light amount can be made to coincide with the set light amount.

82 Claims, 9 Drawing Sheets

U.S. PATENT DOCUMENTS

| | | |
|---|---|---|
| 4,923,279 A | 5/1990 | Ainslie et al. |
| 5,745,284 A | 4/1998 | Goldberg et al. |
| 5,838,709 A | 11/1998 | Owa |
| 5,909,306 A | 6/1999 | Goldberg et al. |
| 6,400,871 B1 | 6/2002 | Minden |
| 6,590,698 B1 | 7/2003 | Ohtsuki et al. |
| 2001/0048083 A1 | 12/2001 | Hagiwara |
| 2003/0081192 A1 * | 5/2003 | Nishi .......................... 355/69 |

FOREIGN PATENT DOCUMENTS

| | | |
|---|---|---|
| EP | 0 889 335 | 1/1999 |
| JP | 54-125189 | 9/1979 |
| JP | 55-44758 | 3/1980 |
| JP | 59-55083 | 3/1984 |
| JP | 3-235924 | 10/1991 |
| JP | 4-22928 | 1/1992 |
| JP | 5-37066 | 2/1993 |
| JP | 5-291676 | 11/1993 |
| JP | 8-334803 | 12/1996 |
| JP | 11-4031 | 1/1999 |
| WO | WO 99/46835 | 9/1999 |

* cited by examiner

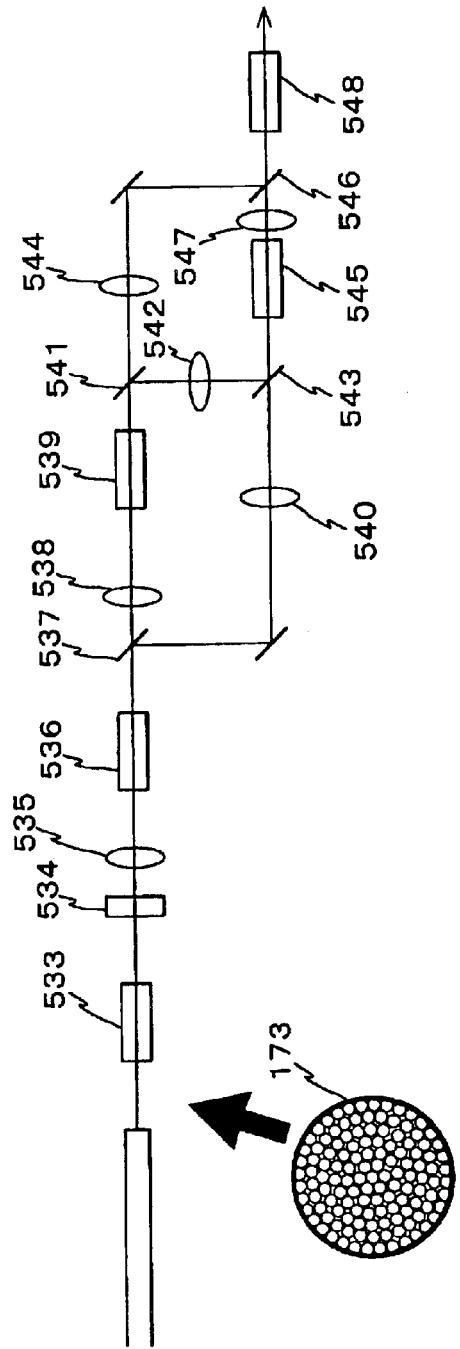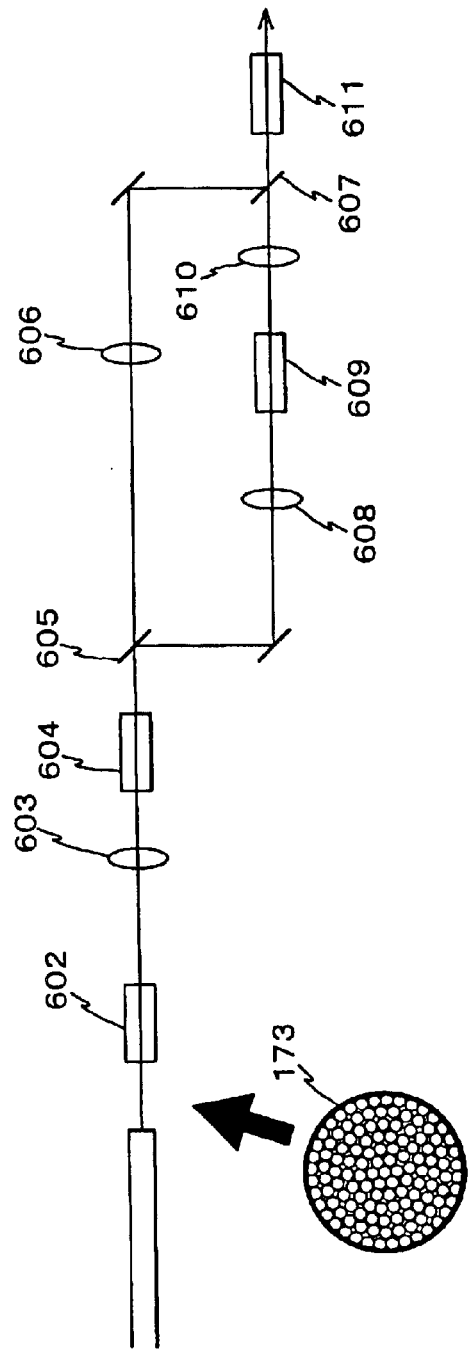

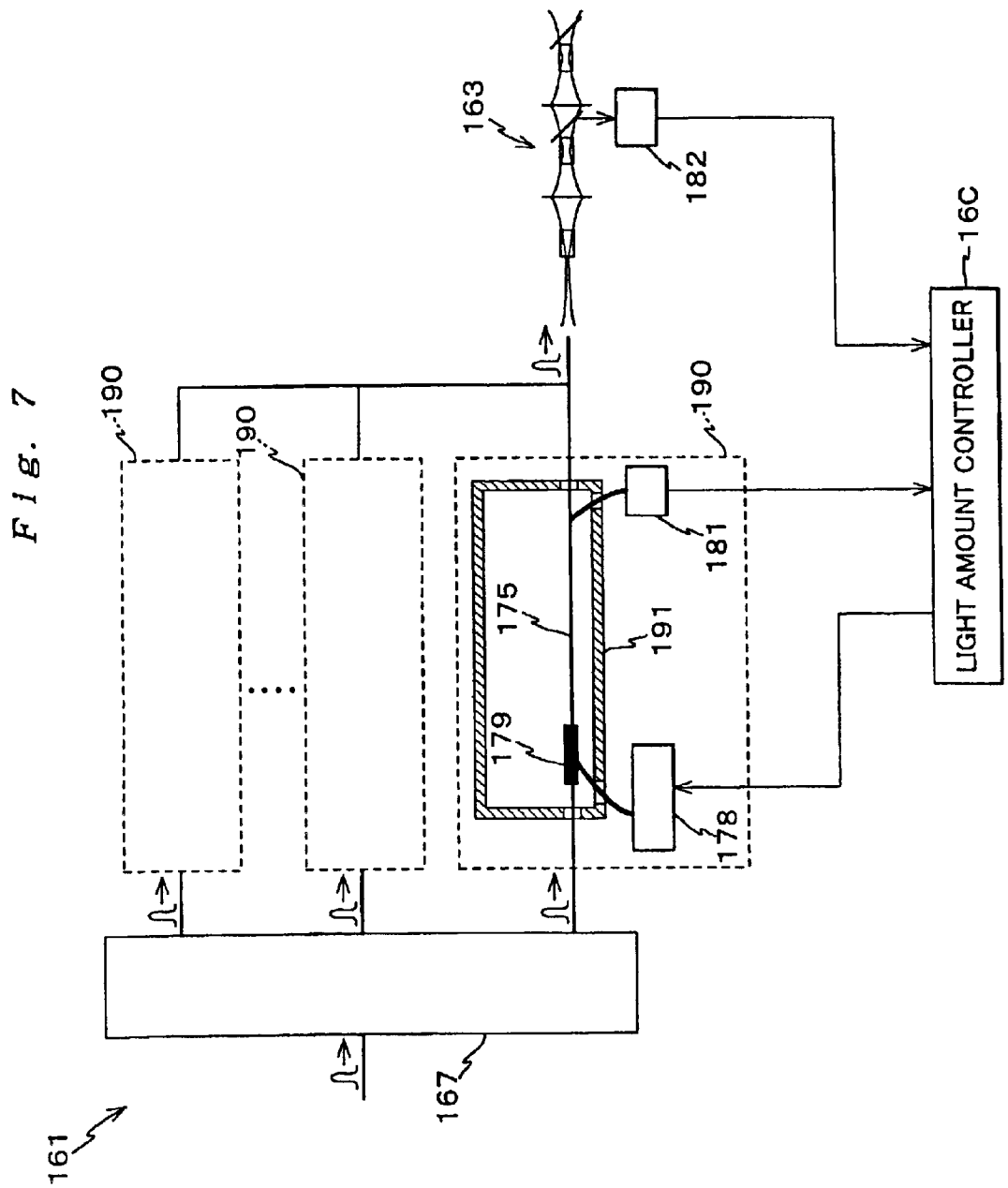

LIGHT SOURCE UNIT AND WAVELENGTH STABILIZING CONTROL METHOD, EXPOSURE APPARATUS AND EXPOSURE METHOD, METHOD OF MAKING EXPOSURE APPARATUS, AND DEVICE MANUFACTURING METHOD AND DEVICE

This application is a Continuation of application Ser. No. 09/831,345 Filed on Jun. 28, 2001 Now abandon, which is the National Stage of PCT/JP00/05875, filed Aug. 30, 2000.

TECHNICAL FIELD

The present invention relates to a light source unit and a wavelength stabilizing control method, an exposure apparatus and an exposure method, and a method of making the exposure apparatus, and device manufacturing method and a device. More particularly, the present invention relates to a suitable light source unit which serves as a light source for exposure in an exposure apparatus to manufacture a semiconductor device and a liquid crystal display device and the like in a lithographic process and a wavelength stabilizing control method that can be suitably applied to the light source unit, an exposure apparatus which comprises the light source unit as a light source for exposure and an exposure method using the exposure apparatus, a method of making the exposure apparatus, and a device manufacturing method using the exposure apparatus and the exposure method and a device manufactured by the device manufacturing method.

BACKGROUND ART

Conventionally, in the lithographic process to manufacture a semiconductor device (integrated circuit), a liquid crystal display device, and the like, various exposure apparatus were used. In recent years, as these types of exposure apparatus, the reduction projection exposure apparatus such as the so-called stepper or the so-called scanning stepper is mainstream, from the viewpoint of having high throughput. With the reduction projection exposure apparatus, a fine circuit pattern formed on a photomask or a reticle is reduced, projected, and transferred onto a substrate such as a wafer or a glass plate, which surface is coated with a photoresist via a projection optical system.

However, the exposure apparatus such as the projection exposure apparatus require high resolution, along with high throughput. The resolution R, and the depth of focus DOF of the projection exposure apparatus are respectively expressed in the following equation (1) and (2), using the wavelength of the illumination light for exposure λ and the numerical aperture of the projection optical system N.A.:

$$R = K \cdot \lambda / N.A. \quad (1)$$

$$DOF = \lambda / (N.A.)^2 / 2 \quad (2)$$

As is obvious from equation (1), three ways can be considered to obtain a smaller resolution R, that is, to decrease the minimum pattern line width that can be resolved; ① reduce the proportional constant K, ② increase the N.A., ③ reduce the wavelength of the illumination light for exposure λ. The proportional constant K, in this case, is a constant that is determined by the projection optical system or the process, and is normally a value around 0.5 to 0.8. The method of decreasing the constant K is called super-resolution in a broad sense. Up until now, issues such as improvement of the projection optical system, modified illumination, phase shift reticle have been studied and proposed, however, there were drawbacks such as the patterns suitable for application being restricted.

On the other hand, as can be seen from equation (1), the resolution R can be reduced by increasing the numerical aperture N.A., however, at the same time, this means that the depth of focus DOF is small, as is obvious from equation (2). Therefore, increasing the N.A. value has its limits, and normally, the appropriate value is around 0.5 to 0.6.

Accordingly, the most simple and effective way of reducing the resolution R is to reduce the wavelength of the illumination light for exposure λ.

For such reasons, conventionally, the g-line stepper and the i-line stepper that use an ultra-high pressure mercury lamp as the light source for exposure to emit the emission line (such as the g line or the i line) in the ultraviolet light region were mainly used. However, in recent years, the KrF excimer laser stepper that uses a KrF excimer laser as the light source to emit a KrF excimer laser beam having a shorter wavelength (wavelength: 248 nm) is becoming mainstream. And currently, the exposure apparatus that uses the ArF excimer laser (wavelength: 193 nm) as the light source having a shorter wavelength is under development.

The excimer laser, however, has disadvantages as the light source for the exposure apparatus, such as, the size being large, the energy per pulse being large causing the optical components to damage easily, and the maintenance of the laser being complicated and expensive because of using poisonous fluorine gas.

Therefore, the method of utilizing the nonlinear optics effect of the nonlinear optical crystal to convert light with a long wavelength (infrared light and visible light) to an ultraviolet light with a shorter wavelength and using the ultraviolet light as the exposure light, is gathering attention. As the light source employing this method, the array laser which details are disclosed in, for example, Japanese Patent Laid Open (Unexamined) No. 08-334803, is well known. With the array laser, the wavelength of light from the laser beam generating portion comprising a semiconductor laser is converted by the nonlinear optical crystal arranged at the wavelength conversion portion, and a laser element which generates ultraviolet light is bundled into an ultraviolet light source of a plurality of lines in a matrix shape (for example, 10×10).

With the array laser, by bundling a plurality of lines of laser elements that are individually independent, the light emission of the individual laser elements can be suppressed at a low level, while maintaining the light emission of the whole apparatus high. However, since the individual laser elements were independent, fine adjustment was required in addition to an extremely complicated structure in order to make the oscillation spectrum of each laser element coincide with one another.

And so, the method to convert the wavelength can be considered where the laser beam emitted from a single laser oscillation source is diverged, and the wavelength of each diverged beam is converted with a common nonlinear optical crystal after each diverged beam is amplified. In the case of employing this method, it is convenient to use optical fiber to guide the laser beam, and the arrangement of a plurality of bundled optical fibers emitting a plurality of beams incident on the nonlinear optical crystal is the most suitable from the viewpoint of simple arrangement, smaller diameter of the emitting beam, and maintenance operation.

In addition, to efficiently generate a second harmonic and the like by the nonlinear optics effect using the nonlinear optical crystal, a linearly polarized beam of a specific direction which corresponds to the crystal direction of the nonlinear optical crystal needs to be incident on the nonlinear optical crystal. However, it is generally difficult to arrange the direction of the linearly polarized beams emitted from a plurality of optical fibers in order. This is because even if the polarization maintaining fiber is used to guide the linearly polarization, since the sectional shape of the optical fiber is almost round, the direction of the linearly polarization cannot be specified from the outside shape of the optical fiber.

Also, as is well known, in the case of using an excimer laser beam in the short wavelength region, mainly due to the transmittance of the material, the material that can be used for the lens of the projection optical system at this stage is limited to materials such as synthetic quartz, fluorite, or fluoride crystal such as lithium fluoride.

In the case of using lenses made of materials such as quartz or fluorite in the projection optical system, however, correction of chromatic aberration is actually difficult. Therefore, in order to prevent the image forming performance from deteriorating, narrowing the oscillation spectral width of the excimer laser beam, in other words, to narrow-band the wavelength is required. To perform this narrow-banding, for example, a narrow-band module (optical elements such as a combination of a prism and a grating (diffraction grating) or an etalon) arranged in a laser resonator is used, and it becomes necessary to keep the spectrum width of the wavelength of the excimer laser beam supplied to the projection optical system during exposure within a predetermined wavelength width at all times, and at the same time, the so-called wavelength stabilizing control to maintain the center wavelength at a predetermined wavelength becomes required.

In order to achieve the wavelength stabilizing control referred to above, the optical properties of the excimer laser beam (such as the center wavelength and the spectral half-width) need to be monitored. The wavelength monitor portion of the excimer laser unit is made up of a Fabry-Perot etalon (hereinafter also referred to as an "etalon element") playing the main role, which is in general a Fabry-Perot spectroscope.

In addition, with higher integration of the semiconductor device, the pattern line width is becoming finer, and further improvement on exposure accuracy such as the overlay accuracy of the mask and the substrate in the exposure apparatus such as the stepper is being required. The overlay accuracy depends on how well the aberration of distortion components and the like in the projection optical system is suppressed. Therefore, the center wavelength stability of the illumination light for exposure and further narrow-banding is becoming required in the exposure apparatus. Of these requirements, as a method of coping with narrow-banding, employing a single-wavelength light source as the laser light source itself can be considered.

Meanwhile, since the projection optical system is adjusted only to a predetermined exposure wavelength, if the center wavelength cannot be stably maintained, as a consequence, chromatic aberration of the projection optical system may occur, or the magnification of the projection optical system or the image forming characteristics such as distortion and focus may vary. Therefore, it is a mandatory to maintain the stability of the center wavelength.

However, since the etalon element is affected by the temperature and pressure of the etalon atmosphere, the influence of the change in temperature and atmospheric pressure in the etalon atmosphere cannot be ignored.

In addition, it is certain that a finer device rule (the practical minimum line width) will be required in the future, and the exposure apparatus of the next generation will require higher overlay accuracy than before. The overly accuracy depends, for example, on how well the distortion component is suppressed. Also, in order to increase the depth of focus, increase in the UDOF (usable DOF) and stability in focus will be necessary. And in both cases, stability of the center wavelength and controllability of the spectral half-width are required at a high degree.

Also, the exposure apparatus will be expected to achieve exposure amount control performance in line with the difference of the resist sensibility in each wafer, and a wide dynamic range, typically around 1 to $\frac{1}{7}$, will be required. With the exposure apparatus using the conventional excimer laser as the light source, for example, the rough energy adjuster such as the ND filter is used for exposure amount control in accordance with the difference of the resist sensibility in each wafer.

In the case of such a method, however, an ND filter with a calibrated transmittance was required, and the durability of the ND filter and the change in transmittance with the elapse of time caused a problem. Furthermore, even in the case when only $\frac{1}{7}$ of the maximum exposure light amount was required, the excimer laser operated to emit the exposure light at the maximum intensity, therefore, $\frac{6}{7}$ of the emitted light was not used upon exposure, and was wasted. And, there were also difficulties on points such as the optical components wearing out and power consumption.

With the current exposure apparatus, other than the exposure amount control performance in accordance with the difference of the resist sensibility in each wafer (hereinafter referred to as the "first exposure amount control performance" as appropriate), the exposure amount control performance to correct the process variation of each shot area (chip) on the same wafer (hereinafter referred to as the "second exposure amount control performance" as appropriate) is required. Also, in the case of the scanning stepper, the exposure amount control performance to achieve line width uniformity within the shot area (hereinafter referred to as the "third exposure amount control performance" as appropriate) is further required.

With the current exposure apparatus, as the second exposure amount control performance referred to above, the dynamic range is required to be around ±10% of the exposure amount set, the exposure amount is required to be controlled within about 100 ms, which is the stepping time in between shots, to a value set, and the control accuracy is required to be around ±1% of the exposure amount set.

And, as the third exposure amount control performance referred to above, the control accuracy is required to be set at ±0.2% of the exposure amount set within 20 ms, which is the typical exposure time on one shot area, with the control velocity around 1 ms.

Accordingly, as the light source of the exposure apparatus, in order to achieve the first to third exposure amount control performance described above, the advent of a light source unit that can perform control corresponding to necessary requirements for control is highly expected. Control corresponding to necessary requirements for control, here, refers to functions such as (a) dynamic range of control, (b) control accuracy, (c) control velocity, (d) degree of linearity between the detected light intensity and the control amount, and (e) energy saving functions for the purpose of power-saving.

The present invention has been made in consideration of the situation described above, and has as its first object to provide a light source unit that can perform light amount control corresponding to necessary requirements for control described above.

It is the second object of the present invention to provide a light source unit that can maintain the center wavelength of the laser beam at a predetermined set wavelength without fail.

It is the third object of the present invention to provide a light source unit with a simple arrangement that can generate a predetermined light while controlling the polarized state.

It is the fourth object of the present invention to provide a wavelength stabilizing control method that can maintain the center wavelength of the laser beam at a predetermined set wavelength without fail.

It is the fifth object of the present invention to provide an exposure apparatus that can easily achieve the exposure amount control required.

It is the sixth object of the present invention to provide an exposure apparatus that can perform exposure with high precision without being affected by the temperature change and the like in the atmosphere.

It is the seventh object of the present invention to provide an exposure apparatus that can perform exposure with sufficient accuracy regardless of the change in sensitivity properties of the photosensitive agent.

It is the eighth object of the present invention to provide an exposure apparatus that can efficiently transfer a predetermined pattern onto a substrate.

It is the ninth object of the present invention to provide an exposure method that can easily achieve the exposure amount control required.

It is the tenth object of the present invention to provide an exposure method that can perform exposure with high precision without being affected by the temperature change and the like in the atmosphere.

And, it is the eleventh object of the present invention to provide a device manufacturing method that can improve the productivity of the micro device with high integration.

DISCLOSURE OF INVENTION

According to the first aspect of the present invention, there is provided a first light source unit that generates light with a single wavelength, the light source unit comprising: a light generating portion which generates light with a single wavelength; a fiber group made up of a plurality of optical fibers arranged in parallel on an output side of the light generating portion; and a light amount control unit which controls light amount emitted from the optical fiber group by individually turning on/off light output from each optical fiber of the optical fiber group.

With the light source, light with a single wavelength generated in the light generating portion proceeds toward the plurality of optical fibers that respectively structure the fiber group arranged in parallel on the output side of the light generating portion, while the light amount control unit controls the light amount emitted from the optical fiber group by individually turning on/off light output from each optical fiber of the optical fiber group. As is described, in the present invention, the amount of light emitted from the fiber group can be controlled by a simple method of individually turning on/off the light output from each optical fiber making up the optical fiber group, and also, light amount control in multiple stages, which is proportional to the number of optical fibers, becomes possible. Therefore, a wide dynamic range can be achieved. In this case, various performances (including the fiber diameter) of each optical fiber may differ, however, in the case the performance is almost the same in each optical fiber, since the same amount of light can be emitted from each optical fiber, an accurate and reliable light amount control in N stages in accordance with the number of optical fibers N can be performed. Accordingly, for example, if N>=100, then the light amount can be controlled with the precision of 1% and under. In this case, the degree of linearity between the controlled amount and the light amount is favorable. Of course, in this case, the rough energy adjuster such as the ND filter will not be necessary, therefore, problems such as deterioration in light amount control performance due to the durability of the filter or the temporal change in transmittance can be improved.

In this case, at least an output end of each of the plurality of optical fibers making up the fiber group may be bundled so as to structure a bundle-fiber. In general, since the diameter of the optical fiber is narrow, even when a hundred fibers and over are bundled, the diameter of the bundle is within a few mm, thus allowing a compact optical element to be arranged in the case when an optical element of some kind, such as the quarter-wave plate or the nonlinear optical crystal structuring the wavelength conversion unit, is arranged on the output side of the bundle fiber.

With the first light source according to the present invention, various methods can be considered of turning on/off the light output from each optical fiber, such as arranging a mechanical or an electrical shutter to cut off the light incident on each optical fiber, or arranging a mechanical or an electrical shutter so as to prevent the light from being emitted from each optical fiber. Or, for example, in the case at least one stage of a fiber amplifier that can perform optical amplification is arranged on a part of each optical path, which is structured including each optical fiber, then the light amount control unit may perform on/off operation of the light output from each optical fiber by switching the intensity of pumped light from a pumping light source of the fiber amplifier.

"At least one stage of a fiber amplifier that can perform optical amplification is arranged on a part of each optical path, which is structured including each optical fiber," here, includes both cases, when each optical path has an optical amplifying unit arranged separately on the input side of the optical fiber and when a part of the optical fiber structuring each optical path is a fiber amplifier.

In such cases, since the light incident on the optical path including each optical fiber can be amplified by the fiber amplifier, and the intensity level of the pumped light supplied to the optical amplifying unit arranged on the optical path including the optical fiber which output has been decided to be turned off is set at a low level (including zero), energy saving becomes possible. In addition, since the on/off operation of the light output is performed by switching the light intensity of the pumped light from the light source for the pumped light of the fiber amplifier, the on/off operation of the light output becomes possible within a shorter period of time, compared with the case of using shutters and the like.

With the first light source according to the present invention, in the case of turning on/off the light output from each optical fiber by switching the light intensity of the pumped light from the pumping light source of the fiber amplifier, the intensity level switching of the pumped light may be performed between two levels that are not fixed within a predetermined range. However, the light amount control unit may perform the switching of the pumped light intensity by selectively setting the intensity of pumped light from the pumping light source to one of a predetermined level and a zero level. In such a case, the light amount control unit may selectively set the intensity of pumped light from the pumping light source to one of a predetermined level and the zero level by performing on/off operation on the pumping light source.

With the first light source according to the present invention, in the case of turning on/off the light output from each optical fiber by switching the light intensity of the pumped light from the pumping light source of the fiber amplifier, the light amount control unit may perform the intensity switching of the pumped light by selectively setting the pumped light intensity from the pumping light source to one of a predetermined first level and a second level smaller than the first level. That is, with the fiber amplifier, even if the intensity of the pumped light is not zero, if it is under a predetermined amount, the light is absorbed so that the intensity of the emitted light from the fiber amplifier is almost zero. Therefore, by selectively setting the intensity of the pumped light from the pumping light source to either a predetermined first level or to a second level which is smaller than the first level, the light output from the optical fiber can be turned on/off. In this case, as well, the first level and the second level may be of two levels that are not fixed, within a predetermined range.

With the first light source unit according to the present invention, in the case each optical path has a plurality of the fiber amplifiers arranged, the light amount control unit may perform on/off operation of the light output from each optical fiber by switching the intensity of pumped light from a pumping light source of a fiber amplifier arranged at a final stage. In such a case, the adverse effect of the ASE (Amplified Spontaneous Emission), which is a problem when switching the intensity of the pumped light from the pumping light source of fiber amplifiers other than the fiber amplifier arranged most downstream directly before the light output, can be avoided, as well as have a larger effect on energy saving in the pumping light source when the light output from the optical fiber is turned off since the fibers arranged more downstream require a higher intensity of pumped light.

In this case, it is preferable for the mode field diameter of the fiber amplifier arranged most downstream directly before the light output to be large, when compared with other fiber amplifiers arranged before the fiber amplifier. In such a case, broadening of the spectral width of the amplified light can be avoided, due to the nonlinear effect in the optical fiber.

With the first light source unit according to the present invention, the light source may further comprise a memory unit which has an output intensity map corresponding to an on/off state of light output from each optical fiber stored in advance, and the light amount control unit may individually turn on/off light output from each optical fiber based on the output intensity map and a predetermined set light amount. In such a case, even if the output of each optical fiber is dispersed, the light output of the fiber group can be made to almost coincide with the set light amount, and it also becomes possible to use optical fibers which performance differ.

In this case, it is preferable for the output intensity map to be made based on dispersion of light output from each optical fiber measured in advance. In such a case, since the output intensity map is made from actual measurements on dispersion of light output from each optical fiber which are measured in advance, the light output of the fiber group can be made to coincide with the set light amount without fail.

With the first light source according to the present invention, in the case the light source further comprises a wavelength conversion portion which converts a wavelength of the light output from each optical fiber; the output intensity map is preferably made with further consideration on light output dispersion due to dispersion in wavelength conversion efficiency, which corresponds to light output from each optical fiber measured in advance. In such a case, even if there is dispersion in wavelength conversion efficiency corresponding to the light output from each optical fiber, the light amount of the light output can be controlled to the set light amount.

In this case, the light generating portion may generate a single wavelength laser beam within the range of infrared to visible region, and the wavelength conversion portion may emit ultraviolet light which is a harmonic wave of the single wavelength laser beam. For example, the light generating portion can generate a single wavelength laser beam that has a wavelength of around 1.5 µm, and the wavelength conversion portion can generate one of an eighth-harmonic wave and a tenth-harmonic wave of the single wavelength laser beam having the wavelength of around 1.5 µm.

With the first light source according to the present invention, the light source unit may further comprise a wavelength conversion portion, which converts the wavelength of the light output from each optical fiber. In such a case, the output of the wavelength conversion portion is proportional to the number of the fibers which output is turned on. Therefore, for example, in the case the performance of each fiber is almost the same, then the same light amount can be emitted from each optical fiber, thus the light amount can be controlled with favorable linearity.

In this case, the light generating portion may generate a single wavelength laser beam within the range of infrared to visible region, and the wavelength conversion portion may emit ultraviolet light which is a harmonic wave of the single wavelength laser beam. For example, the light generating portion can generate a single wavelength laser beam that has a wavelength of around 1.5 µm, and the wavelength conversion portion can generate one of an eighth-harmonic wave and a tenth-harmonic wave of the single wavelength laser beam having the wavelength of around 1.5 µm.

With the first light source according to the present invention, in the case the light generating portion includes a light source which generates light having a single wavelength and an optical modulator which converts and emits the light from the light source into a pulse light having a predetermined frequency, the light amount control unit may further control at least one of a frequency and a peak power of the pulse light emitted from the optical modulator. In such a case, in addition to the individual step-by-step on/off control of the output of each fiber making up the optical fiber group, a fine adjustment of the light amount in between the steps becomes possible by controlling at least either the frequency or the peak power of the pulse light emitted from the optical modulator. As a consequence, continuous control of the light amount becomes possible, and if the set light amount is within a predetermined range the light amount of the output light can be made to coincide with the set light amount, whatever value the set light amount may be.

With the first light source unit according to the present invention, the light source unit may further comprise a delay portion, which individually delays light output from the plurality of optical fibers respectively so as to stagger the light output temporally. In such a case, since the light is not emitted from each optical fiber at the same time, consequently, the spatial coherency can be reduced.

With the first light source unit according to the present invention, in the case the light generating portion has a laser light source to oscillate a laser beam, the light source unit can further comprise: a beam monitor mechanism which monitors the optical properties of the laser beam related to wavelength stabilizing to maintain a center wavelength of the laser beam to a predetermined set wavelength; and a wavelength calibration control unit which performs wavelength calibration based on the temperature dependence data of the detection reference wavelength of the beam monitor mechanism. In such a case, the wavelength calibration control unit performs wavelength calibration based on the temperature dependence data of the detection reference wavelength of the beam monitor mechanism. Therefore, the detection reference wavelength of the beam monitor mechanism can be accurately set at the set wavelength, and thus becomes possible to perform wavelength stabilizing control to maintain the center wavelength of the laser beam at a predetermined set wavelength without fail using the beam monitor mechanism, without being affected by changes in the atmosphere of the beam monitor mechanism, such as the temperature. Accordingly, a more precise light amount control becomes possible.

In this case, the light source can further comprise: a polarization adjustment unit which orderly arranges a polarized state of a plurality of light beams with the same wavelength having passed through the plurality of optical fibers; and a polarized direction conversion unit which converts all light beams having passed through the plurality of optical fibers into a plurality of linearly polarized light beams that have the same polarized direction.

In this case, in the case at least a fiber amplifier that can perform optical amplification is arranged on a part of each optical path, which is structured including the each optical fiber, the fiber amplifier can have an optical fiber, which main material is one of phosphate glass and bismuth oxide glass doped with a rare-earth element, serving as an optical waveguide member.

According to the second aspect of the present invention, there is provided a second light source unit that generates light with a single wavelength, the light source comprising: a light generating portion that has a light source which generates the light with a single wavelength and an optical modulator which converts light from the light source into a pulse light with a predetermined frequency and emits the pulse light; a light amplifying portion which includes at least one fiber amplifier to amplify the pulse light generated by the light generating portion; and a light amount control unit which controls light amount output from the fiber amplifier by controlling a frequency of the pulse light emitted from the optical modulator.

With the second light source unit, light with a single wavelength is generated from the light source in the light generating portion, and the light is converted and emitted as a pulse light with a predetermined frequency by the optical modulator. And this pulse light is amplified in the light amplifying portion, and is emitted as a pulse light having a greater peak power. On the other hand, if the peak power of the pulse light is almost fixed, then the light amount of the pulse light per unit time fluctuates depending on the frequency of the pulse light. So, by controlling the frequency of the pulse light emitted from the optical modulator with the light amount control unit, the light amount of the emitted light from the fiber amplifier can be made to coincide with the set light amount (target light amount). With the light amount adjustment by controlling the frequency of the pulse light (the number of pulse per unit time) according to the present invention, a faster and finer light amount adjustment becomes possible compared with the invention according to claim 1, and if the set light amount is within a predetermined range the light amount can be made to almost coincide with the set light amount, whatever value the set light amount may be. In addition, the linearity between the light output and the control amount is equal or better than the first light source unit.

In this case, when the light source unit further comprises: a memory unit which has an output intensity map corresponding to a frequency of the pulse light entering the light amplifying portion stored, the light amount control unit may control the frequency of the pulse light emitted from the optical modulator based on the output intensity map and a predetermined set light amount. The intensity of the light incident on the light amplifying unit changes according to the frequency of the pulse light from the optical modulator, and the fiber amplifier gain structuring the light amplifying portion has an incident light intensity dependence. However, according to the present invention, light amount control with high precision is possible, without being affected by the change in the peak power of the pulse output from the light amplifying portion due to the incident light intensity dependence.

With the second light source unit according to the present invention, the light amount control unit may further control the peak power of the pulse light emitted from the optical modulator. In such a case, light amount control with favorable precision is possible even in the case when there is a change in the peak power of the pulse light.

With the second light source unit according to the present invention, in the case the optical modulator is an electrooptical modulator, the light amount control unit may control the frequency of the pulse light by controlling a frequency of voltage pulse impressed on the optical modulator. The frequency of the pulse light emitted from the electrooptical modulator coincides with the frequency of the voltage pulse impressed on the optical modulator.

With the second light source unit according to the present invention, the light amplifying portion may be arranged in plural and in parallel, and the output end of each light amplifying portion may each be made up of an optical fiber.

In this case, a plurality of the optical fibers that respectively make up the light amplifying portion in plural may be bundled so as to structure a bundle-fiber. In general, since the diameter of the optical fiber is narrow, even when a hundred fibers and over are bundled, the diameter of the bundle is within a few mm, thus, a compact optical element can be arranged in the case when an optical element of some kind is arranged on the output side of the bundle fiber.

With the second light source unit according to the present invention, the light source unit may further comprise a wavelength conversion portion that converts a wavelength of light emitted from the light amplifying portion. In such a case, the light amount of the light emitted from the wavelength conversion portion is a value corresponding to the output of the light amplifying portion, in other words, the input intensity of the pulse light from the optical modulator. The value, however, is not always definitely proportional to the input intensity (light amount) of the pulse light, and shows a nonlinear dependence proportional to the power number of the harmonic order of the harmonic wave emitted from the wavelength conversion portion at a maximum, in respect to the peak intensity of the pulse light emitted from the light amplifying portion. Meanwhile, in the case when the optical modulator is an electrooptical modulator, the pulse peak intensity dependence of the pulse peak intensity of the light emitted from the electrooptical modulator to the voltage pulse impressed on the electrooptical modulator is expressed as cos (V), therefore, the nonlinear dependence of the wavelength conversion portion is eased. Accordingly, in the case the light source unit comprises a wavelength conversion portion, it is preferable for the optical modulator to be an electrooptical modulator.

In this case, the light generating portion may generate a single wavelength laser beam within a range of infrared to visible region, and the wavelength conversion portion may emit ultraviolet light which is a harmonic wave of the single wavelength laser beam. For example, the light generating portion can generate a single wavelength laser beam that has a wavelength of around 1.5 µm, and the wavelength conversion portion can generate one of an eighth-harmonic wave and a tenth-harmonic wave of the single wavelength laser beam having the wavelength of around 1.5 µm.

According to the third aspect of the present invention, there is provided a third light source unit that generates light with a single wavelength, the light source unit comprising: a light generating portion that has a light source which generates the light with a single wavelength and an optical modulator which converts light from the light source into a pulse light with a predetermined frequency and emits the pulse light; a light amplifying portion which includes at least one fiber amplifier to amplify the pulse light generated by the light generating portion; and a light amount control unit which controls light amount output from the light amplifying portion by controlling the peak power of the pulse light emitted from the optical modulator.

With the third light source unit, light with a single wavelength is generated from the light source in the light generating portion, and the light is converted and emitted as a pulse light with a predetermined frequency by the optical modulator. And this pulse light is amplified in the light amplifying portion, and is emitted as a pulse light having a greater peak power. The light amount of the pulse light emitted from the light amplifying portion per unit time, naturally fluctuates in accordance with the peak power of the pulse light emitted from the optical modulator. So, by controlling the peak power of the pulse light emitted from the optical modulator with the light amount control unit, the light amount of the emitted light from the fiber amplifier can be made to coincide with the set light amount (target light amount). With the light amount adjustment by controlling the peak power of the pulse light according to the present invention, a faster and finer light amount adjustment becomes possible compared with the invention according to claim 1, and if the set light amount is within a predetermined range the light amount can be made to almost coincide with the set light amount, whatever value the set light amount may be.

In this case, when the light source unit further comprises a memory unit which has an output intensity map corresponding to intensity of the pulse light entering the light amplifying portion stored, the light amount control unit may control the peak power of the pulse light emitted from the optical modulator based on the output intensity map and a predetermined set light amount. In such a case, light amount control with high precision becomes possible, without being affected by the change in peak power of the pulse light emitted from the light amplifying portion which is caused by the input light intensity dependence of the fiber amplifier gain of the fiber amplifier structuring the light amplifying portion.

With the third light source unit according to the present invention, the optical modulator may be an electrooptical modulator, and the light amount control unit may control the peak power of the pulse light by controlling a peak level of voltage pulse impressed on the optical modulator. The pulse peak intensity of the light emitted from the electrooptical modulator depends on the pulse peak intensity of the voltage pulse impressed on the electrooptical modulator.

With the third light source unit according to the present invention, the light amplifying portion may be arranged in plural and in parallel, and an output end of each light amplifying portion may each be made up of an optical fiber. In this case, a plurality of optical fibers that respectively make up the light amplifying portion in plural may be bundled so as to structure a bundle-fiber. In general, since the diameter of the optical fiber is narrow, even when a hundred fibers and over are bundled, the diameter of the bundle is within a few mm, thus, a compact optical element can be arranged in the case when an optical element of some kind is arranged on the output side of the bundle fiber.

With the third light source unit according to the present invention, in the case the light amplifying portion is arranged in plural and in parallel, and the output end of each light amplifying portion is each be made up of an optical fiber, the light source unit may further comprise a delay portion, which individually delays light output from the plurality of light amplifying portions respectively so as to stagger the light output temporally. In such a case, since the light is not emitted from each optical fiber at the same time, consequently, the spatial coherency can be reduced.

With the third light source unit according to the present invention, the light source unit may further comprise a wavelength conversion portion, which converts a wavelength of light emitted from the light amplifying portion. In such a case, the light amount of the light emitted from the wavelength conversion portion is a value corresponding to the output of the light amplifying portion, in other words, the input intensity of the pulse light from the optical modulator. The value, however, is not always definitely proportional to the input intensity (light amount) of the pulse light, and shows a nonlinear dependence proportional to the power number of the harmonic order of the harmonic wave emitted from the wavelength conversion portion at a maximum, in respect to the peak intensity of the pulse light emitted from the light amplifying portion. Meanwhile, in the case when the optical modulator is an electrooptical modulator, the pulse peak intensity dependence of the pulse peak intensity of the light emitted from the electrooptical modulator to the voltage pulse impressed on the electrooptical modulator is expressed as cos (V), therefore, the nonlinear dependence of the wavelength conversion portion is eased. Accordingly, in the case the light source unit comprises a wavelength conversion portion, it is preferable for the optical modulator to be an electrooptical modulator.

In this case, the light generating portion may generate a single wavelength laser beam within a range of infrared to visible region, and the wavelength conversion portion may emit ultraviolet light which is a harmonic wave of the single wavelength laser beam. For example, the light generating portion can generate a single wavelength laser beam that has a wavelength of around 1.5 µm, and the wavelength conversion portion can generate one of an eighth-harmonic wave and a tenth-harmonic wave of the single wavelength laser beam having the wavelength of around 1.5 µm.

With the second and third light source unit according to the present invention, in the case the light generating portion has a laser light source serving as the light source that oscillates a laser beam, the light source unit can further comprise: a beam monitor mechanism which monitors the optical properties of the laser beam related to wavelength stabilizing to maintain a center wavelength of the laser beam to a predetermined set wavelength; and a wavelength calibration control unit which performs wavelength calibration based on the temperature dependence data of the detection reference wavelength of the beam monitor mechanism. In such a case, the wavelength calibration control unit performs wavelength calibration based on the temperature dependence data of the detection reference wavelength of the beam monitor mechanism. Therefore, the detection reference wavelength of the beam monitor mechanism can be accurately set at the set wavelength, and thus becomes possible to perform wavelength stabilizing control to maintain the center wavelength of the laser beam at a predetermined set wavelength without fail using the beam monitor mechanism, without being affected by changes in the atmosphere of the beam monitor mechanism, such as the temperature.

In this case, when the light amplifying portion is arranged in plural and in parallel, the light source unit can further comprise: a polarization adjustment unit which orderly arranges a polarized state of a plurality of light beams with the same wavelength having passed through the plurality of optical fibers that respectively structure the plurality of light amplifying portions; and a polarized direction conversion unit which converts all light beams having passed through the plurality of optical fibers into a plurality of linearly polarized light beams that have the same polarized direction.

In this case, the fiber amplifier can have an optical fiber, which main material is one of phosphate glass and bismuth oxide glass doped with a rare-earth element, serving as an optical waveguide member.

According to the fourth aspect of the present invention, there is provided a fourth light source unit, the unit comprising: a laser light source which oscillates a laser beam; a beam monitor mechanism which monitors the optical properties of the laser beam related to wavelength stabilizing to maintain a center wavelength of the laser beam to a predetermined set wavelength; and a first control unit which performs wavelength calibration based on the temperature dependence data of the detection reference wavelength of the beam monitor mechanism.

With the fourth light source unit, wavelength calibration is performed by the first control unit based on the temperature dependence data of the detection reference wavelength of the beam monitor mechanism. Therefore, the detection reference wavelength of the beam monitor mechanism can be accurately set at the set wavelength, and thus becomes possible to perform wavelength stabilizing control to maintain the center wavelength of the laser beam at a predetermined set wavelength without fail using the beam monitor mechanism, without being affected by changes in the atmosphere of the beam monitor mechanism, such as the temperature.

In this case, when the light source unit further comprises an absolute wavelength provision source which provides an absolute wavelength close to the set wavelength, the first control unit can perform an absolute wavelength calibration to make the detection reference wavelength of the beam monitor mechanism almost coincide with the absolute wavelength provided by the absolute wavelength provision source, and also a set wavelength calibration to make the detection reference wavelength coincide with the set wavelength based on the temperature dependence data. In such a case, the first control unit performs an absolute wavelength calibration in order to make the detection reference wavelength of the beam monitor mechanism almost coincide with the absolute wavelength provided by the absolute wavelength provision source, as well as perform a set wavelength calibration to make the detection reference wavelength coincide with the set wavelength, based on the temperature dependence data. That is, the set wavelength calibration is performed to make the set wavelength coincide with the detection reference wavelength of the beam monitor mechanism on which the absolute wavelength calibration has been performed, using the temperature dependence data of the detection reference wavelength of the beam monitor mechanism already known. Therefore, the detection reference wavelength of the beam monitor mechanism can be accurately set to the set wavelength at all times without fail, and as a consequence, a wavelength stabilizing control which securely maintains the center wavelength of the laser beam at a predetermined wavelength using the beam monitor mechanism becomes possible, without being affected by changes in the atmosphere of the beam monitor mechanism, such as the temperature.

In this description, "an absolute wavelength close to the set wavelength," includes the concept of the absolute wavelength being the same wavelength as the set wavelength.

In this case, when the beam monitor mechanism includes a Fabry-Perot etalon, and the temperature dependence data includes data based on measurement results on temperature dependence of the resonance wavelength of the Fabry-Perot etalon, the first control unit may perform the absolute wavelength calibration and the set wavelength calibration on the detection reference wavelength by controlling the temperature of the Fabry-Perot etalon structuring the beam monitor unit. In such a case, it becomes possible to set the detection reference wavelength to the set wavelength utilizing the temperature dependence of the resonance wavelength, which is the base of the wavelength detection of the Fabry-Perot etalon.

With the fourth light source unit according to the present invention, the temperature dependence data may further include data on temperature dependence of the center wavelength of the laser beam oscillated from the laser light source, and the first control unit may perform wavelength control of the laser light source together, when performing the absolute wavelength calibration. In such a case, the absolute wavelength calibration can be completed within a shorter period of time compared with the case when wavelength control of the laser beam is not performed. However, the wavelength of the laser beam does not necessarily have to be controlled, when performing the absolute wavelength calibration.

With the fourth light source unit according to the present invention, the light source unit may further comprise a fiber amplifier, which amplifies the laser beam from the laser light source. In such a case, since the fiber amplifier can amplify the laser beam from the laser light source, even if the required light amount is large, it becomes possible to use a compact type laser light source, for example, a solid-state laser such as the DFB semiconductor laser or the fiber laser. Thus, the light source unit can be made compact and lightweight.

With the fourth light source unit according to the present invention, in the case the light source unit further comprises a fiber amplifier, the light source unit may further comprise a wavelength conversion unit, which includes a nonlinear optical crystal to convert a wavelength of the amplified laser beam. In such a case, it becomes possible to convert the wavelength of the amplified laser beam with the wavelength conversion unit. So, for example, by generating a harmonic wave by converting the wavelength of the laser beam with the wavelength conversion portion, a compact light source, which emits a high power energy beam having a short wavelength, can be realized.

With the fourth light source unit according to the present invention, the absolute wavelength provision source may be an absorption cell on which the laser beam is incident, and the first control unit may maximize absorption of an absorption line closest to the set wavelength of the absorption cell, as well as maximize transmittance of the Fabry-Perot etalon, when performing the absolute wavelength calibration.

"An absorption line closest to the set wavelength," here, includes "an absorption line that has the same wavelength as the set wavelength".

With the fourth light source unit according to the present invention, the light source unit can further comprise a second control unit which feedback controls a wavelength of the laser beam from the laser light source after the set wavelength calibration is completed, based on monitoring results of the beam monitor mechanism which has completed the set wavelength calibration. In such a case, the second control unit controls the wavelength of the laser beam emitted from the laser light source based on the monitoring results of the beam monitor mechanism which detection reference wavelength is accurately set to the set wavelength. Therefore, the wavelength of the laser beam can be stably maintained at the set wavelength.

With the fourth light source unit according to the present invention, the light source unit can further comprise: a plurality of light amplifying portions arranged in parallel that respectively include fiber amplifiers on the output side of the laser light source; a polarization adjustment unit which orderly arranges a polarized state of a plurality of light beams with the same wavelength having passed through the plurality of optical fibers that respectively structure the plurality of light amplifying portions; and a polarized direction conversion unit which converts all light beams having passed through the plurality of optical fibers into a plurality of linearly polarized light beams that have the same polarized direction.

In this case, the fiber amplifier can have an optical fiber, which main material is one of phosphate glass and bismuth oxide glass doped with a rare-earth element, serving as an optical waveguide member.

According to the fifth aspect of the present invention, there is provided a fifth light source unit, the unit comprising: a plurality of optical fibers; a polarization adjustment unit which orderly arranges a polarized state of a plurality of light beams with the same wavelength having passed through the plurality of optical fibers; and a polarized direction conversion unit which converts all light beams having passed through the plurality of optical fibers into a plurality of linearly polarized light beams that have the same polarized direction.

With the fifth light source unit, a plurality of linearly polarized light beams that have the same polarized direction can be obtained in a simple arrangement, since the polarized direction conversion unit converts all light beams that have passed through the plurality of optical fibers into a plurality of linearly polarized light beams that have the same polarized direction, after the polarization adjustment unit orderly arranges the polarized state of a plurality of light beams emitted from the plurality of optical fibers.

With the fifth light source unit according to the present invention, in the case the polarization adjustment unit polarizes respectively the plurality of light beams having passed through each of the optical fibers into a state nearly circular, the polarized direction conversion unit can be structured to have a quarter-wave plate. In such a case, the plurality of light beams having passed through each of the optical fibers are respectively circularly polarized, therefore, by making all the beams pass through the quarter-wave plate in the polarized direction conversion unit, the beams can be converted into linearly polarized light beams having the same polarized direction. Accordingly, a plurality of light beams can be converted into a plurality of linearly polarized light beams having the same polarized direction, while keeping the arrangement of the polarized direction conversion unit extremely simple, with one quarter-wave plate. The polarized direction of the linear polarization is determined by the direction of the optical axis of the crystal material and the like used to make the quarter-wave plate. Therefore, by adjusting the optical axis of the crystal material and the like used to make the quarter-wave plate, a plurality of light beams that have the same linearly polarized direction in an arbitrary direction can be obtained.

In the case the optical fibers have an almost cylindrical-symmetric structure; the polarization adjustment unit can have the arrangement of polarizing respectively the plurality of light beams incident on each of the optical fibers into a state nearly circular. This is because in the case a circular polarized light is incident on an optical fiber having a cylindrical-symmetric structure, then a circular polarized light is emitted from the optical fiber. Since it is not possible to structure the optical fiber in a complete cylindrical-symmetric structure, the length of the optical fiber is preferably shorter.

With the fifth light source unit according to the present invention, in the case the polarization adjustment unit polarizes respectively all the plurality of light beams having passed through each of the optical fibers into an arbitrary elliptic state almost identical, the polarized direction conversion unit can be structured to have a half-wave plate that rotates a plane of polarization and a quarter-wave plate which is optically connected in series to the half-wave plate. On optically connecting the half-wave plate and the quarter-wave plate in series, either of them may be arranged upstream of the optical path. For example, in the case the half-wave plate is arranged on the upper side of the optical path, the plurality of light beams having passed through each optical fiber pass through the common half-wave plate, and the planes of polarization of the plurality of light beams are identically rotated. And after the planes of polarization are identically rotated, the plurality of light beams proceed through the common quarter-wave plate, thus, the light beams are all linearly polarized to have the same polarized direction. Also, in the case the quarter-wave plate is arranged upstream of the optical path, the light beams can all be linearly polarized to have the same polarized direction, likewise with the case when the half-wave plate is arranged upstream. Accordingly, the polarized direction conversion unit can have a simple arrangement, of a half-wave plate and a quarter-wave plate. In this case, by adjusting the optical axis of the crystal material and the like used to make the half-wave plate and the quarter-wave plate, a plurality of light beams that have the same linearly polarized direction in an arbitrary direction can be obtained.

In addition, with the fifth light source unit according to the present invention, the light source unit can have the structure of the plurality of optical fibers respectively being optical fibers making up an optical fiber amplifier, which amplifies a plurality of light beams subject to amplifying incident on the plurality of optical fibers, and waveguide the beams subject to amplifying. In such a case, since light incident on each optical fiber is respectively amplified and emitted from each optical fiber, the emitted light each has high intensity and a plurality of linearly polarized light beams having the same polarized direction can be obtained as the emitted light from the polarized direction conversion unit. As a result, the light amount of the emitted light can be increased in the light source unit as a whole.

In this case, the optical fiber can be made mainly of one of phosphate glass and bismuth oxide glass doped with a rare-earth element.

With the fifth light source unit according to the present invention, the plurality of light beams incident on the plurality of optical fibers can respectively be a pulse train. In such a case, by adjusting the repetition frequency of the light pulse or the pulse height in each pulse train, the light amount of the emitted light can be controlled with high precision in the light source unit as a whole.

With the fifth light source unit according to the present invention, the plurality of light beams incident on the plurality of optical fibers can respectively be a light beam that has been amplified by at least one stage of an optical fiber amplifier before entering the plurality of optical fibers. In such a cases, by the light amplification of one or more stages of the optical fiber amplifiers, the light amount of the emitted light can be increased in the light source unit as a whole.

With the fifth light source unit according to the present invention, the polarization adjustment unit can adjust the polarized state of the plurality light beams incident on the polarized direction conversion unit by adjusting the mechanical stress and the like respectively impressed on the plurality of optical fibers arranged before the polarized direction conversion unit. The polarization adjustment unit can also have the arrangement of performing polarization adjustment by controlling optical properties of optical components arranged on the optical path further upstream of the plurality of optical fibers. In such a case, the plurality of optical fibers arranged immediately before the polarized direction conversion unit are optical fibers that have light amplifying portions and light subject to amplification are wave-guided to the optical fibers. And, even in the case the polarization adjustment of impressing stress and the like on the optical fibers is not adequate, by controlling the optical properties of the optical components arranged further upstream on the optical path which polarization adjustment can be made easier, the polarized state of the plurality of light beams incident on the polarized direction conversion unit can be arranged in an orderly manner.

With the fifth light source unit according to the present invention, the plurality of optical fibers may have the structure of being bundled almost in parallel to one another. In such a case, the section where the plurality of optical fibers occupy can be made small, as well as reduce the photo-detecting area of the polarized direction conversion unit. Therefore, the size of the light source can be reduced.

With the fifth light source unit according to the present invention, the light source unit can have the arrangement of further comprising a wavelength conversion unit which performs wavelength conversion on light beams emitted from the polarized direction conversion unit by the light beams passing through at least one nonlinear optical crystal. In such a case, by setting the polarized direction of the light beams emitted from the polarized direction conversion unit to the polarized direction on which the wavelength of the incident light is effectively converted (double harmonic generation, sum frequency generation) by the nonlinear optical crystal, light which wavelength has been effectively converted can be generated and emitted.

The light emitted from the plurality of optical fibers can have a wavelength, which is in one of an infrared and a visible region, and light emitted from the wavelength conversion unit can have a wavelength in the ultraviolet region. In such a case, an ultraviolet light suitable for transferring a finer pattern can be effectively generated.

In this case, the light emitted from the plurality of optical fibers can have a wavelength of around 1547 nm, and the light emitted from the wavelength conversion unit can have a wavelength of around 193.4 nm. In such a case, light having the wavelength when the ArF excimer laser light source is used can be effectively obtained.

According to the sixth aspect of the present invention, there is provided a sixth light source unit, the unit comprising: a light amplifying unit which includes an optical waveguiding member mainly made of any one of phosphate glass and bismuth oxide glass doped with a rare-earth element, and amplifies incident light; and a wavelength conversion unit which converts a wavelength of light emitted from the light amplifying unit.

With the sixth light source unit, instead of the optical waveguiding member such as the conventional amplifying fibers mainly made of silica glass and doped with a rare-earth element, the optical waveguiding member mainly made of either phosphate glass or bismuth oxide glass densely doped with a rare-earth element is used. So, the optical waveguiding member, being short in length, can amplify the incident light with high amplification. Therefore, light with high luminance can be supplied to the wavelength conversion unit, while reducing change in the polarized state that is generated when the light passes through the optical waveguiding member. In addition, upon amplification, the length of the path where the light passes through is shorter, therefore, broadening in spectral width due to guided Raman scattering or self-phase modulation can be suppressed. Accordingly, a narrowbanded wavelength converted light can be efficiently generated with a simple arrangement.

With the sixth light source unit according to the present invention, the optical waveguiding member can have the arrangement of an optical fiber which has a core to waveguide light, and a cladding arranged in the periphery of the core. This fiber may also be a dual cladding fiber that has a dual cladding structure. In such a case, connection and the like to the propagation fiber used for light guiding is simplified, thus, the light source unit can be realized more easily.

The optical fiber can be arranged linearly. In such a case, since the asymmetric stress generated in the diameter direction, which is the cause of change in the polarized state, can be prevented, it becomes possible to obtain output light that maintains the polarized state when the light is incident.

In addition, the light amplifying unit can have the structure of further including at least a container to house the optical fiber. In such a case, the change in the surrounding environment of the amplifying fibers that is the cause of change in the polarized state can be prevented; therefore, a stable wavelength conversion can be performed.

With the light source according to the present invention, the wavelength conversion unit may have the structure of including at least one nonlinear optical crystal to perform wavelength conversion. In such a case, by irradiating light with high luminance emitted from the light amplifier, a high-powered wavelength converted light can be obtained.

According to the seventh aspect of the present invention, there is provided a wavelength stabilizing control method to maintain a center wavelength of a laser beam oscillated from a laser light source to a predetermined set wavelength, the wavelength stabilizing control method including: a first step of measuring in advance temperature dependence of a detection reference wavelength of a wavelength detection unit used to detect a wavelength of the laser beam; a second step of performing an absolute wavelength calibration to make the detection reference wavelength of the wavelength detection unit almost coincide with an absolute wavelength provided from an absolute wavelength provision source, the absolute wavelength close to the set wavelength; and a third step of setting the detection reference wavelength of the wavelength detection unit to the set wavelength, based on the temperature dependence obtained in the first step.

The concept "the absolute wavelength close to the set wavelength," here, includes the wavelength of the absolute wavelength being the same as the set wavelength.

With this method, in the first step, the temperature dependence of the detection reference wavelength of the wavelength detection unit used to detect the wavelength of the laser beam is measured in advance. Then, in the second step, an absolute wavelength calibration is performed to make the detection reference wavelength of the wavelength detection unit almost coincide with the absolute wavelength close to the set wavelength, provided from an absolute wavelength provision source. And, in the third step, the detection reference wavelength of the wavelength detection unit is set to the set wavelength, based on the temperature dependence obtained in the first step. In this manner, according to the present invention, since the temperature dependence of the detection reference wavelength of the wavelength detection unit measured in advance is used to set the detection reference wavelength of the wavelength detection unit that has completed absolute calibration to the set wavelength, the detection reference wavelength of the wavelength detection unit can be accurately set to the set wavelength without fail at all times. So, even if the atmosphere of the wavelength detection unit such as the temperature changes, a wavelength stabilizing control which securely maintains the center wavelength of the laser beam at a predetermined set wavelength using the wavelength detection unit becomes possible, without being affected by the change.

In this case, when the wavelength detection unit is a Fabry-Perot etalon, in the first step, temperature dependence of a resonance wavelength of the wavelength detection unit may be measured; in the second step, the resonance wavelength may be made to almost coincide the absolute wavelength by controlling temperature of the wavelength detection unit; and in the third step, the resonance wavelength may be set as the set wavelength by controlling temperature of the wavelength detection unit. In such a case, by utilizing the temperature wavelength of the resonance wavelength, which is the reference for wavelength detection of the Fabry-Perot etalon, it becomes possible to set the resonance wavelength (detection reference wavelength) to the set wavelength.

In this case, when the absolute wavelength provision source is an absorption cell on which the laser beam is incident, in the second step, absorption of an absorption line closest to the set wavelength of the absorption cell and transmittance of the wavelength detection unit may be maximized.

In the "an absorption line closest to the set wavelength," the "absorption line that has the same wavelength as the set wavelength," is also included.

With the wavelength stabilizing control method according to the present invention, in the first step, temperature dependence of the center wavelength of the laser beam may be further measured in advance; and in the second step, a wavelength control of the laser beam may be performed together. In such a case, the absolute calibration referred to earlier can be completed within a shorter period of time compared with the case when the wavelength control of the laser beam is not performed.

With the wavelength stabilizing control method according to the present invention, the method may further include a fourth step of controlling a wavelength of the laser beam from the laser light source, based on detection results of the wavelength detection unit which detection reference wavelength is set to the set wavelength in the third step. In such a case, the wavelength of the laser beam from the laser light source is controlled based on the detection results of wavelength detection unit which detection reference wavelength is accurately set to the set wavelength. Thus, the wavelength of the laser beam can be stably maintained at the set wavelength.

With the wavelength stabilizing control method according to the present invention, the wavelength control may be performed, by controlling at least one of a temperature and a current supplied to the laser light source. For example, in the case of a single wavelength oscillation laser such as the DFB semiconductor laser or the fiber laser the oscillation wavelength of the laser can be controlled by temperature control, or in the case of the DFB semiconductor laser the oscillation wavelength of the laser can also be controlled by controlling the supply current (drive current).

According to the eighth aspect of the present invention, there is provided a first exposure apparatus which transfers a pattern formed on a mask onto a substrate, the exposure apparatus comprising: a light generating portion which generates a single wavelength laser beam within a range of infrared to visible region; a fiber group made up of a plurality of optical fibers arranged in parallel on an output side of the light generating portion; a light amount control unit which controls light amount emitted from the optical fiber group by individually turning on/off light output from each optical fiber of the optical fiber group; a wavelength conversion portion which converts a wavelength of the laser beam emitted from each optical fiber and emits ultraviolet light which is a harmonic wave of the laser beam; and an illumination optical system which illuminates the ultraviolet light emitted from the wavelength conversion portion onto the mask as an illumination light for exposure.

With the first exposure apparatus, the mask is illuminated by the illumination optical system with the ultraviolet light emitted from the wavelength conversion portion as the illumination light for exposure, and the pattern formed on the mask is transferred onto the substrate. In this case, the light amount control unit can control the light amount of the ultraviolet light irradiated on the mask depending on the requirements, therefore, as a consequence, the required exposure amount control can be achieved.

In this case, the exposure apparatus may further comprise: memory unit which has an output intensity map corresponding to an on/off state of light output from the each optical fiber stored in advance, and the light amount control unit may control the light amount of the laser beam emitted from the optical fiber group by individually turning on/off light output from the each optical fiber based on the output intensity map and a predetermined set light amount. In such a case, even if the output of each optical fiber is dispersed, the light output of the fiber group can be made to almost coincide with the set light amount, and also becomes possible to use optical fibers having different performances.

With the first exposure apparatus according to the present invention, in the case the light generating portion has a light source which generates a laser beam with a single wavelength and an optical modulator which converts light from the light source into a pulse light with a predetermined frequency, the light amount control unit can further control the light amount of the laser beam emitted from the optical fiber group by controlling a frequency of the pulse light emitted from the optical modulator. In such a case, in addition to the individual on/off operation of each optical fiber by the light amount control unit to control the light amount step-by-step, fine adjustment of the light amount in between the steps becomes possible by controlling the frequency of the pulse light emitted from the optical modulator. As a result, continuous control of the light amount becomes possible, and if the set light amount is within a predetermined range the light amount of the output light can be made to coincide with the set light amount, whatever value the set light amount may be. Accordingly, exposure amount control with a higher precision becomes possible.

With the first exposure apparatus according to the present invention, the light amount control unit may further control the light amount of the laser beam emitted from the optical fiber group by controlling a peak power of the pulse light emitted from the optical modulator. In such a case, in addition to the individual on/off operation of each optical fiber by the light amount control unit to control the light amount step-by-step, fine adjustment of the light amount in between the steps becomes possible by controlling the peak power of the pulse light emitted from the optical modulator. As a result, continuous control of the light amount becomes possible, and if the set light amount is within a predetermined range the light amount of the output light can be made to coincide with the set light amount, whatever value the set light amount may be. Accordingly, exposure amount control with a higher precision becomes possible.

According to the ninth aspect of the present invention, there is provided a second exposure apparatus which transfers a pattern formed on a mask onto a substrate, the exposure apparatus comprising: a light generating portion that has a light source which generates light with a single wavelength and an optical modulator which converts light from the light source into a pulse light with a predetermined frequency and emits the pulse light, and generates a laser beam having a single wavelength within a range of infrared to visible region; a light amplifying portion which includes at least one fiber amplifier to amplify a pulse light generated in the light generating portion; a light amount control unit which controls light amount output from the fiber amplifier by controlling a frequency of the pulse light emitted from the optical modulator; a wavelength conversion portion which converts wavelength of the laser beam emitted from the light amplifying portion and emits ultraviolet light which is a harmonic wave of the laser beam; and an illumination optical system which illuminates the ultraviolet light emitted from the wavelength conversion portion onto the mask as an illumination light for exposure.

With the second exposure apparatus, the mask is illuminated by the illumination optical system with the ultraviolet light emitted from the wavelength conversion portion as the illumination light for exposure, and the pattern formed on the mask is transferred onto the substrate. In this case, the light amount control unit can control the light amount of the ultraviolet light irradiated on the mask depending on the requirements, therefore, as a consequence, the required exposure amount control can be achieved.

With the second exposure apparatus according to the present invention, the light amount control unit may further control the light amount of the laser beam emitted from the light amplifying portion by controlling a peak power of the pulse light emitted from the optical modulator.

According to the tenth aspect of the present invention, there is provided a third exposure apparatus which transfers a pattern formed on a mask onto a substrate, the exposure apparatus comprising: a light generating portion that has a light source which generates light with a single wavelength and an optical modulator which converts light from the light source into a pulse light with a predetermined frequency and emits the pulse light, and generates a laser beam having a single wavelength within a range of infrared to visible region; a light amplifying portion which includes at least one fiber amplifier to amplify a pulse light generated in the light generating portion; a light amount control unit which controls light amount output from the light amplifying portion by controlling a peak power of the pulse light emitted from the optical modulator; a wavelength conversion portion which converts a wavelength of the laser beam emitted from the light amplifying portion and emits ultraviolet light which is a harmonic wave of the laser beam; and an illumination optical system which illuminates the ultraviolet light emitted from the wavelength conversion portion onto the mask as an illumination light for exposure.

With the third exposure apparatus, the mask is illuminated by the illumination optical system with the ultraviolet light emitted from the wavelength conversion portion as the illumination light for exposure, and the pattern formed on the mask is transferred onto the substrate. In this case, the light amount control unit can control the light amount of the ultraviolet light irradiated on the mask depending on the requirements, therefore, as a consequence, the required exposure amount control can be achieved.

According to the eleventh aspect of the present invention, there is provided a fourth exposure apparatus which repeatedly transfers a pattern formed on a mask onto a substrate, the exposure apparatus comprising: a light generating portion that has a light source which generates light with a single wavelength and an optical modulator which converts light from the light source into a pulse light; a light amplifying portion which includes at least one fiber amplifier to amplify a pulse light generated in the light generating portion; a control unit which controls at least one of a frequency and a peak power of the pulse light via the optical modulator in accordance with a position of an area subject to exposure on the substrate, when the substrate is exposed via the mask by irradiating the amplified pulse light on the mask.

With the fourth exposure apparatus, the light generating portion generates a pulse light with the optical modulator by converting light with a single wavelength generated by the light source, and the pulse light is amplified by the light amplifying portion including the fiber amplifier. And when the control unit irradiates the amplified pulse light on the mask and the substrate is exposed via the mask, either of the frequency or the peak power of the pulse light is controlled via the optical modulator according to the position of the area subject to exposure on the substrate. With this operation, the light amount irradiated on the mask, and furthermore, the exposure amount on the substrate is controlled with high precision. Accordingly, with the present invention, an appropriate exposure amount control becomes possible at all times regardless of the position of the area subject to exposure on the substrate, and it becomes possible to transfer the mask pattern onto the substrate with favorable accuracy.

The "area subject to exposure," here, is a concept that includes both the respective shot areas when there is a plurality of shot areas on the substrate to expose, and the different areas in each shot area. Accordingly, with the present invention, correction of process variation in each shot area on the substrate in the so-called stepper (including the scanning stepper) or improvement in line width uniformity within a shot area in the scanning exposure apparatus becomes possible.

According to the twelfth aspect of the present invention, there is provided a fifth exposure apparatus which transfers a pattern formed on a mask onto a substrate, the exposure apparatus comprising: a light generating portion that has a light source which generates light with a single wavelength and an optical modulator which converts light from the light source into a pulse light; a light amplifying portion made up of a plurality of optical paths arranged in parallel on an output side of the light generating portion, the optical paths including at least one fiber amplifier to amplify the pulse light; and a control unit which controls the light amount of the pulse light emitted from the light amplifying portion by individually turning on/off light output from the plurality of optical paths respectively, when the substrate is exposed via the mask by irradiating the pulse light emitted from the light amplifying portion on the mask.

With the fifth exposure apparatus, the light generating portion generates a pulse light with the optical modulator by converting light with a single wavelength generated by the light source, and the pulse light is amplified by the light amplifying portion including the fiber amplifier. And when the control unit irradiates the amplified pulse light on the mask and the substrate is exposed via the mask, the light amount of the pulse light emitted from the light amplifying portion by individually turning on/off the light output from each optical path. With this operation, the light amount irradiated on the mask, and furthermore, the exposure amount on the substrate is controlled step-by-step in a wide range. Accordingly, with the present invention, exposure amount control depending on the different resist sensitivity of each wafer in an exposure apparatus that repeatedly performs exposure on a plurality of substrates becomes possible. Thus, it becomes possible to transfer a mask pattern on the substrate with a required accuracy.

In this case, as well, the control unit may control at least either the frequency or the peak power of the pulse light via the optical modulator in correspondence with the position of the area subject to exposure on the substrate, as is described earlier.

With the fourth and fifth exposure apparatus according to the present invention, the light source may generate a laser beam in one of an infrared and a visible region, and the exposure apparatus may further comprise: a wavelength conversion portion which converts a wavelength of the pulse light amplified in the light amplifying portion into a wavelength of ultraviolet light.

According to the thirteenth aspect of the present invention, there is provided a sixth exposure apparatus which illuminates a mask with a laser beam and transfers a pattern of the mask on to a substrate, the exposure apparatus comprising: a light source unit that has a laser light source oscillating the laser beam, a beam monitor mechanism which monitors optical properties of the laser beam related to wavelength stabilizing in order to maintain the center wavelength of laser beam at a predetermined set wavelength, and an absolute wavelength provision source which provides an absolute wavelength close to the set wavelength; a memory unit where a temperature dependence map is stored, the temperature dependence map made up of measurement data on both a center wavelength of the laser beam oscillated from the laser light source and a temperature dependence of a detection reference wavelength of the beam monitor mechanism; a first control unit which performs an absolute wavelength calibration to make a detection reference wavelength of the beam monitor mechanism almost coincide with an absolute wavelength provided from the absolute wavelength provision source, and also performs a set wavelength calibration to make the detection reference wavelength coincide with the set wavelength based on the temperature dependence map; and a second control unit which exposes the substrate via the mask by irradiating the laser beam on the mask, while performing feedback control on a wavelength of a laser beam emitted from the light source unit based on monitoring results of the beam monitor mechanism which has completed the set wavelength calibration.

With the sixth exposure apparatus, the absolute wavelength calibration and the set wave calibration is performed by the first control unit, to make the detection wavelength of the beam monitor mechanism almost coincide with the absolute wavelength provided from the absolute wavelength provision source, and to make the detection reference wavelength coincide with the set wavelength based on the temperature dependence map (which is made up of measurement data on the center wavelength of the laser beam oscillated from the laser light source and the temperature dependence of the detection reference wavelength of the beam monitor mechanism) stored in the memory. In this manner, by utilizing the temperature dependence of the detection reference wavelength of the beam monitor mechanism already known, the detection reference wavelength of the beam monitor mechanism that has completed absolute calibration, can be made to coincide with the set wavelength. And, the second control unit feedback controls the wavelength of the laser beam emitted from the light source unit, based on the monitoring results of the beam monitor mechanism that has completed the set wavelength calibration, while performing exposure on the substrate via the mask by irradiating the laser beam on the mask. Accordingly, based on the monitoring results of the beam monitor mechanism, a wavelength stabilizing control, which securely maintains the center wavelength of the laser beam at a predetermined set wavelength, can be performed, while irradiating the laser beam on the mask to exposure the substrate via mask. Thus, exposure with high precision, which is hardly affected by the change in the atmosphere such as the temperature, can be achieved.

In this case, when the exposure apparatus further comprises: a projection optical system which projects the laser beam outgoing from the mask onto the substrate; and an environmental sensor which measures a physical quantity related to nearby surroundings of the projection optical system; the exposure apparatus may further comprise a third control unit which calculates a wavelength change amount to cancel out change in image forming characteristics of the projection optical system due to change in the physical quantity from a standard state based on measurement values of the environmental sensor and changes the set wavelength in accordance with the wavelength change amount, each at a predetermined timing after exposure on the substrate by the second control unit has started. When the physical quantity (such as the pressure, temperature, and humidity of the surrounding gas) related to the environment in which the projection optical system is arranged changes from the standard state, the refractive index of the atmosphere changes. And due to this change, the exposure wavelength of the projection optical system originally adjusted to the standard state changes, however, if the laser beam which wavelength is in the original state is irradiated on the projection optical system as the exposure light, various aberration (including chromatic aberration) occur due to the change in physical quantity of the image forming characteristics of the projection optical system. With the present invention, in such a case, the third control unit calculates the wavelength change amount to cancel out the change in the image forming characteristics of the projection optical system due to the change in the physical quantity from the standard state, based on measurement values of the environmental sensor. The third control unit also changes the set wavelength in accordance with the wavelength change amount; each at a predetermined timing, after exposure on the substrate has started. As a consequence, various aberrations of the projection optical system are corrected at the same time, and the second control unit irradiates the laser beam onto the mask, while using the changed set wavelength as a reference to perform wavelength stabilizing control with the beam monitor mechanism so as to maintain the center wavelength of the laser beam at a predetermined set wavelength without fail. Thus, the laser beam outgoing from the mask is projected onto the substrate by the projection optical system, and the substrate is exposed. In this case, exposure is performed with favorable accuracy, as if there were no change in the physical quantity related to the environment (that is, a state where the change amount in the image forming characteristics is cancelled out).

For example, if the physical quantity includes the atmosphere, the atmospheric pressure in the standard state (standard atmospheric pressure) may be arbitrary, however, it is preferable for the atmospheric pressure to be the reference when performing adjustment on the projection optical system and the like so as to maximize the optical performance. In this case, the change amount in the optical performance of the projection optical system and the like under the standard atmospheric pressure is zero. The standard atmosphere, normally, is often set at the average atmosphere of the delivery place (such as factories) where the exposure apparatus is arranged. Accordingly, when there is an altitude difference between the places where the exposure apparatus is built and where the exposure apparatus will be arranged (delivered), for example, adjustment of the projection optical system and the like are performed at the place where the exposure apparatus is built by shifting the exposure wavelength by only the amount corresponding to the altitude difference as if the projection optical system were arranged under the standard atmospheric pressure (average atmospheric pressure), and adjusting the wavelength back to the exposure wavelength at the place where the exposure apparatus will be arranged. Or the adjustment of the projection optical system is performed at the place where the exposure apparatus is built with the exposure wavelength, and the exposure wavelength is shifted at the place where the exposure apparatus will be arranged so as to cancel out the altitude difference.

In the case the projection optical system is arranged in a gaseous environment other than air, the "atmospheric pressure" referred to above is to be the pressure of the gas surrounding the projection optical system.

The present invention utilizes the fact that changing the wavelength of the illumination light with the projection optical system and changing the set environment (the pressure, temperature, humidity and the like of the surrounding gas) of the projection optical system is substantially equivalent. When the refraction element of the projection optical system is made of a single material, then the equivalence is complete, and in the case a plurality of materials are used, the equivalence is almost complete. Accordingly, by using the variation characteristics of the refractive index of the projection optical system (especially the refraction element) in respect to the set environment and changing only the wavelength of the illumination light, an equivalent state of when the set environment of the projection optical system has been changed can be substantially created.

The predetermined timing, here, may be each time when exposure on predetermined slices of substrates has been completed, or may be each time when exposure on each shot area on the substrate has been completed, or may be each time when the exposure conditions are changed. The predetermined slices may be one, or it may be the slices of wafers equivalent to one lot. In addition, changes in exposure conditions include all changes related to exposure in a broad sense, such as when the mask is exchanged, besides changes in illumination conditions.

Or, the predetermined timing may be the timing when the change in physical quantity (or the change amount) such as the atmospheric pressure obtained based on the measurement values of the environmental sensor exceeds a predetermined amount, or the predetermined timing may be almost realtime, corresponding to the interval calculating the optical performance (or the fluctuation amount) of the projection optical system (for example, several µs). Or, the predetermined timing may be every predetermined timing set in advance.

In this case, the exposure apparatus may further comprise: an image forming characteristics correction unit which corrects image forming characteristics of the projection optical system, and the image forming characteristics correction unit may correct change in image forming characteristics excluding change in image forming characteristics of the projection optical system corrected by changing the set wavelength, each time when the set wavelength is changed by the third control unit.

The "change in image forming characteristics excluding change in image forming characteristics of the projection optical system corrected by changing the set wavelength," includes the change in the image forming characteristics due to the fluctuation in physical quantity which was not corrected by the change of the set wavelength, when the change in image forming characteristics of the projection optical system due to the fluctuation in physical quantity could not be corrected completely by the change of set wavelength.

In such a case, most of the change in the image forming characteristics of the projection optical system due to the fluctuation in physical quantity (hereinafter referred to as the "environmental change" as appropriate) is corrected by the change in set wavelength mentioned above, and the remaining environmental change is corrected by the image forming characteristics correction unit along with other changes such as the irradiation change. As a result, exposure with high precision is performed in a state where the image forming characteristics of the projection optical system is almost completely corrected.

In this case, in between the set wavelength changing operation by the third control unit, the image forming characteristics correction unit may correct the change in image forming characteristics in consideration of the change in wavelength of the laser beam. The change in set wavelength is performed in the predetermined timing stated above. When the interval between the changes is long, however, the physical quantity is likely to change, therefore, the image forming characteristics correction unit corrects the environmental change occurring due to this change.

With the sixth exposure apparatus according to the present invention, in the case the exposure apparatus further comprises an environmental sensor which measures the physical quantity related to nearby surroundings of the projection optical system, the environmental sensor may at least detect the atmospheric pressure.

With the sixth exposure apparatus according to the present invention, the light source unit may further comprise: a fiber amplifier which amplifies the laser beam from the laser light source; and a wavelength conversion unit which includes a nonlinear optical crystal to convert a wavelength of the amplified laser beam into a wavelength in an ultraviolet region. In such a case, the fiber amplifier amplifies the laser beam emitted from the laser light source, and the wavelength conversion unit can convert the amplified laser beam into a light having a wavelength in the ultraviolet region. Accordingly, for example, even if the required light amount is large, a compact laser light source, for example a solid-state laser such as the DFB semiconductor laser or the fiber laser, can be used to obtain a high-powered energy beam that has a short wavelength. Thus, a light source unit of a smaller and lighter size can be realized, which leads to a smaller footprint of the exposure apparatus, and transferring of a fine pattern with high precision onto the substrate becomes possible due to the improvement in resolution on exposure.

According to the fourteenth aspect of the present invention, there is provided a seventh exposure apparatus that exposes a substrate coated with a photosensitive agent with an energy beam, the exposure apparatus comprising: a beam source which generates the energy beam; a wavelength changing unit which changes a wavelength of the energy beam emitted from the beam source; and an exposure amount control unit which controls an exposure amount provided to the substrate in accordance with an amount of change in sensitivity properties of the photosensitive agent due to a change in wavelength, when the wavelength is changed by the wavelength changing unit.

With the seventh exposure apparatus, when the wavelength of the energy beam emitted from the beam source is changed by the wavelength changing unit, the exposure amount provided to the substrate is controlled by the exposure amount control unit in accordance with the amount of change in sensitivity properties of the photosensitive agent due to the wavelength change.

That is, when the wavelength of the energy beam is changed, the sensitivity properties of the photosensitive agent (resist) coated on the substrate may change due to the wavelength change. In such a case, with the present invention, the exposure amount provided to the substrate can be controlled in accordance with the amount of change in sensitivity properties of the photosensitive agent due to the wavelength change. Accordingly, exposure with good accuracy becomes possible without being affected by the change in sensitivity properties of the photosensitive agent.

According to the fifteenth aspect of the present invention, there is provided an eighth exposure apparatus which transfers a predetermined pattern onto a substrate by irradiating an exposure beam onto the substrate, the exposure apparatus comprising: a plurality of optical fibers that emit light which wavelength is in one of an infrared and a visible region; a polarization adjustment unit which orderly arranges a polarized state of a plurality of light beams with the same wavelength having passed through the plurality of optical fibers; a polarized direction conversion unit which converts all light beams having passed through the plurality of optical fibers into a plurality of linearly polarized light beams that have the same polarized direction; a wavelength conversion unit which performs wavelength conversion on light beams emitted from the polarized direction conversion unit by the light beams passing through at least one nonlinear optical crystal to emit light having a wavelength in an ultraviolet region; and an optical system which irradiates light emitted from the wavelength conversion unit onto the substrate as the exposure beam.

With the eighth exposure apparatus, ultraviolet light suitable to transfer fine patterns can be efficiently generated by the plurality of optical fibers, the polarization adjustment unit and the wavelength conversion unit. The ultraviolet light is irradiated on the substrate by the optical system as the exposure beam; therefore, the predetermined pattern can be efficiently transferred onto the substrate.

According to the sixteenth aspect of the present invention, there is provided a ninth exposure apparatus that forms a predetermined pattern by irradiating an exposure light on a substrate, the exposure apparatus comprising: a light amplifying unit which includes an optical waveguiding member mainly made of one of phosphate glass and bismuth oxide glass doped with a rare-earth element, and amplifies incident light; a wavelength conversion unit which converts a wavelength of light emitted from the light amplifying unit; and an optical system which irradiates light emitted from the wavelength conversion unit onto the substrate as the exposure light.

In this case, the optical waveguiding member can be an optical fiber, which has a core to waveguide light and a cladding arranged in the periphery of the core.

With the ninth exposure apparatus according to the present invention, the wavelength conversion unit can generate the exposure light, which has a wavelength of 200 nm and under. In such a case, by generating an exposure light having a wavelength of 200 nm and under which wavelength spectral is narrow from the wavelength conversion unit, exposure with favorable precision can be efficiently performed on the substrate, and a fine pattern corresponding to the short wavelength of 200 nm and under can be precisely formed on the substrate.

When the ninth exposure apparatus according to the present invention has a mask on which a predetermined pattern is formed and exposes the substrate via the optical system, on detecting the position of the mask using the light having the wavelength almost the same as the exposure light, by using the light generated in the wavelength conversion unit described above, it becomes possible to efficiently supply the light for positional detection.

According to the seventeenth aspect of the present invention, there is provided a first exposure method which repeatedly transfers a pattern formed on a mask on to a substrate, the exposure method including: a first step of amplifying a pulse light using a fiber amplifier at least once; a second step of exposing an area subject to exposure on the substrate via the mask by irradiating the amplified pulse light onto the mask; and a third step of converting a laser beam emitted from a light source to the pulse light and controlling at least one of a frequency and a peak power of the pulse light in accordance with a position of the area subject to exposure on the substrate, prior to the first step.

With the first exposure method, the pulse light is amplified at least once using the fiber amplifier, the amplified pulse light is irradiated on the mask, and the area subject to exposure on the substrate is exposed via the mask. In this case, prior to amplifying the pulse light with the fiber amplifier, the laser beam from the light source is converted into the pulse light, and in addition, at least either of the frequency and the peak power of the pulse light is controlled in correspondence with the position of the area subject to exposure on the substrate. Accordingly, when the area subject to exposure on the substrate is exposed via the mask by irradiating the pulse light on the mask, exposure is performed in a state in which the exposure amount is adjusted according to the position of the area subject to exposure on the substrate. Accordingly, with the present invention, an appropriate exposure amount control is possible at all times regardless of the position of the area subject to exposure on the substrate, and it becomes possible to transfer the pattern of the mask onto the substrate with high accuracy.

The "area subject to exposure," here, is a concept that includes both the respective shot areas when there is a plurality of shot areas on the substrate to expose, and the different areas in each shot area. Accordingly, with the present invention, correction of process variation in each shot area on the substrate in the so-called stepper (including the scanning stepper) or improvement in line width uniformity within a shot area in the scanning exposure apparatus becomes possible.

In this case, when the fiber amplifier is arranged in plural and in parallel, in the first step, the pulse light may be amplified by using only the selected fiber amplifiers. In such a case, the exposure amount control can be performed step-by-step in a wide dynamic range. Therefore, by employing this control together with the exposure amount control referred to earlier of controlling at least either of the frequency and the peak power of the pulse light in correspondence with the position of the area subject to exposure on the substrate, an exposure amount control of a wider range can be performed with high precision. And by selecting the fiber amplifiers depending on the resist sensitivity of the substrate and the like, exposure amount control is possible in accordance with the difference of the resist sensitivity of each wafer.

With the first exposure method according to the present invention, the light source may generate a laser beam in one of an infrared and a visible region, and the exposure method may further include: a fourth step of performing wavelength conversion on the amplified pulse light for conversion into an ultraviolet light before the pulse light is irradiated on the mask.

According to the eighteenth aspect of the present invention, there is provided a second exposure method which forms a predetermined pattern on a substrate by exposing the substrate with a laser beam, the exposure method including: a first step which sequentially performs sub-steps of; a first sub-step of measuring a temperature dependence of a detection reference wavelength in a wavelength detection unit used to detect a wavelength of the laser beam, a second sub-step of performing absolute wavelength calibration to make the detection reference wavelength of the wavelength detection unit almost coincide with an absolute wavelength provided from an absolute wavelength provision source, the absolute wavelength close to a set wavelength, and a third sub-step of setting the detection reference wavelength of the wavelength detection unit to the set wavelength, based on the temperature dependence obtained in the first sub-step, and after these sub-steps are completed, a second step of repeatedly performing exposure on the substrate with the laser beam, while controlling a wavelength of the laser beam from the laser light source based on detection results of the wavelength detection unit which the detection reference wavelength is set at the set wavelength in the third sub-step.

With the second exposure method, by the process in the first step, the detection reference wavelength of the wavelength detection unit that has completed absolute wavelength calibration is set to the set wavelength using the temperature dependence data of the detection reference wavelength of the wavelength detection unit, which is measured in advance. Therefore, the detection reference wavelength of the wavelength detection unit is accurately set to the set wavelength without fail at all times. And, in the second step, the substrate is repeatedly exposed with the laser beam, while the wavelength of the laser beam emitted from the laser light source is controlled based on the detection results of the wavelength detection unit which detection reference wavelength is set to the set wavelength. Accordingly, with the present invention, even if the atmosphere of the wavelength detection unit such as the temperature changes, the detection reference wavelength of the wavelength detection unit can be accurately set to the set wavelength without being affected by the change, and the substrate is repeatedly exposed with the laser beam while the wavelength stabilizing control is preformed to securely maintain the center wavelength of the laser beam at a predetermined set wavelength using the wavelength detection unit. Thus, exposure with high precision that is hardly affected by temperature changes and the like in the atmosphere becomes possible.

In this case, when an optical system is further arranged on a path of the laser beam, the exposure method may further include: a third step of changing the set wavelength in order to cancel a change in optical performance of the optical system. For example, when there is change in the atmospheric pressure, the optical performance of the optical system (such as various aberrations) may change. In such a case, in the third step, since the set wavelength is changed in order to cancel the change in the optical performance of the optical system, the substrate can be repeatedly exposed with the laser beam while performing the wavelength stabilizing control to securely maintain the center wavelength of the laser beam at a predetermined set wavelength using the wavelength detection unit. Therefore, as a consequence, exposure with favorable accuracy is performed in a state as if there were no atmospheric pressure change (that is, a state where the amount of change in the optical performance is cancelled out).

According to the nineteenth aspect of the present invention, there is provided a making method of an exposure apparatus that forms a predetermined pattern on a substrate by irradiating an exposure light on the substrate via an optical system, wherein adjustment of properties in the optical system is performed by using light which wavelength belongs to a predetermined bandwidth including a wavelength of the exposure light, the light generated by a light source unit according to the sixth light source unit in the present invention. With this making method, the adjustment of the optical properties related to the exposure light upon exposure can be performed easily, with high precision.

In addition, in the lithographic process, by performing exposure using the exposure method in the present invention, a plurality of layer of patterns can be formed with high overlay accuracy, and in this manner, a microdevice with a higher integration can be manufactured with high yield, thus improving the productivity. Likewise, in the lithographic process, by performing exposure using the exposure apparatus in the present invention, the line width control accuracy is improved owing to the improvement in the exposure amount control accuracy, and this allows a plurality of layer of patterns to be formed with high overlay accuracy. Consequently, a microdevice with a higher integration can be manufactured with high yield, and the productivity can be improved. Accordingly, from another aspect of the present invention, there is provided a device manufacturing method that uses the exposure method or the exposure apparatus of the present invention, and furthermore a device manufactured by the device manufacturing method.

BRIEF DESCRIPTION OF THE DRAWINGS

FIG. 6A is a view showing an arrangement example of a wavelength conversion portion which generates an ultraviolet light having a wavelength of 193 nm by converting the wavelength of a reference wave emitted from the output end of the bundle-fiber 173 that has the wavelength of 1.544 μm to an eighth-harmonic wave using the nonlinear optical crystal, and FIG. 6B is a view showing an arrangement example of a wavelength conversion portion which generates an ultraviolet light having a wavelength of 157 nm by converting the wavelength of a reference wave emitted from the output end of the bundle-fiber 173 that has the wavelength of 1.57 μm to a tenth-harmonic wave using the nonlinear optical crystal;

FIG. 7 is a view for explaining a modified example, and shows another arrangement of the light amplifying portion;

BEST MODE FOR CARRYING OUT THE INVENTION

An embodiment of the present invention will be described below with reference to FIGS. 1 to 6.

Figure 1:
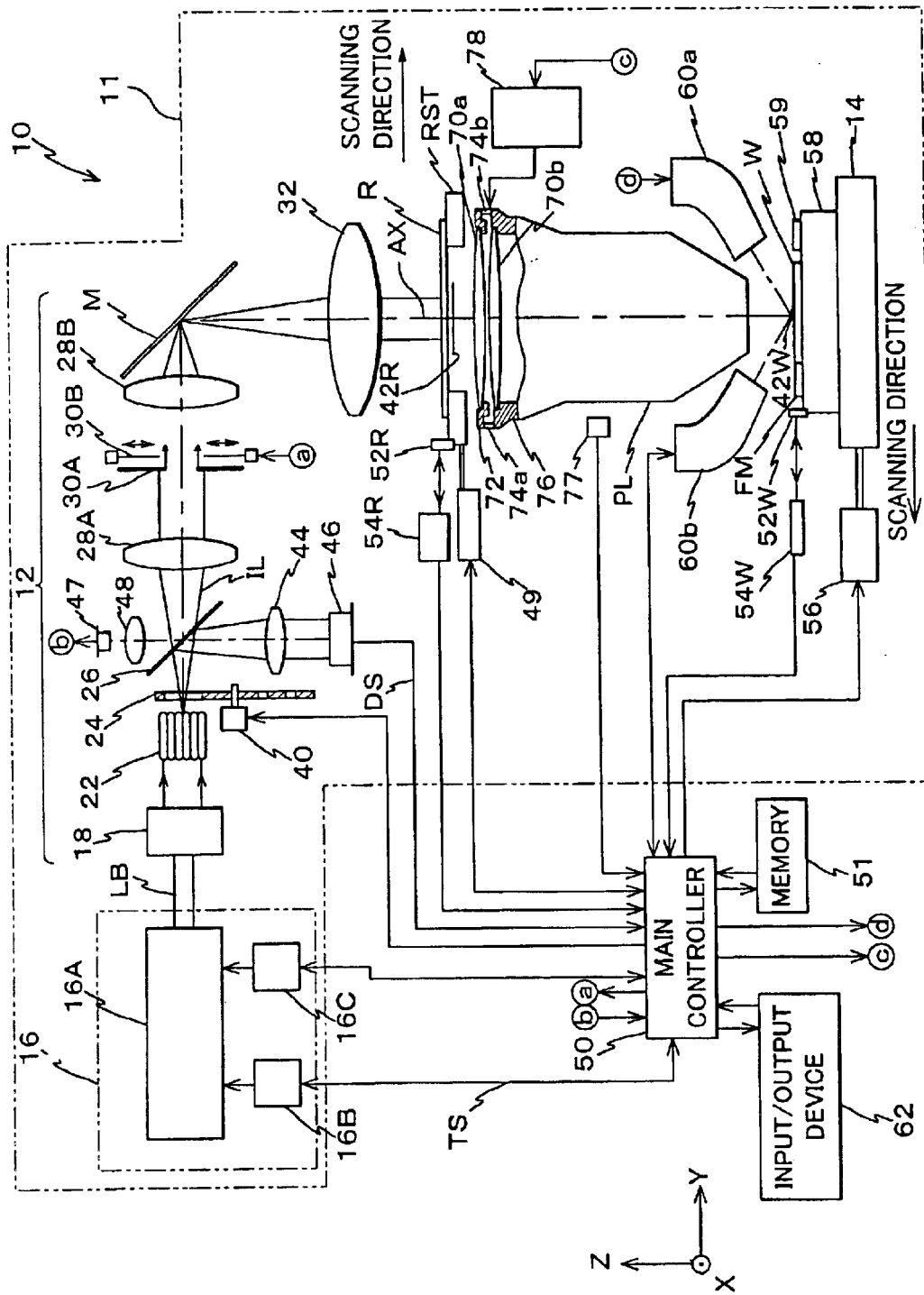
FIG. 1 is a schematic view showing the configuration of the exposure apparatus of the embodiment in the present invention.

FIG. 1 shows the schematic view of the exposure apparatus 10 related to the embodiment, which structure includes the light source unit related to the present invention. The exposure apparatus 10 is a scanning type exposure apparatus based on the step-and-scan method.

The exposure apparatus 10 comprises: an illumination system consisting of a light source unit 16 and an illumination optical system 12; a reticle stage RST that holds a reticle R serving as a mask which is illuminated by the illumination light for exposure (hereinafter referred to as "exposure light") IL from the illumination system; a projection optical system PL which projects the exposure light IL outgoing from the reticle R onto a wafer W serving as a substrate; an XY stage 14 on which a Z tilt stage 58 serving as a substrate stage holding the wafer W is mounted; control systems for these parts; and the like.

The light source unit 16 is, for example, a harmonic generation unit that emits an ultraviolet pulse light having a wavelength of 193 nm (almost the same wavelength as of the ArF excimer laser beam) or an ultraviolet pulse light having a wavelength of 15 nm (almost the same wavelength as of the $F_2$ laser beam). The light source unit 16, or at least a part of the light source unit 16 (for example, the wavelength conversion portion, which will be described later) is housed within an environmental chamber (hereinafter referred to as "chamber") 11 where the temperature, pressure, humidity, and the like are adjusted with high precision. In the environmental chamber 11, the illumination optical system 12, the reticle stage RST, the projection optical system PL, the Z tilt stage 58, the XY stage 14, and a main body of the exposure apparatus consisting of a main column (not shown in Figs.) on which these parts are arranged, are also housed.

Figure 2:
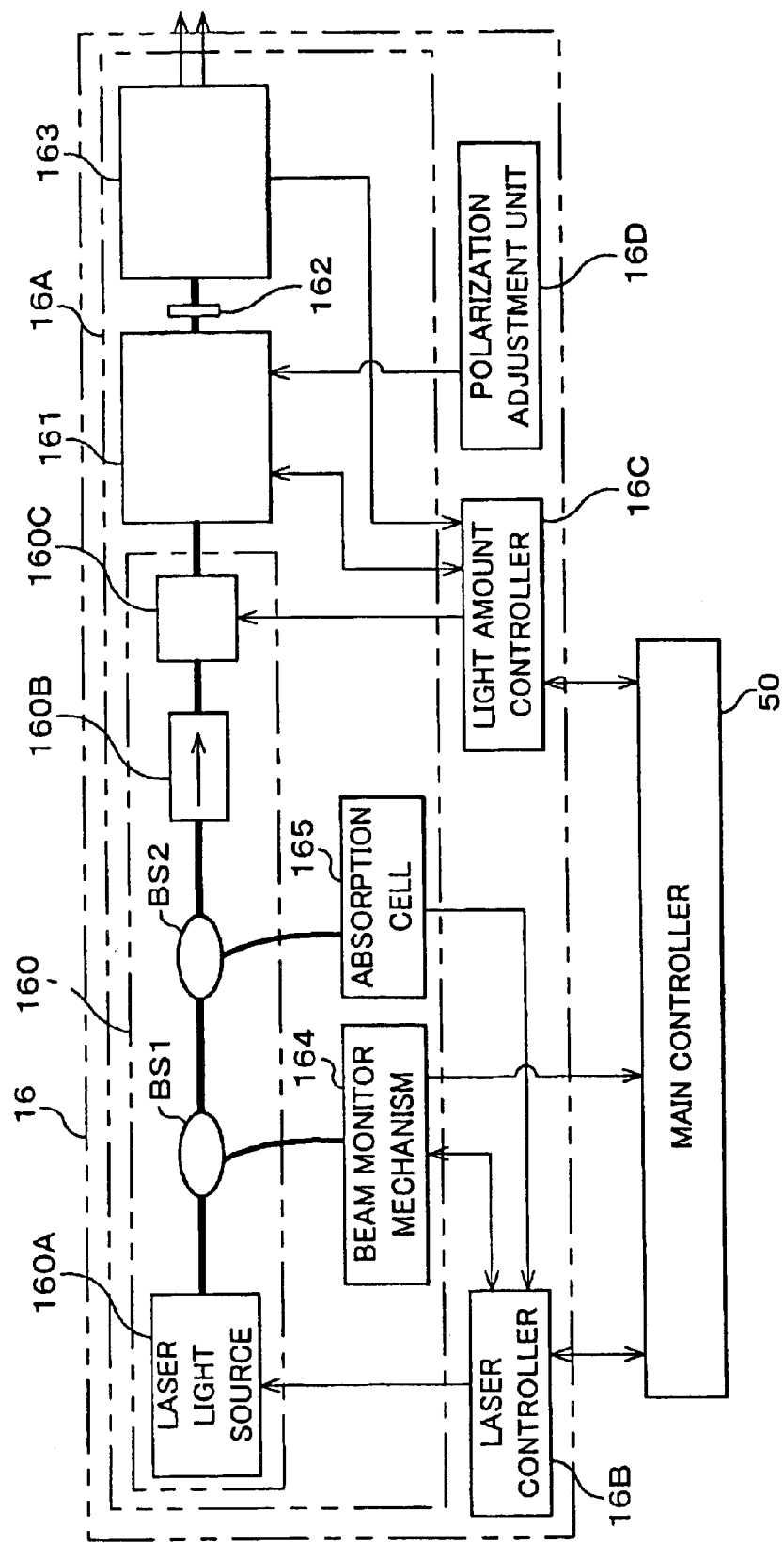
FIG. 2 is a block diagram showing the internal structure of the light source unit in FIG. 1 with the main control unit.

FIG. 2 is a block diagram showing the internal structure of the light source unit 16 along with the main controller 50, which performs overall control over the entire exposure apparatus. As is shown in FIG. 2, the light source unit 16 comprises: a light source portion 16A which includes the laser light source serving as a light source; a laser controller 16B; a light amount controller 16C; a polarization adjustment unit 16D; and the like.

The light source portion 16A has a structure including a pulse light generation portion 160 serving as a light generation portion, a light amplifying portion 161, a quarter-wave plate 162 serving as a polarized direction conversion unit, a wavelength conversion portion 163 serving as a wavelength converter, a beam monitor mechanism 164, an absorption cell 165, and the like.

The pulse light generation portion 160 has a laser light source 160A, photocoupler BS1 and BS2, optical isolator 160B, an electro-optic modulator (hereinafter referred to as "EOM") 160C serving as an optical modulator, and the like. And, each element arranged in between the laser light source 160A and the wavelength conversion portion 163 is optically connected to one another by optical fiber.

As the laser light source 160A, in this case, a single wavelength oscillation laser is used, for example, an InGaAsP DFB semiconductor laser, which has an oscillation wavelength of 1.544 μm, continuous-wave output (hereinafter referred to as "CW output") of 20 mW, is used. Hereinafter in this description, the laser light source 160A will be referred to as "DFB semiconductor laser 160A", as appropriate.

DFB semiconductor laser, in this description, is a diffraction grating made within the semiconductor laser, instead of the Fabry-Perot resonator having low longitudinal mode selectivity, and is structured to oscillate a single longitudinal mode in any circumstances. It is called the distributed feedback (DFB) laser, and since this type of laser basically performs a single longitudinal mode oscillation, the oscillation spectral line width can be suppressed so that it does not exceed 0.01 pm.

In addition, the DFB semiconductor laser is usually arranged on a heatsink, and these are housed in a casing. With the embodiment, a temperature adjustment unit (for example, a Peltier element) is arranged on the heatsink of the DFB semiconductor laser 160A, and as will be described later on, the embodiment has a structure so that the laser controller 16B is capable of controlling (adjusting) the oscillation wavelength by controlling the temperature of the temperature adjustment unit.

To control the oscillation wavelength as is described above, in the embodiment the temperature dependence of the oscillation wavelength of the DFB semiconductor laser 160A is measured in advance. The measurement results are stored as a temperature dependence map in the form of a table, a conversion function, or a conversion coefficient in the memory 51 serving as a storage unit, which is arranged along with the main controller 50.

In the embodiment, the temperature dependence of the oscillation wavelength of the DFB semiconductor laser 160A is around 0.1 nm/° C. Accordingly, if the temperature of the DFB semiconductor laser changes 1° C., the wavelength of the reference wave (1544 nm) changes 0.1 nm. So, in the case of an eighth-harmonic wave (193 nm) the wavelength changes 0.0125 nm, and in the case of a tenth-harmonic wave (157 m) the wavelength changes 0.01 nm.

With the exposure apparatus, it is sufficient enough if the wavelength of the illumination light for exposure (pulse light) varies around ±20 pm in respect to the center wavelength. Accordingly, in the case of the eighth-harmonic wave the temperature of the DFB semiconductor laser 160A needs to vary around ±1.6° C., and in the case of the tenth-harmonic wave the temperature needs to vary around ±2° C.

The laser light source 160A is not limited to semiconductor lasers such as the DFB semiconductor laser. For example, the ytteribium (Yb) doped fiber laser which has an oscillation wavelength of around 990 nm can be used.

The photocoupler BS1 and BS2 have a transmittance of around 97%. Therefore, the laser beam from the DFB semiconductor laser 160A is separated at the photocoupler BS1, and around 97% of the separated beam is incident on the photocoupler BS2, whereas, the remaining 3% is incident on the beam monitor mechanism 164. Furthermore, the laser beam incident on the photocoupler BS2 is separated, and around 97% of the separated beam proceeds to the optical isolator 160B, whereas, the remaining 3% is incident on the absorption cell 165.

The beam monitor mechanism 164, the absorption cell 165, and the like will be described in detail later on in the description.

The optical isolator 160B is a device, which allows only light proceeding from the photocoupler BS2 to the EOM160C to pass, and prevents light proceeding in the opposite direction from passing. The optical isolator 160B prevents the oscillation mode of the DFB semiconductor laser from changing or noise from being generated, which are caused by the reflecting light (returning light).

The EOM160C is a device, which converts the laser beam (CW beam (continuous-wave beam) that has passed through the optical isolator 160B into a pulse light. As the EOM160C, an electrooptical modulator (for example, a double-electrode modulator) that has an electrode structure having performed chirp correction is used, so that the wavelength broadening of the semiconductor laser output by chirp due to temporal change in the refractive index is decreased. The EOM160C emits a pulse light modulated in synchronous with the voltage pulse impressed from the light amount controller 16C. For example, if the EOM160C modulates the laser beam oscillated from the DFB semiconductor laser 160A into a pulse light with a pulse width of 1 ns and a repetition frequency of 100 kHz (pulse period around 10 μs), as a result of this optical modulation, the peak output of the pulse light emitted from the EOM160 is 20 mW, and the average output 2 μW. In this case, the insertion of the EOM160C does not create any loss, however, in the case there is a loss by insertion, for example, when the loss is −3 dB, the peak output of the pulse light becomes 10 mW, and the average output 1 μW.

In the case of setting the repetition frequency to around 100 kHz and over, it is preferable to prevent the amplification reduction due to the noise effect of the ASE (Amplified Spontaneous Emission) with the fiber amplifier. The details on this will be described later on in the description.

When only the EOM160C is used and the pulse light is turned off, in the case the extinction ratio is not sufficient enough, it is preferable to use the current control of the DFB semiconductor laser 160A. That is, since with semiconductor lasers and the like, the emitted light can be pulse oscillated by performing current control, it is preferable to generate the pulse light by utilizing both the current control of the DFB semiconductor laser 160A and the EOM160C. For example, if a pulse light having a width of around 10–20 ns is oscillated by the current control of the DFB semiconductor laser 160A and is partially extracted and modulated by the EOM160C into a pulse light having a width of around 1 ns, it becomes possible to generate a pulse light that has a narrow pulse width compared with the case when using only the EOM160C, and can also further simplify the control of the oscillation interval and the beginning/end of the oscillation of the pulse light.

Alternately, it is possible to use an acousto-optic modulator (AOM) instead of the EOM160C.

The light amplifying portion 161 amplifies the pulse light from the EOM160C, and in this case, is structured including a plurality of fiber amplifiers. An example of the arrangement of the light-amplifying portion 161 is shown in FIG. 3 with the EOM160C.

Figure 3:
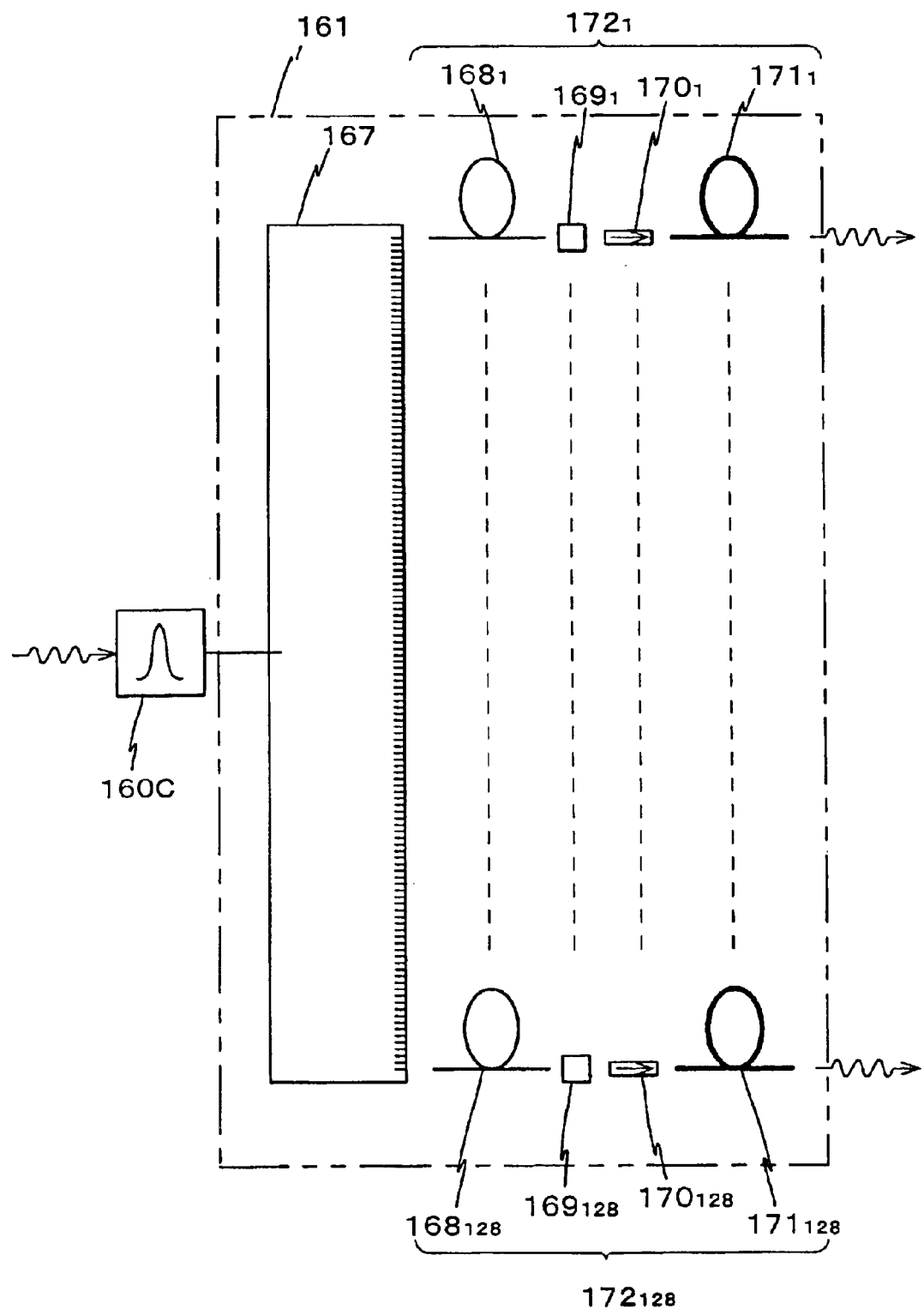
FIG. 3 is a schematic view showing the arrangement of the light amplifying portion in FIG. 2.

As shown in FIG. 3, the light amplifying portion 161 comprises: a branch and delay portion 167, which has a total of 128 channels from 0 to 127; fiber amplifiers $168_1$–$168_{128}$ which are respectively connected to the output side of the channels 0 to 127 (a total of 128 channels) of the branch and delay portion 167; narrow-band filters $169_1$–$169_{128}$, optical isolators $170_1$–$170_{128}$, fiber amplifiers $171_1$–$171_{128}$, which are connected to the output side of the fiber amplifiers $168_1$–$168_{128}$ in this order, and the like. In this case, as is obvious from FIG. 3, the fiber amplifier $168_n$, the narrow-band filter $169_n$, the optical isolator $170_n$, and the fiber amplifier $171_n$ (n=1, 2, . . . , 128) respectively make up the optical path $172_n$ (n=1, 2, . . . , 128).

To further describe each structuring portion of the light amplifying portion 161, the branch and delay portion 167 has a total of 128 channels, and provides a predetermined delay time (in this case 3 ns) to the output of each channel.

In this embodiment, the structure of the branch and delay portion 167 includes: an erbium (Er)-doped fiber amplifier (EDFA), which performs a 35 dB (×3162) optical amplification on the pulse light emitted from the EOM160C; a splitter (1 planar waveguide×4 splitters) serving as an optical branch unit which divides in parallel the output of the EDFA into four (channels 0 to 3) outputs; four optical fibers with different lengths, which are respectively connected to the output end of the channels 0 to 3 of the splitter; four splitters (1 planar waveguide×32 splitters) which divides the output of the four optical fibers respectively into 32 (channels 0 to 31); and 31 optical fibers each (a total of 124 optical fibers) having different lengths, which are respectively connected to the channels 1 to 31 (excluding channel 0) of each splitter. Hereinafter, the channels 0 to 31 of each splitter (1 planar waveguide×32 splitters) will be referred to as a "block" in general.

More particularly, the pulse light emitted from the EDFA has a peak output of around 63 W, and the average output is around 6.3 W. This pulse light is divided in parallel into four outputs, to channel 0 to 3 by the splitter (1 planar waveguide×4 splitters), and a delay corresponding to the length of the four optical fibers is provided to the light emitted from each channel. For example, in the embodiment, when the propagation velocity of light in the optical fiber is $2\times10^8$ m/s, and the length of the optical fibers connected to the channels 0, 1, 2, and 3 of the splitter (1 planar waveguide×4 splitters) are 0.1 m, 19.3 m, 38.5 m, and 57.7 m respectively (hereinafter referred to as the "first delay fiber"), then the delay of light between adjacent channels at the emitting side of the first delay fiber is 96 ns.

In addition, to the channels 1 to 31 of the four splitters (1 splitter: 1 planar waveguide×32 splitters), optical fibers (hereinafter referred to as the "second delay fiber") respectively having the length of 0.6×N (N=channel number) are connected. As a consequence, a delay of 3 ns is provided between adjacent channels within each block. And in respect to the output of channel 0 in each block, a delay of 3×31=93 ns is provided to the output of channel 31.

Meanwhile, in between each block, from the first block to the fourth block, the first delay fiber respectively provides a delay of 96 ns at the input stage of each block, as is described above. Accordingly, the channel 0 output of the second block is provided a delay of 96 ns in respect to the channel 0 output of the first block, and a delay of 3 ns in respect to the channel 31 output of the first block. This is likewise, between the second and third block, and the third and fourth block. And as a consequence, as the entire output, on the emitting side of the 128 channels, a pulse light that has a 3 ns delay in between adjacent channels can be obtained.

From the branch and delay described above, on the emitting side of the 128 channels, the pulse light that has a 3 ns delay in between adjacent channels is obtained, and the light pulse that can be observed at each emitting end is 100 kHz (pulse period 10 μs), which is the same as the pulse modulated by the EOM 160C. Accordingly, from the viewpoint of the entire laser beam generating portion, the repetition of the next pulse train being generated at an interval of 9.62 μs after 128 pulses are generated at an interval of 3 ns, is performed at 100 kHz. That is, the total output becomes $128\times100\times10^3=1.28\times10^7$ pulse/second.

With the embodiment, the example was of the case when the channel was divided into 128 the delay fibers used were short, thus, in between pulse trains an interval of 9.62 μs occurred where no light was emitted. However, by increasing the number of divided channels, or by using a longer delay fiber with an appropriate length, or by combining both methods, it is possible to make the pulse interval completely equal.

In the embodiment, the erbium (Er)-doped fiber amplifier (EDFA) which mode field diameter of the optical fiber (hereinafter referred to as "mode diameter") is 5–6 μm, likewise with the optical fiber normally used for communication, is used as the fiber amplifier $168_n$ (n=1, 2, . . . , 128). The fiber amplifier $168_n$ amplifies the emitted light from each channel of the delay portion 167 according to a predetermined amplifier gain. The pumped light source and the like of the fiber amplifier $168_n$ will be described later in the description.

The narrow-band filter $169_n$ (n=1, 2 . . . , 128) cuts the ASE generated at the fiber amplifier $168_n$ while allowing the output wavelength (wavelength width around 1 pm or under) of the DFB semiconductor laser 160A to pass, so that the wavelength width of the light transmitted is substantially narrowed. This can prevent the amplifier gain being reduced by the ASE being incident on the fiber amplifier $171_n$ arranged on the output side, or the laser beam from scattering due to traveling the noise of the ASE. It is preferable for the narrow-band filter $169_n$ to have a transmission wavelength width of around 1 pm, however, since the wavelength width of the ASE is around several tens (nm) the ASE can be cut with the current narrow-band filter having the transmission wavelength width of around 100 pm to an extent so that there are substantially no serious problems.

In addition, in the embodiment, since there are cases when the output wavelength of the DFB semiconductor laser 160A is positively changed, as will be described later, it is preferable to use a narrow-band filter that has a transmission wavelength width (the same level or above the variable width) in accordance with the variable width of the output wavelength (the variable width of the exposure apparatus in the embodiment is, for example, around ±20 pm). With the laser unit applied in the exposure apparatus, the wavelength width is set around 1 pm and under.

The optical isolator $170_n$ (n=1, 2, . . . , 128) reduces the effect of the returning light, likewise with the optical isolator 160B described earlier.

As the fiber amplifier $171_n$ (n=1, 2, . . . , 128), in the embodiment, in order to avoid the spectral width of the amplified light from increasing due to the nonlinear effect, the mode diameter of the optical fiber used is wider than the optical fiber normally used for communication (5–6 μm). For example, an EDFA with a wide diameter of around 20–30 μm is used. The fiber amplifier $171_n$ further amplifies the light emitted from each channel of the branch and delay portion 167 that have already been amplified with the fiber amplifier $168_n$. As an example, when the average output of each channel of the branch and delay portion 167 is around 50 μW and the average output of all the channels is around 6.3 mW, and an amplification of a total of 46 dB (×40600) is performed by the fiber amplifier $168_n$ and the fiber amplifier $171_n$, at the output end of the optical path $172_n$ corresponding to each channel (the output end of the optical fiber making up the fiber amplifier $171_n$), the peak output of 20 kW, the pulse width 1 ns, the pulse repetition frequency 100 kHz, the average output 2 W, and the average output of all the channels 256 W are obtained. The pumped light source and the like of the fiber amplifier $171_n$ will also be described later in the description.

Figure 4:
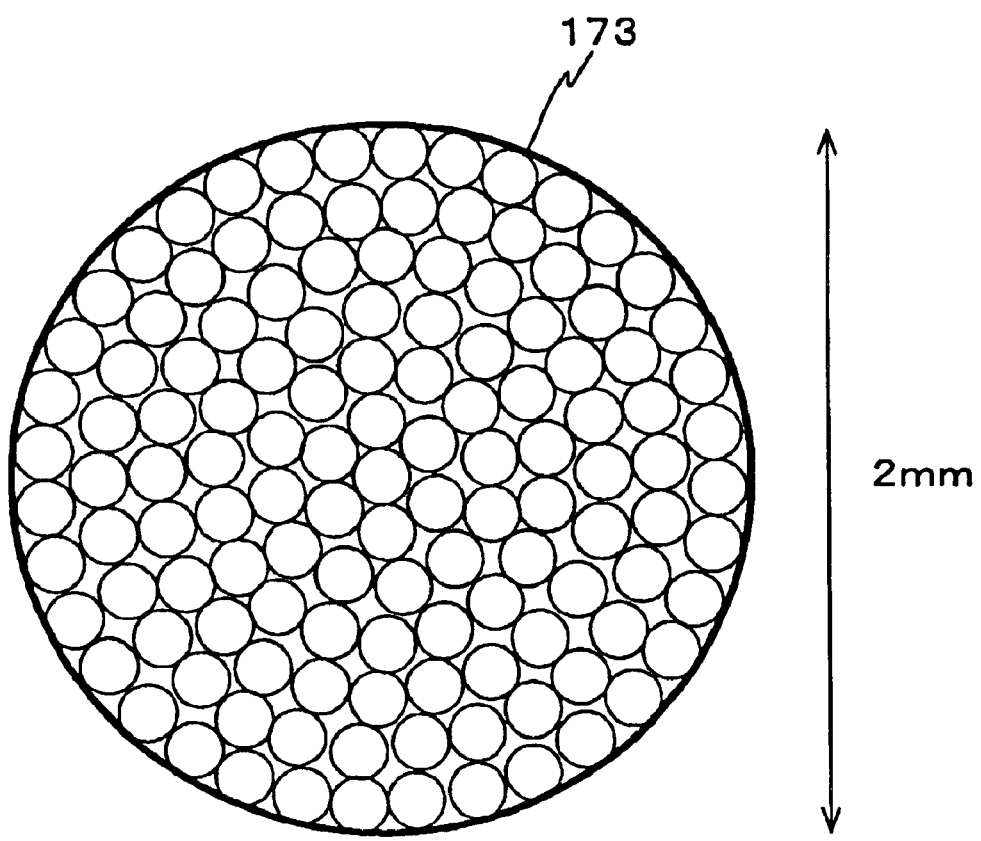
FIG. 4 is a sectional view showing the bundle-fiber formed by bundling the output end of the fiber amplifiers arranged at a final stage that structure the light amplifying portion.

In the embodiment, the output end of the optical path $172_n$ corresponding to each channel of the branch and delay portion 167, that is, the output end of the optical fiber making up the fiber amplifier $171_n$, is bundled to form a bundle-fiber 173, which has a sectional shape as is shown in FIG. 4. The cladding diameter of each optical fiber is around 125 μm, therefore, the diameter of the bundle of 128 optical fibers at the output end can be around 2 mm or under. In the embodiment, the bundle-fiber 173 is formed using the output end of the fiber amplifier $171_n$ itself, however, a non-doped optical fiber can be connected to each output end of the fiber amplifier $171_n$ and the bundle-fiber can be formed by bundling these optical fibers.

The fiber amplifier $168_n$ that has an average mode diameter and the fiber amplifier $171_n$ that has a wide mode diameter are connected using an optical fiber which mode diameter increases in the shape of a truncated cone.

Figure 5:
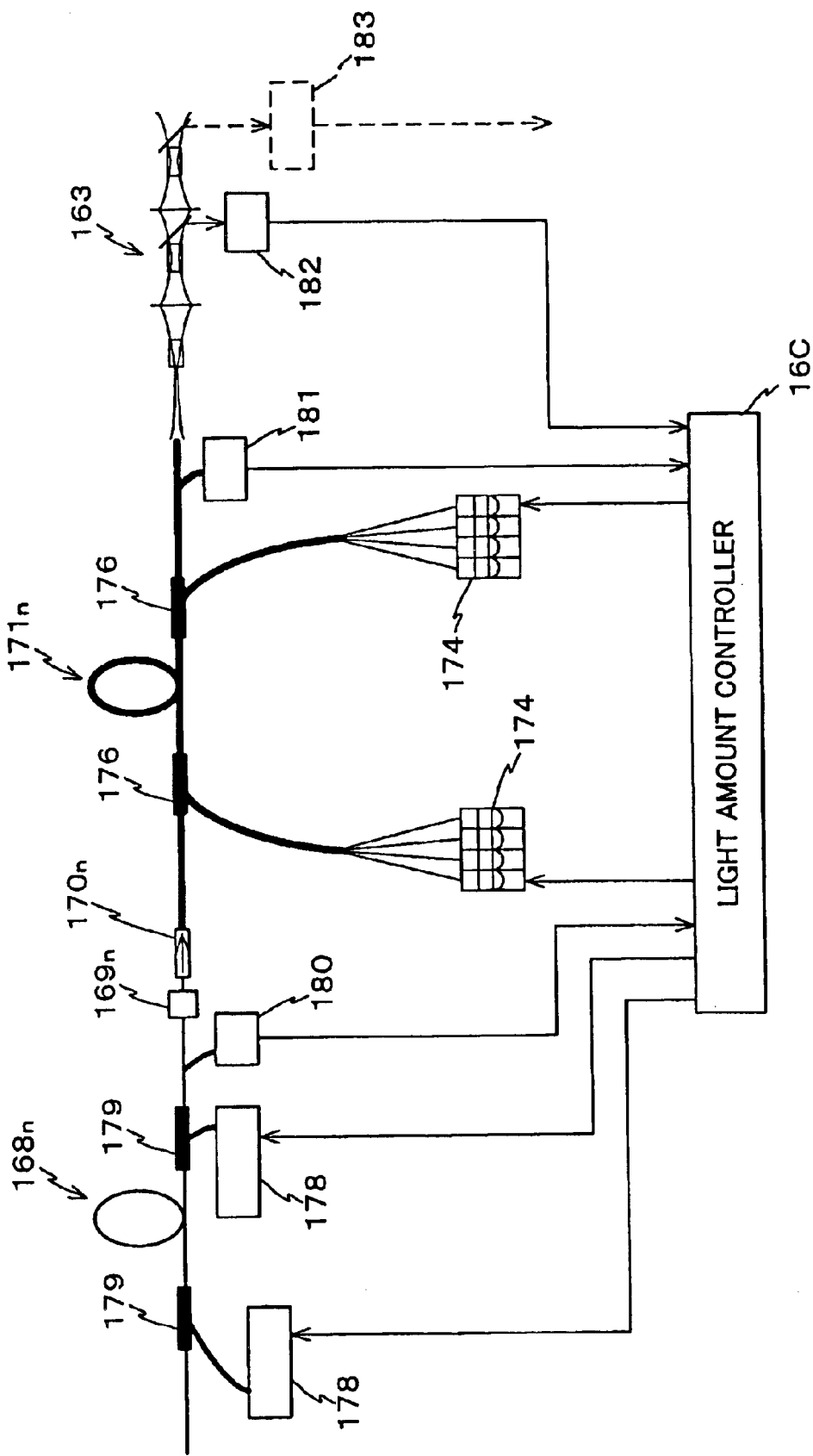
FIG. 5 is a schematic view showing the fiber amplifiers structuring the light amplifying portion in FIG. 2 and its neighboring portion, with a part of the wavelength conversion portion.

Next, the pumped light source and the like of each fiber amplifier are described with reference to FIG. 5. FIG. 5 schematically shows the fiber amplifiers and their neighboring area structuring the light amplifying portion 161, with a partial view of the wavelength conversion portion 163.

In FIG. 5, a semiconductor laser 178 for pumping is fiber coupled to the fiber amplifier $168_n$, and the output of the semiconductor laser 178 is input into the doped fiber for the fiber amplifier through the wavelength division multiplexer (WDM) 179. The doped fiber is pumped with this operation.

Meanwhile, with the fiber amplifier 171$_n$, a semiconductor laser 174 that serves as a pumping light source to pump the doped fiber for the fiber amplifier having a wide mode diameter is fiber coupled to the fiber with the wide mode diameter, which diameter matches that of the doped fiber for the fiber amplifier. And the output of the semiconductor laser 174 is input to the doped fiber for the optical amplifier, and thus the doped fiber is pumped.

The laser beam amplified with the wide mode diameter (fiber amplifier) 171$_n$, is incident on the wavelength conversion portion 163, and the wavelength of the laser beam is converted to generate the ultraviolet laser beam. The arrangement of the wavelength conversion portion and the like will be described, later in the description.

It is preferable for the laser beam (signals) transmitted through the wide mode diameter (fiber amplifier) 171$_n$ to be mainly in the fundamental mode, and this can be achieved by selectively pumping the fundamental mode in a single mode or multimode fiber with a low mode order.

With the embodiment, four high-powered semiconductor lasers are fiber coupled to the wide mode diameter fiber in both the proceeding direction of the laser beam (signals) and the direction opposite. In this case, in order to effectively couple the semiconductor laser beam for pumping to the doped fiber for the optical amplifier, it is preferable to use an optical fiber which cladding has a double structure as the doped fiber for the optical amplifier. And, the semiconductor laser beam for pumping is guided into the inner cladding of the dual cladding by the WDM 176.

The semiconductor lasers 178 and 174 are controlled by the light amount controller 16C.

In addition, in the embodiment, since the fiber amplifiers 168$_n$ and 171$_n$ are provided as the optical fiber making up the optical path 172$_n$, the gain difference in each fiber amplifier becomes the dispersion of the light emitted at each channel. Therefore, in the embodiment, the output is partially branched at the fiber amplifier of each channel (168$_n$ and 171$_n$) and is photo-electrically converted by the photoconversion elements 180 and 181 arranged respectively at the branched end. And the output signals of these photoconversion elements 180 and 181 are sent to the light amount controller 16C.

The light amount controller 16C feedback controls the drive current of each pumping semiconductor laser (178 and 174) so that the light emitted from each fiber amplifier is constant (that is, balanced) at each amplifying stage.

Furthermore, with the embodiment, as is shown in FIG. 5, the laser beam split by the beam splitter halfway through the wavelength conversion portion 163 is photo-electrically converted by the photoconversion element 182, and the output signal of the photoconversion element 182 is sent to the light amount controller 16C. The light amount controller 16C then monitors the light intensity of the wavelength conversion portion 163 based on the output signals of the photoconversion element 182, and feedback controls the drive current of at least either the pumping semiconductor laser 178 or the pumping semiconductor laser 174.

By having this arrangement, since the amplification of the fiber amplifier in each channel is constant at each amplifying stage, a unified light intensity can be obtained as a whole without an overload on either fiber amplifier. In addition, by monitoring the light intensity of the wavelength conversion portion 163, the expected predetermined light intensity can be fed back to each amplifier, and the desired ultraviolet light output can be stably obtained.

Details on the light amount controller 16C will be described later in the description.

From the light amplifying portion 161 (the output side of each optical fiber forming the bundle-fiber 173) having the arrangement described above, the pulse light is emitted, on which circular polarization has been performed in the manner which will be described later by the polarization adjustment unit 16D. The circular polarized pulse light is converted to a linear polarized pulse light where the polarized direction is all the same by the quarter-wave plate 162, and is then incident on the wavelength conversion portion 163.

The wavelength conversion portion 163 includes a plurality of nonlinear optical crystals, and converts the wavelength of the amplified pulse light (light having the wavelength of 1.544 μm) into an eighth-harmonic wave or a tenth-harmonic wave so that ultraviolet light that has the same output wavelength as the ArF excimer laser (wavelength: 193 nm) or the F$_2$ laser (wavelength: 157 nm) is generated.

FIG. 6A and FIG. 6B show examples of the arrangement of the wavelength conversion portion 163. Following is a description of concrete examples on the wavelength conversion portion 163, with reference to these Figures.

FIG. 6A shows an example of the arrangement when ultraviolet light having the same wavelength as the ArF excimer laser (193 nm) is generated by converting the fundamental wave of the wavelength 1.544 μm output from the emitting end of the bundle-fiber 173 using the nonlinear optical crystals into an eighth-harmonic wave. In addition, FIG. 6B shows an example of the arrangement when ultraviolet light having the same wavelength as the F$_2$ laser (157 nm) is generated by converting the fundamental wave of the wavelength 1.57 μm output from the emitting end of the bundle-fiber 173 using the nonlinear optical crystals into a tenth-harmonic wave.

At the wavelength conversion portion in FIG. 6A, the wavelength conversion is performed in the order of: fundamental wave (wavelength: 1.544 μm)→second-harmonic wave (wavelength: 772 nm)→third-harmonic wave (wavelength: 515 nm)→fourth-harmonic wave (wavelength: 386 nm)→seventh-harmonic wave (wavelength: 221 nm)→eighth-harmonic wave (wavelength: 193 nm).

More particularly, the fundamental wave output from the emitting end of the bundle-fiber 173 that has the wavelength of 1.544 μm (frequency ω) is incident on the first stage nonlinear optical crystal 533. When the fundamental wave passes through the nonlinear optical crystal 533, by the second-harmonic generation a second-harmonic wave which frequency is doubled from the frequency ω of the fundamental wave, that is, a second-harmonic wave with a frequency of 2ω (the wavelength is half, which is 772 nm) is generated. In the case of FIG. 6A, the linear polarization by the quarter-wave plate 162 is performed so that the polarized direction is set in the direction where the second-harmonic wave is generated most efficiently. Such polarized direction setting of the linear polarization is performed, by adjusting the direction of the optical axis of the quarter-wave plate 162.

As the first stage nonlinear optical crystal 533, an LiB$_3$O$_5$ (LBO) crystal is used, and NCPM (Non-Critical Phase Matching), which is a method of adjusting the temperature of the LBO crystal for phase matching to convert the wavelength of the fundamental wave to a second-harmonic wave, is employed. NCPM is capable of converting the fundamental wave into a second-harmonic wave with high efficiency, since walk-off between the fundamental wave and the second-harmonic wave does not occur within the nonlinear optical crystal, and also because of the advantage that the beam shape of the second-harmonic wave generated does not change by the walk-off.

The fundamental wave that has passed through the nonlinear optical crystal 533 without the wavelength converted and the second-harmonic wave generated by the wavelength conversion are respectively provided a delay of a half wave and a single wave. Only the fundamental wave rotates the polarized direction by 90 degrees, then the fundamental wave and the second-harmonic wave are incident on the second stage nonlinear optical crystal 536. As the second nonlinear optical crystal 536, an LBO crystal is used, and the LBO crystal is used in NCPM at a temperature different from the first nonlinear optical crystal (LBO crystal) 533. In the nonlinear optical crystal 536, a third-harmonic wave (wavelength: 515 nm) is generated by sum frequency generation of the second-harmonic wave generated in the first nonlinear optical crystal 533 and of the fundamental wave that has passed through the nonlinear optical crystal 533 without the wavelength converted.

Then, the third-harmonic wave obtained in the nonlinear optical crystal 536 and the fundamental wave and the second-harmonic wave that have passed through the nonlinear optical crystal 536 without being converted are separated at the dichroic mirror 537, and the third-harmonic wave reflected on the dichroic mirror 537 passes through the condenser lens 540 and the dichroic mirror 543 and is incident on the fourth stage nonlinear optical crystal 545. Meanwhile, the fundamental wave and the second-harmonic wave that have passed through the dichroic mirror 537 are incident on the third stage nonlinear optical crystal 539.

The LBO crystal is used as the third stage nonlinear optical crystal 539, and the fundamental wave passes through the LBO crystal without being converted, whereas, the second-harmonic wave is converted to a fourth-harmonic wave (wavelength: 386 nm) by second-harmonic generation. The fourth-harmonic wave obtained in the third nonlinear optical crystal 539 and the fundamental wave that has passed through the third nonlinear optical crystal 539 are separated at the dichroic mirror 541, and the fundamental wave that has passed through the dichroic mirror 541 passes through the condenser lens is reflected on the dichroic mirror 546, and is incident on the fifth stage nonlinear optical crystal 548. On the other hand, the fourth-harmonic wave reflected on the dichroic mirror 541 passes through the condenser lens 542 and reaches the dichroic mirror 543, and is coaxially synthesized with the third-harmonic wave reflected on the dichroic mirror 537 and then is incident on the fourth stage nonlinear optical crystal 545.

As the fourth stage nonlinear optical crystal 545, a β-BaB$_2$O$_4$ (BBO) crystal is used, and a seventh-harmonic wave (wavelength: 221 nm) is generated by sum frequency generation of the third-harmonic wave and the fourth-harmonic wave. The seventh-harmonic wave generated in the fourth nonlinear optical crystal 545 passes through the condenser lens 547, and is coaxially synthesized with fundamental wave that has passed through the dichroic mirror 541 at the dichroic mirror 546, and is then incident on the fifth stage nonlinear optical crystal 548.

As the fifth stage nonlinear optical crystal 548, the LBO crystal is used, and an eighth-harmonic wave (wavelength: 193 nm) is generated by sum frequency generation of the fundamental wave and the seventh-harmonic wave. In the arrangement above, instead of the BBO crystal 545 used to generate the seventh-harmonic wave and the LBO crystal 548 used to generate the eight-harmonic wave, it is possible to use a CsLiB$_6$O$_{10}$ crystal and a Li$_2$B$_4$O$_7$ (LB4) crystal.

With the arrangement example in FIG. 6A, since the third-harmonic wave and the fourth-harmonic wave proceed through different optical paths and are incident on the fourth stage nonlinear optical crystal 545, the lens 540 to condense the third-harmonic wave and the lens 542 to condense the fourth-harmonic wave can be arranged on separate optical paths. The sectional shape of the fourth-harmonic wave generated in the third nonlinear optical crystal 539 is elliptic due to the walk-off phenomenon. Therefore, in order to obtain favorable conversion efficiency in the fourth stage nonlinear optical crystal 545, it is preferable to perform beam shaping on the fourth-harmonic wave. In this case, since the condenser lens 540 and 542 are arranged on different optical paths, for example, a pair of cylindrical lens can be used as the lens 542 to easily perform beam shaping on the fourth-harmonic wave. This makes it possible for the fourth-harmonic wave to overlap the third-harmonic wave favorably at the fourth stage nonlinear optical crystal 545, and the conversion efficiency can be increased.

Furthermore, the lens 544 to condense the fundamental wave incident on the fifth stage nonlinear optical crystal 548 and the lens 547 to condense the seventh-harmonic wave can be arranged on different optical paths. The sectional shape of seventh-harmonic wave generated in the fourth stage nonlinear optical crystal 545 is elliptic due to the walk-off phenomenon. Therefore, in order to obtain favorable conversion efficiency in the fifth stage nonlinear optical crystal 548, it is preferable to perform beam shaping on the seventh-harmonic wave. In the embodiment, since the condenser lens 544 and 547 can be arranged on different optical paths, for example, a pair of cylindrical lens can be used as the lens 547 to easily perform beam shaping on the seventh-harmonic wave. Thus, the seventh-harmonic wave can favorably overlap the fundamental wave at the fifth stage nonlinear optical crystal (LBO crystal) 548, and the conversion efficiency can be increased.

The structure in between the second stage nonlinear optical crystal 536 and the fourth stage nonlinear optical crystal 545 is not limited to the arrangement shown in FIG. 6A. It can have any arrangement, so long as the third-harmonic wave, generated in the nonlinear optical crystal 536 and reflected on the dichroic mirror 537, and the fourth-harmonic wave, obtained by converting the wavelength of the second-harmonic wave generated in the nonlinear optical crystal 536 which passes through the dichroic mirror 537 in the nonlinear optical crystal 539, are both incident at the same time on the nonlinear optical crystal 545, and the length of the optical paths in between both nonlinear optical crystals 536 and 545 is equal. The same can be said of the structure in between the third stage nonlinear optical crystal 539 and the fifth stage nonlinear optical crystal 548.

According to an experiment performed by the inventor, in the case of FIG. 6A, the average output of the eighth-harmonic wave (wavelength: 193 nm) in each channel was around 45.9 mW. Accordingly, the average output of the bundle of the entire 128 channels becomes 5.9W, therefore, ultraviolet light having a wavelength of 193 nm can be provided, which is sufficient enough as an output of a light source for an exposure apparatus.

In this case, on generating an eighth-harmonic wave (wavelength: 193 nm), currently, the LBO crystal, which has good quality and can be purchased easily on the market, is used. Since the LBO crystal has an extremely small absorption coefficient to the ultraviolet light having a wavelength of 193 nm, and the optical damage of the crystal does not create a serious problem, the LBO crystal is advantageous in durability.

In addition, at the generating portion of the eighth-harmonic wave (wavelength: 193 nm), angular phase matching is performed on the LBO crystal used, however, since the phase matching angle is large, the effective nonlinear optical constant ($d_{eff}$) becomes small. Therefore, it is preferable to use the LBO crystal at a high temperature by providing a temperature control mechanism to the LBO crystal. This can reduce the phase matching angle, that is, the constant referred to above ($d_{eff}$) can be increased, and the generation efficiency of the eighth-harmonic wave can be improved.

At the wavelength conversion portion in FIG. 6B, the wavelength conversion is performed in the order of: fundamental wave (wavelength: 1.57 μm)→second-harmonicwave (wavelength: 785 nm)→fourth-harmonic wave (wavelength: 392.5 nm)→eighth-harmonic wave (wavelength: 196.25 nm)→tenth-harmonic wave (wavelength: 157 nm). In this arrangement example, upon each wavelength conversion from the second-harmonic wave generation to the eighth-harmonic wave generation, second-harmonic generation is performed on each wavelength when it enters each wavelength conversion.

Also, in this arrangement example, as the nonlinear optical crystal used for wavelength conversion, the LBO crystal is used for the nonlinear optical crystal 602 that generates a second-harmonic wave from a fundamental wave by second-harmonic generation, and for the nonlinear optical crystal 604 that generates a fourth-harmonic wave from the second-harmonic wave by second-harmonic generation. Furthermore, as the nonlinear optical crystal 609, which generates an eighth-harmonic wave from the fourth-harmonic wave by second-harmonic generation, an $Sr_2Be_2B_2O_7$(SBBO) crystal is used. And, as the nonlinear optical crystal 611, which generates a tenth-harmonic wave (wavelength: 157 nm) by sum frequency generation of the second-harmonic wave and the eighth-harmonic wave, the SBBO crystal is used.

The second-harmonic wave generated in the nonlinear optical crystal 602 passes through the condenser lens 603 and is incident on the nonlinear optical crystal 604, and the nonlinear optical crystal 604 generates the fourth-harmonic wave described above, as well as a second-harmonic wave that is not converted. The second-harmonic wave, which has passed through the dichroic mirror 605, then passes through the condenser lens 606 and is reflected on the dichroic mirror 607, and then is incident on the nonlinear optical crystal 611. Whereas, the fourth-harmonic wave, which is reflected on the dichroic mirror 605, passes through the condenser lens 608 and is incident on the nonlinear optical crystal 609, and the eighth-harmonic wave generated in the nonlinear optical crystal 609 proceeds to the condenser lens 610 and the dichroic mirror 607, and then is incident on the nonlinear optical crystal 611. Furthermore, the nonlinear optical crystal 611 generates the tenth-harmonic wave (wavelength: 157 nm) by sum frequency generation of the second-harmonic wave and the eighth-harmonic wave, which are coaxially synthesized at the dichroic mirror 607.

In this arrangement example, the arrangement was made so that the second-harmonic wave and the fourth-harmonic wave generated in the second stage nonlinear optical crystal 604 were separated at the dichroic mirror 605, and the second-harmonic wave having passed through the dichroic mirror 605 and the eighth-harmonic wave obtained by converting the wavelength of the fourth-harmonic wave at the nonlinear optical crystal 609 went through different optical paths before being incident on the fourth stage nonlinear optical crystal 611. Alternately, the dichroic mirrors 605 and 607 do not have to be used, and the four nonlinear optical crystals 602, 604, 609, and 611 may have a coaxial arrangement.

However, in the arrangement example, the sectional shape of the fourth-harmonic wave generated in the second stage nonlinear optical crystal 604 is elliptic due to the walk-off phenomenon. Therefore, in order to obtain favorable conversion efficiency in the fourth stage nonlinear optical crystal 611 where this beam is incident, it is preferable to perform beam shaping on the fourth-harmonic wave, which is the incident beam, and create a favorable overlap with the second-harmonic wave. In this arrangement example, since the condenser lenses 606 and 608 are arranged on different optical paths, for example, it is possible to use the cylindrical lens as the lens 608, which makes the beam shaping of the fourth-harmonic wave easier. Thus, the fourth-harmonic wave can favorably overlap the second-harmonic wave at the fourth stage nonlinear optical crystal 611, and the conversion efficiency can be increased.

It is a matter of course, that the wavelength conversion portion shown in FIGS. 6A and 6B are mere examples, and the arrangement of the wavelength conversion portion in the present invention are not limited to them. For example, ultraviolet light having a wavelength of 157 nm, which is the same as the $F_2$ laser, may be generated by performing a tenth-harmonic generation on the fundamental wave having a wavelength of 1.57 μm emitted from the outgoing end of the bundle-fiber 173 using the nonlinear optical crystal.

Referring back to FIG. 2, the beam monitor mechanism 164 is made up of a Fabry-Perot etalon (hereinafter also referred to as "etalon element") and an energy monitor consisting of a photoconversion element such as a photodiode (neither is shown in Figs.). The beam incident on the etalon element structuring the beam monitor mechanism 164 passes through the etalon element with a transmittance that corresponds to the frequency difference of the resonance frequency of the etalon element and the frequency of the incident beam. And the output signals of the photodiode and the like, which detect the intensity of the transmitted beam, are sent to the laser controller 16B. The laser controller 16B performs a predetermined signal processing on the output signals, and to be precise, obtains information related to the optical properties of the incident beam on the etalon element (to be concrete, information such as the center wavelength of the incident beam and the width of the wavelength (spectral half-width)). And the information related to the optical properties is sent to the main controller 50 realtime.

The frequency characteristic of the transmitted light intensity that the etalon element generates is affected by the temperature or pressure of atmosphere, and in particular, the resonance frequency (resonance wavelength) is temperature dependent. Therefore, it is important to study the temperature dependence of the resonance wavelength in order to precisely control the center wavelength of the laser beam emitted from the laser light source 160A based on the detection results of the etalon element. In the embodiment, the temperature dependence of the resonance wavelength is measured in advance, and the measurement results are stored in the memory 51 serving as a storage unit, which is arranged with the main controller 50, as a temperature dependence map. The temperature dependence map can have the form of a table, or be a function or a coefficient in the memory 51.

And, the main controller 50 gives instructions to the laser controller 16B to positively control the temperature of the etalon element within the beam monitor mechanism 164, so that the resonance wavelength (detection reference wavelength) maximizing the transmittance of the etalon element precisely coincides with the wavelength set in cases such as absolute wavelength calibration of the beam monitor mechanism 164, which will be described later on.

In addition, the output of the energy monitor structuring the beam monitor mechanism 164 is sent to the main controller 50, and the main controller 50 detects the energy power of the laser beam based on the output of the energy monitor and controls the light amount of the laser beam oscillated from the DFB semiconductor laser 160A via the laser controller 16B or turns off the DFB semiconductor laser 160A when necessary. In the embodiment, however, as will be described later on, the light amount control (exposure amount control) is usually performed mainly by the light amount controller 16C, by controlling the peak power or frequency of the pulse light emitted from the EOM160C or by on/off control of the light emitted from each fiber amplifier structuring the light amplifying portion 161. Accordingly, the main controller 50 controls the laser controller 16B in the manner described above when the energy power of the laser beam changes greatly for some reason.

The absorption cell 165 is an absolute wavelength source for absolute wavelength calibration of the oscillation wavelength of the DFB semiconductor laser 160A, in other words, is the absolute wavelength source for absolute wavelength calibration of the beam monitor mechanism 164. In the embodiment, since the DFB semiconductor laser 160A having the oscillation wavelength of 1.544 μm is used as the light source, an isotope of acetylene having dense absorption lines in the wavelength band around the wavelength of the DFB semiconductor laser 160A is used as the absorption cell 165.

As will be described later on, in the case of selecting intermediate waves of the wavelength conversion portion 163 (such as the second-harmonic wave, the third harmonic wave, and the fourth harmonic wave) or light which wavelength has been converted with, or in alternate of the fundamental wave as the light for monitoring the wavelength of the laser beam, the absorption cell that has dense absorption lines around the wavelength of the intermediate wave can be used. For example, in the case of selecting the third-harmonic wave as the light for monitoring the wavelength of the laser beam, iodine molecules that have dense absorption lines around the wavelength of 503 nm to 530 nm can be used as the absorption cell. The appropriate absorption line of the iodine molecules can be chosen, and the wavelength of the absorption line can be determined as the absolute wavelength.

In addition, the absolute wavelength source is not limited to the absorption cell, and the absolute wavelength light source may also be used.

The laser controller 16B detects the center wavelength and the wavelength width (spectral half-width) of the laser beam based on the output of the beam monitor mechanism 164 under the control of the main controller 50, and feedback controls the temperature control (and current control) of the DFB semiconductor laser 160A so that the center wavelength becomes a desired value (set wavelength). In the embodiment, it is possible to control the temperature of the DFB semiconductor laser 160A in the unit of 0.001° C.

In addition, the laser controller 16B switches the output of the DFB semiconductor 160A between the pulse output and the continuous output and controls the output interval and pulse width during pulse output, as well as control the oscillation of the DFB semiconductor laser 160A so as to compensate the output variation of the pulse light, in accordance with instructions from the main controller 50.

In this manner, the laser controller 16B stabilizes the oscillation wavelength to a constant wavelength, as well as finely adjust the output wavelength. On the contrary, the laser controller 16B may also adjust the output wavelength of the DFB semiconductor laser 160A by positively changing the oscillation wavelength in accordance with instructions from the main controller 50. The details on this will be described further later on.

Next, the wavelength stabilizing control method of the laser beam oscillated by the DFB semiconductor laser will be described.

First of all, the absolute wavelength calibration of the etalon element in the beam monitor mechanism 164, which is the premise of the wavelength stabilizing control, will be described.

As was described earlier, in the embodiment, the oscillation wavelength of the DFB semiconductor laser 160A and the temperature dependence of the resonance wavelength ($\lambda_{res}$) of the etalon element in the beam monitor mechanism 164 is measured in advance, and the measurement results are stored in the memory 51.

On absolute wavelength calibration of the etalon element, the main controller 50 selects the absorption line that has the wavelength closest to the set wavelength ($\lambda_{set}$) maximizing the transmittance of the absorption cell 165 or the absorption line that has the wavelength coinciding with the set wavelength ($\lambda_{res}$) in a state where the DFB semiconductor laser 160A is oscillated via the laser controller 16B. And during this operation, the main controller 50 gives instructions to the laser controller 16B to control the temperature of the etalon element in the beam monitor mechanism 164, so that the transmittance of the etalon element is at the maximum. That is, the calibration is performed with the resonance wavelength ($\lambda_{res}$) of the etalon element utilizing the absolute wavelength ($\lambda_{ref}$). Thus, $\lambda_{res}$, which is the detection reference wavelength of the etalon element, coincides with the absolute wavelength ($\lambda_{ref}$).

When the absolute wavelength calibration is performed, the main controller may change the oscillation wavelength of the DFB semiconductor laser 160A within a predetermined range via the laser controller 16B. With this arrangement, even if the oscillation wavelength of the DFB semiconductor laser 160A is greatly off the set wavelength, it becomes possible to swiftly select the absorption line that has the wavelength closest to the set wavelength ($\lambda_{set}$) maximizing the transmittance of the absorption cell 165 or the absorption line that has the wavelength coinciding with the set wavelength. As a consequence, the absolute wavelength calibration can be completed within a short period of time.

And, when the absolute wavelength calibration is completed, the main controller 50 controls the temperature of the etalon element via the laser controller 16B, using the data on temperature dependence of the resonance wavelength ($\lambda_{res}$) of the etalon element stored in the memory 51, and performs set wavelength calibration to set the resonance wavelength ($\lambda_{res}$) of the etalon element at the set wavelength ($\lambda_{set}$).

With the wavelength stabilizing control method in the embodiment, the resonance wavelength ($\lambda_{res}$) of the etalon element, in other words, the detection reference wavelength can coincide with the set wavelength without fail.

And, after this is completed, the laser controller 16B controls the temperature and current of the DFB semiconductor laser 160A by feedback control based on the detection values of the etalon element (monitoring results of the beam monitor mechanism 164) having completed the set wavelength calibration. The reason why the laser controller 16B controls the current supplied (drive current) of the DFB semiconductor laser 160A, as well as the temperature, is because the responsiveness is better in current control.

For example, with the former control, generation or change in aberration (image forming characteristics) of the projection optical system PL due to change in wavelength can be prevented, thus change in image characteristics (optical properties such as image quality) during pattern transfer can be avoided.

In addition, with the latter control, variation in image forming characteristics (such as aberration) of the projection optical system PL occurring due to the difference in altitude and pressure between the place where the exposure apparatus was made and adjusted and where the exposure apparatus is arranged (delivered) or the difference in the environment (atmosphere of the clean room), can be cancelled out, and the start-up time of the exposure apparatus at the delivery site can be reduced. Furthermore, with the latter control, change in aberration, projection magnification, and focal position of the projection optical system PL due to the irradiation of the illumination light for exposure and atmospheric change can also be canceled out during the operation of the exposure apparatus, and it becomes possible to transfer the pattern image onto the substrate in the best image forming state.

The light amount controller 16C has the following functions: stabilizing the amplification of the fiber amplifiers at each channel at each amplifying stage, by performing feedback control on the drive current of each pumping semiconductor laser (178 and 174) based on the output of the photoconversion elements 180 and 181 that detect the light emitted from the fiber amplifiers $168_n$ and $171_n$ within the light amplifying portion 161; and stabilizing the desired ultraviolet output by performing feedback control on the drive current of at least either the pumping semiconductor laser 178 or the pumping semiconductor laser 174 and feeding back the predetermined light intensity expected to each amplifying stage, based on the output signal of the photoconversion element 182, which detects the light split by the beam splitter along the wavelength conversion portion 163.

Furthermore, in the embodiment, the light amount controller 16C has the following functions.

That is, the light amount controller 16C has the function of:

① Controlling the average light output of the bundle in total by performing individual on/off control on the output of the fiber of each channel making up the bundle-fiber 173, in other words, the output of each optical channel $172_n$, in accordance with instructions from the main controller 50 (hereinafter referred to as the "first function" for the sake of convenience).

② Controlling the average light output (output energy) per unit time of each channel in the light amplifying portion 161, in other words, the intensity of the light emitted per unit time from each optical channel $172_n$, by controlling the frequency of the pulse light emitted from the EOM160C in accordance with instructions from the main controller 50 (hereinafter referred to as the "second function" for the sake of convenience).

③ Controlling the average light output (output energy) per unit time of each channel in the light amplifying portion 161, in other words, the intensity of the light emitted per unit time from each optical channel $172_n$, by controlling the peak power of the pulse light emitted from the EOM160C in accordance with instructions from the main controller 50 (hereinafter referred to as the "third function" for the sake of convenience).

Details of the first, second, and third functions will now be described.

First of all, the light amount controller 16C performs the on/off operation on each optical path $172_n$ referred to in the first function, by performing the on/off operation on the output of each channel of the fiber amplifier $171_n$. In this case, the light amount controller 16C can perform the operation by performing on/off operation on the fiber amplifier pumping semiconductor laser 174, in other words, by selectively setting the intensity of the pumped light from the semiconductor laser 174 to either a predetermined level or to a zero level. Or, the light amount controller 16C can perform the operation by adjusting the drive current value of the semiconductor laser 174 so that the intensity of the pumped light from the semiconductor laser 174 is selectively set to a first level where the fiber amplifier $171_n$ is in a state capable of amplifying, or to a second level where the fiber amplifier $171_n$ is not in a state capable of amplifying. In the state not capable of amplifying, the light absorption becomes larger, and the output from the fiber amplifier is almost zero, therefore, the output of each optical path $172_n$ is turned off.

In the case of performing on/off operation on the semiconductor laser 174, when the semiconductor laser 174 is in an off state, no power is consumed, therefore, energy saving becomes possible. On the other hand, in the case of switching the intensity of the pumped light from the semiconductor laser 174 between the first level and the second level, the first level and the second level may be a fixed value, but does not necessarily have to be a fixed value. That is, with the fiber amplifier, the state where it is or is not capable of amplifying is determined by whether the intensity of the pumped light is above or below a certain value.

According to the first function of the light amount controller 16C, the average light output (light amount) of the whole bundle is controllable by $1/128^{th}$ of the maximum light output (by around 1% and under). That is, the dynamic range can be set at a wide range of $1-1/128$. Since each optical path $172_n$ is made up of the same structuring material, designwise, the light output of the optical path $172_n$ is supposed to be equal, therefore light amount control by $1/128^{th}$ is to have good linearity.

In addition, with the embodiment, the wavelength portion 163 is arranged to perform wavelength conversion on the output of the amplifying portion 161, that is, on the output of the bundle-fiber 173. The output of the wavelength portion 163 is proportional to the output of each optical path $172_n$, that is, to the number of fibers of the fiber amplifier $171_n$ in an on state. Therefore, in principle, a linear light amount control by $1/128^{th}$ of the maximum light output (by around 1% and under) is possible.

However, in actual, possibilities are high that the output of each optical path $172_n$ is dispersed or that the wavelength conversion efficiency in respect to each optical path $172_n$ is dispersed due to manufactural errors and the like. Therefore, the output dispersion of each optical fiber (optical path $172_n$) and the wavelength conversion efficiency dispersion in respect to the output of each optical fiber are measured in advance. And based on the measurement results, a first output intensity map, which is a map on intensity of light output from the wavelength conversion portion 163 corresponding to the on/off state of the output of each optical fiber (a conversion table of output intensity corresponding to the fiber group in the "on" state), is made, and stored in the memory 51 arranged along with the main controller 50. The first output intensity map stored in the memory 51, may be in the form of a table, or it maybe in the form of a function or a coefficient. It is likewise, with the second and third intensity map, which will be described later in the description.

And, the light amount controller performs light amount control based on the set light amount provided from the main controller 50 and the intensity map described above, when performing the light amount control related to the first function.

In addition, the light amount controller 16C controls the frequency of the pulse light emitted from the EOM160C in the second function described above by changing the frequency of the rectangular wave (voltage pulse) impressed on the EOM160C. Since the frequency of the pulse light emitted from the EOM160C coincides with the frequency of the voltage pulse impressed on the EOM160C, the frequency of the pulse light emitted is to be controlled by controlling the impressed voltage.

In the embodiment, as is previously described the frequency of the rectangular wave impressed on the EOM160C is 100 kHz. For example, if the frequency is increased to 110 kHz, then the number of the light pulse per unit time is increase by 10%, and the branch and delivery portion 167 sequentially divides each pulse to the total of 128 channels, from channel 0 to 127. As a consequence, the pulse light per unit time in each channel increases by 10%, and if the light energy per light pulse is the same, that is, the peak power of the pulse light is constant, then, the output light intensity (light amount) of each optical path $172_n$ per unit time also increases by 10%.

In addition, in the embodiment, the wavelength conversion portion 163, which converts the wavelength of the emitted light from each channel of the light amplifying portion 161, is arranged, and the light amount of the light emitted per unit time of the wavelength conversion portion 163 is proportional to the frequency of the output pulse of each channel, if the peak power is constant. Accordingly, the light amount control of the second function is control with excellent linearity.

The pulse light emitted from the EOM160C, however, is input to the fiber amplifiers $168_n$ and $171_n$ via the delay portion 167, therefore, in actual, the linearity may not always be as stated above. That is, in general, the amplifier gain of the fiber amplifier has input light intensity dependence, so if the frequency of the output light of the EOM160C is changed, there may be cases where the input light intensity of the fiber amplifiers $168_n$ and $171_n$ changes, and as a result, the peak power of the pulse light emitted from the fiber amplifiers $168_n$ and $171_n$ may also change. It is possible, to suppress the change in peak power by designing the fiber amplifiers $168_n$ and $171_n$ appropriately, however, this may reduce the light output efficiency and other performances of the fiber amplifiers.

Thus, in the embodiment, the input frequency intensity dependence of the output of fiber amplifiers is measured in advance. And based on this measurement, the second output intensity map, which is a map on intensity of light output from (each channel of) the light amplifying portion 161 corresponding to the frequency of the pulse light input to the light amplifying portion 161 (a conversion table of output intensity of the light amplifying portion 161, corresponding to the frequency of light emitted from the EOM) is made, and stored into the memory 51.

And, when the light amount controller 16C performs the light amount control in the second function, the light amount control is performed based on the set light amount provided from the main controller 50 and the second output intensity map described above.

In addition, the light amount controller 16C controls the peak power of the pulse light emitted from the EOM160 in the third function described above, by controlling the peak intensity of the voltage pulse impressed on the EOM160C. This is because the peak power of the emitted light from the EOM160C is dependent on the peak intensity of the voltage pulse impressed on the EOM160C.

Also, in the embodiment, the wavelength conversion portion 163, which converts the wavelength of the emitted light from each channel of the light amplifying portion 161, is arranged, and the output light intensity of the wavelength conversion portion 163 shows a dependence in a nonlinear shape proportional to the power number of the harmonic order at the maximum, in respect to the peak intensity of the pulse light emitted from each optical fiber (optical path $172_n$). For example, on generating light of 193 nm by eighth-harmonic generation as is in FIG. 6A, the output intensity of the light having the wavelength of 193 nm shows the intensity change, which is proportional to the peak power of the fiber amplifier output to the eighth power, at the maximum.

In the case of the embodiment, since the dependence of the peak power of the pulse light emitted from the EOM160C in respect to the peak intensity of the voltage pulse impressed on the EOM160C is cos(V), as a consequence, the nonlinear dependence of the wavelength conversion portion 163 described above is eased. Accordingly, with the light source unit having a wavelength conversion portion as in the embodiment, it is meaningful to perform intensity (light amount) control of the light emitted by controlling the peak intensity of the voltage pulse impressed on the EOM160C.

However, as is described earlier, the amplifier gain of the fiber amplifier has input light intensity dependence, therefore, if the peak intensity of the pulse light emitted from the EOM160C is changed, there may be cases where the input light intensity of the fiber amplifiers $168_n$ and $171_n$ changes, and as a result, the peak power of the pulse light emitted from the fiber amplifiers $168_n$ and $171_n$ may also change. It is possible, to suppress the change in peak power by designing the fiber amplifiers $168_n$ and $171_n$ appropriately, however, this may reduce the light output efficiency and other performances of the fiber amplifiers.

So, in the embodiment, the input pulse peak intensity dependence of the output of fiber amplifiers is measured in advance. And based on this measurement, the third output intensity map, which is a map on intensity of light output from (each channel of) the light amplifying portion 161 corresponding to the peak intensity of the pulse light input to the light amplifying portion 161 (a conversion table of output pulse light intensity of the light amplifying portion 161, corresponding to the peak intensity of light emitted from the EOM) is made, and stored into the memory 51. The third output intensity map may be an ultraviolet intensity map, which serves as the wavelength conversion portion output.

And, when the light amount controller 16C performs the light amount control in the third function, the light amount control is performed based on the set light amount provided from the main controller 50 and the third output intensity map described above.

It is possible to arrange another EOM for transmittance control other than the EOM160C at the output side of the DFB semiconductor laser 160A. And the transmittance of the EOM can be changed by changing the voltage impressed to the EOM, so as to change the energy emitted from the light amplifying portion and wavelength conversion portion per unit time.

As can be seen from the description so far, in the second and third function of the light amount controller 16C, finer light amount control of the emitted light from the light source unit 16 is possible when compared with the first function. On the other hand, in the first function, the dynamic range can be set at a wider level, when compared with the second and third function.

Therefore, in the embodiment, on the exposure that will be described later on, rough adjustment of the exposure amount is to be performed according to the first function of the light amount controller 16C, and fine adjustment is to be performed using the second and third function. This will be referred to later in the description.

Other than the controls above, the light amount controller 16C also controls the start/stop of the pulse output in accordance with instructions from the main controller 50.

The polarization adjustment unit 16D controls the polarization properties of the optical components arranged prior to the optical fiber amplifier $171_n$, so as to perform circular polarization on the light emitted from the optical fiber amplifier $171_n$. In the case the doped fiber of the optical fiber amplifier $171_n$ has a structure almost cylindrically symmetric and is relatively short in length, circular polarization on the light emitted from the optical fiber amplifier $171_n$ can also be performed, by performing circular polarization on the light incident on the optical fiber amplifier $171_n$.

Components such as the relay light optical fiber (not shown in Figs.) are arranged as the optical components arranged prior to the optical fiber amplifier $171_n$. The relay light optical fiber optically connects each elements of the light amplifying portion 161, and as the method of controlling polarization properties of the relay light optical fiber and the like, for example, there is a way of applying anisotropic dynamic stress to the relay optical fiber. This method is used in the embodiment.

The relay optical fiber has a cylindrically symmetric refractive index distribution in general, however, in the case anisotropic dynamic stress is applied anisotropic stress is generated in the relay optical fiber, which creates an anisotropic refractive index distribution. By controlling the amount of the anisotropic refractive index distribution generated, the polarization properties of the relay light optical fiber can be controlled.

In addition, the variation amount of the refractive index distribution due to stress generated in the relay fiber and the polarization properties of other optical components depend on temperature. Therefore, the polarization adjustment unit 16D controls the circumferential temperature of the relay optical fiber and the like so that the temperature is constant, so that it is possible to maintain the circular polarization that has been performed.

The polarization properties of the relay optical fiber, or in other words, the refractive index distribution, can be controlled without the temperature control described above, by monitoring the polarized state of the light at a position further downstream of the relay optical fiber and performing control based on the monitored results.

Referring back to FIG. 1, the illumination optical system 12 comprises: a beam shaping optical system 18; a fly-eye lens system 22 serving as an optical integrator (a homogenizer); an illumination system aperture stop plate 24; a beam splitter 26; a first relay lens 28A; a second relay lens 28B; a fixed reticle blind 30A; a movable reticle blind 30B; a mirror M for deflecting the optical path; a condenser lens 32; and the like.

The beam shaping optical system 18 shapes the sectional shape of the light in the ultraviolet region (hereinafter referred to as "laser beam") LB generated by converting the wavelength of light emitted from the light source unit 16 at the wavelength conversion portion 163 so that it is efficiently incident on the fly-eye lens system 22, which is arranged downstream of the optical path of the laser beam LB. The beam shaping optical system 18, for example, is made up of a cylindrical lens or a beam expander (neither is shown in Figs.).

The fly-eye lens system 22 is arranged on the optical path of the laser beam LB emitted from the beam shaping optical system 18, and forms a planar light source, that is, a secondary light source, which consists of many light source images (point light sources), to illuminate the reticle R with a uniform illuminance distribution. The laser beam emitted from the secondary light source, is also referred to as "exposure light IL", in this description.

In the vicinity of the emitting surface of the fly-eye lens 22, the illumination system aperture stop plate 24, which is made of a plate-shaped member, is arranged. On the illumination system aperture stop plate 24, a plurality of aperture stops are arranged at substantially equal angular intervals. The aperture stops may have an ordinary circular aperture, or it may have a small circular-shaped aperture for reducing the σ-value, which is a coherence factor. It may also have a ring-shaped aperture for ring-shaped illumination, or a plurality of apertures (for example, four apertures) of which each central position differ from the optical axis position for modified illumination (in FIG. 1, only two of these aperture stops are shown). The illumination system aperture stop plate 24 is rotated by a driving unit 40 such as a motor, controlled by the main controller 50, and either aperture stop is selectively chosen to be set on the optical path of the exposure light IL in correspondence with the reticle pattern.

On the optical path of the exposure light IL outgoing from the illumination system aperture stop plate 24, the beam splitter 26, which has a large transmittance and a small reflectance, is arranged. And further downstream on the optical path, the relay optical system, structured of the first relay lens 28A and the second relay lens 28B is arranged, with the fixed reticle blind 30A and the movable reticle blind 30B arranged in between.

The fixed retile blind 30A is arranged on a surface slightly defocused from the conjugate plane relative to the pattern surface of the reticle R, and a rectangular opening is formed to set the illumination area 42R on the reticle R. In addition, close to the fixed retile blind 30A, the movable reticle blind 30B is arranged. The movable reticle blind 30B has an opening portion, which position and width is variable in the scanning direction, and by further restricting the illumination area 42R via the movable reticle blind 30B during the start and completion of the scanning exposure, exposure on unnecessary portions can be avoided.

On the optical path of the exposure light IL further downstream of the second relay lens 28B structuring the relay optical system, the deflection mirror M is arranged to reflect and bend the exposure light IL that has passed through the second relay lens 28 toward the reticle R, and on the optical path beyond the mirror M, the condenser lens 32 is arranged.

Furthermore, on either side of the optical path vertically bent at the beam splitter 26 within the illumination optical system 12, an integrator sensor 46 and a reflection light monitor 47 are respectively arranged. As the integrator sensor 46 and the reflection light monitor 47, a silicon PIN type photodiode is used, which is sensitive to light in the far ultraviolet region and the vacuum ultra violet region and also has high response frequency to detect the pulse emission of the light source unit 16. Or, it is possible to use a semiconductor photodetection element having a GaN crystal as the integrator sensor 46 and the reflection light monitor 47.

With the structure described above, the incident surface of the fly-eye lens system 22, the arrangement surface of the movable reticle blind 30B, and the pattern surface of the reticle R, are arranged optically conjugated with each other. And, the light source surface formed on the outgoing side of the fly-eye lens system 22 and the Fourier transform surface of the projection optical system PL (exit pupil surface) are arranged optically conjugated with each other, forming a Koehler illumination system.

The operation of the illumination optical system 12 having the structure described above will now be briefly described. The laser beam LB, pulse-emitted from the light source unit 16, is incident on the beam shaping optical system 18, and the sectional shape of the laser beam LB is shaped so that it is efficiently incident on the fly-eye lens system 22, which is arranged further downstream. The laser beam LB, is then incident on the fly-eye lens system 22, and the secondary light source is formed on the focal plane of the emitting side of the fly-eye lens system 22 (the pupil surface of the illumination optical system 12). The exposure light IL outgoing from the secondary light source, then passes through one of the aperture stops on the illumination system aperture stop plate 24, and reaches the beam splitter 26, which has a large transmittance and a small reflectance. The exposure light IL, which passes through the beam splitter 29 proceeds to the first relay lens 28A, and then passes through the rectangular opening of the fixed reticle blind 30A and the movable reticle blind 30B. After passing through the movable reticle blind 30B, the exposure light IL passes through the second relay lens 28B, and the optical path is then bent vertically downward by the mirror M. The exposure light IL, then passes through the condenser lens 32 and illuminates the rectangular illumination are 42A on the reticle R held on the reticle stage RST with a uniform illuminance distribution.

Meanwhile, the exposure light IL, which is reflected off the beam splitter 26, passes through the condenser lens 44 and is photo-detected by the integrator sensor 46. And the photoelectric conversion signal of the integrator sensor 46 is sent to the main controller 50 as the output DS (digit/pulse) via a peak hold circuit and an A/D converter (not shown in Figs.). The relative coefficient of the output DS of the integrator sensor 46 and the illuminance (exposure amount) of the exposure light IL on the surface of the wafer W is obtained in advance, and is stored in the memory 51 serving as a storage unit arranged with the main controller 50.

In addition, the exposure light, which is illuminated on the illumination area 42 on the reticle R and reflected off the pattern surface of the reticle (the lower surface in FIG. 1), proceeds backward in the opposite direction as before through the condenser lens 32 and the relay lens system, and is reflected off the beam splitter 26 and photo-detected by the reflection light monitor 47 via the condenser lens 48. In addition, in the case the Z tilt stage 58 is arranged below the projection optical system PL, the exposure light IL, which has passed through the pattern surface of the reticle, is reflected off the projection optical system PL and the surface of the wafer W (or the surface of the fiducial mark plate FM, which will be described later), and proceeds backward in the order of the projection optical system PL, the reticle R, the condenser lens 32, and the relay lens system, and is reflected off the beam splitter 26 to be photo-detected by the reflection light monitor 47 via the condenser lens 48. Also, although the surface of each optical element arranged in between the beam splitter 26 has a lens coating to prevent reflection, an extremely small amount of the exposure light IL is reflected on the surface, and the reflection light is also photo-detected by the reflection light monitor 47. The photo detection signals of the reflection monitor 47 are supplied to the main controller 50 via the peak hold circuit and the A/D converter (not shown in Figs.). The reflection monitor 47 is mainly used to measure the reflectance of the wafer W in the embodiment. The reflection monitor 47 may also be used to measure the transmittance of the reticle R in advance.

As the fly-eye lens system, for example, a double fly-eye lens system, which details are disclosed in, Japanese Patent Laid Open No. 01-235289 and in the corresponding U.S. Pat. No. 5,307,207, and in Japanese Patent Laid Open No. 07-142354 and in the corresponding U.S. Pat. No. 5,534,970, may be employed to structure a Koehler illumination system. As long as the national laws in designated states or elected states, to which this international application is applied, permit, the disclosures cited above are fully incorporated herein by reference.

In addition, a diffractive optical element may be used with the fly-eye lens system 22. In the case of using such a diffractive optical element, the light source unit 16 and the illumination optical system 12 may be connected with the diffractive optical element arranged in between.

That is, in correspondence with each fiber of the bundle-fiber, the diffractive optical element on which the diffractive element is formed can be arranged in the beam shaping optical system 18, and the laser beam emitted from each fiber can be diffracted so that the beams are superimposed on the incident surface of the fly-eye lens system 22. In the embodiment, the output end of the bundle-fiber may be arranged on the pupil surface of the illumination optical system. In this case, however, the intensity distribution (in other words, the shape and size of the secondary light source) on the pupil surface varies due to the first function (partial on/off to reduce total output), and may not be the most suitable shape and size for the reticle pattern. Thus, it is preferable to use the diffractive optical element and the like described earlier, to superimpose the laser beam from each fiber on the pupil surface of the illumination optical system or on the incident surface of the optical integrator.

In any case, in the embodiment, even if the distribution of the portion that emits light from the bundle-fiber 173 varies, uniform illuminance distribution on both the pattern surface (object surface) of the reticle R and the surface (image plane) of the wafer W can be sufficiently secured due to the first function of the light amount controller 16C, referred to earlier.

The reticle R is mounted on the reticle stage RST, and is held on the stage by vacuum chucking (not shown in Figs.). The reticle stage RST is finely drivable within a horizontal surface (XY plane), as well as scanned in the scanning direction (in this case, the Y direction, being the landscape direction in FIG. 1) within a predetermined stroke range by the reticle stage driving portion 49. The position and rotational amount of the reticle stage RST during scanning, is measured via the fixed movable mirror 52R by the laser interferometer 54R arranged externally, and the measurement values of the laser interferometer 54R is supplied to the main controller 50.

The material used for the reticle R depends on the wavelength of the exposure light IL. That is, in the case of using exposure light with the wavelength of 193 nm, synthetic quartz can be used. In the case of using exposure light with the wavelength of 157 nm, however, the reticle R needs to be made of fluorite, fluorine-doped synthetic quartz, or crystal.

The projection optical system PL is, for example, a double telecentric reduction system, and is made up of a plurality of lens elements 70a, 70b, . . . , which have a common optical axis in the Z-axis direction. In addition, as the projection optical system PL, a projection optical system having a projection magnification β of, for example, ¼, ⅕, or ⅙, is used. Therefore, when the illumination area 42R on the reticle R is illuminated with the exposure light IL as is described earlier, the pattern formed on the reticle R is projected and transferred as a reduced image by the projection magnification β with the projection optical system PL on the slit-shaped exposure area 42W on the wafer W, which surface is coated with the resist (photosensitive agent).

In the embodiment, of the lens elements referred to above, a plurality of lens elements are respectively capable of moving independently. For example, the lens element 70a arranged topmost and closest to the reticle stage RST is held by a ring-shaped supporting member 72, and this ring-shaped supporting member 72 is supported at three points by expandable driving elements such as piezo elements 74a, 74b, and 74c (74c in depth of the drawing is not shown in FIG. 1), and is also connected to the barrel portion 76. The three points on the periphery of the lens element 70a is movable independently in the optical axis direction AX of the projection optical system PL by the driving elements 74a, 74b, and 74c. That is, translation operation of the lens element 70a can be performed along the optical axis AX in accordance with the deviation amount of the driving elements 74a, 74b, and 74c, as well as tilt operation of the lens element 70a in respect to the plane perpendicular to the optical axis AX. And the voltage provided to the driving elements 74a, 74b, and 74c is controlled by the image forming characteristics correction controller 78 based on instructions from the main controller 50, and thus the deviation amount of the driving elements 74a, 74b, and 74c is controlled. Also, in FIG. 1, the optical axis AX of the projection optical system PL refers to the optical axis of the lens element 70b and the other lens elements (omitted in FIG. 1) fixed to the barrel portion 76.

In addition, in the embodiment, the relation between the vertical movement amount of the lens element 70a and the variation in magnification (or in distortion) is obtained in advance by experiment. The relation, for example, is stored in the memory 51, and the magnification (or distortion) correction is performed by calculating the vertical movement amount of the lens element 70a from the magnification (or distortion) corrected by the main controller 50 on correction, and by providing instructions to the image forming characteristics correction controller 78 to drive the driving elements 74a, 74b, and 74c to correct the magnification (or distortion). That is, in the embodiment, the image forming characteristics correction controller 78, the driving elements 74a, 74b, and 74c, and the main controller 50 make up the image forming characteristics correction unit, which corrects the image forming characteristics of the projection optical system PL.

Further, optical calculation values can be used in the relation between the vertical movement amount of the lens element 70a and the variation in magnification. In this case, the experimental process to obtain the relation between the vertical movement amount of the lens element 70a and the variation in magnification can be omitted.

As is described earlier, the lens element 70a closest to the reticle R is movable. The lens element 70a is selected, because the influence on the magnification and distortion characteristics is greater compared with the other lens elements, however, any lens element may be arranged movable alternately of the lens element 70a to adjust the interval between lenses, if identical conditions can be satisfied.

Also, by moving at least one optical element besides the lens element 70a, other optical properties such as the field curvature, astigmatism, coma, and spherical aberration can be adjusted. Moreover, a sealed chamber may be arranged in between specific lens elements near the center in the optical axis direction of the projection optical system PL, and an image forming characteristics correction mechanism to adjust the magnification of the projection optical system PL can be arranged by adjusting the pressure of the gas inside the sealed chamber with a pressure adjustment mechanism such as a bellows pump. Or, alternately, for example, an aspherical lens may be used as a part of the lens element structuring the projection optical system PL, and the aspherical lens may be rotated. In this case, correction of the so-called rhombic distortion becomes possible. Or, the image forming characteristics correction mechanism may have the structure of a plane-parallel plate arranged within the projection optical system PL, which can be tilted and rotated.

Furthermore, in the case of using the laser beam with the wavelength of 193 m as the exposure light IL, materials such as synthetic quartz and fluorite can be used for each lens element (and the plane-parallel plate) structuring the projection optical system PL. In the case of using the laser beam with the wavelength of 157 nm, however, only fluorite is used as the material for the lenses and the like.

In addition, in the embodiment, an atmospheric sensor 77 is arranged to measure the atmospheric pressure in the chamber 11. The measurement values of the atmospheric sensor 77 is sent to the main controller 50, and the main controller 50 calculates the change in pressure from the standard atmospheric pressure as well as calculate the atmospheric change of image forming characteristics in the projection optical system PL, based on the measurement values of the atmospheric sensor 77. And, the main controller 50 gives instructions to the image forming characteristics correction controller 78 in consideration of this atmospheric variation, and corrects the image forming characteristics of the projection optical system PL.

The change of oscillation wavelength referred to above, is achieved easily, by the laser controller 16B positively controlling the temperature of the etalon element making up the beam monitor mechanism 164 to change the set wavelength (target wavelength), which coincides with the resonance wavelength (detection reference wavelength) maximizing the transmittance of the etalon element, and also by feedback control of the temperature of the DFB semiconductor laser 160A to make the oscillation wavelength of the DFB semiconductor laser 160A coincide with the changed set wavelength, based on instructions from the main controller 50.

Since the calculation method of the atmospheric pressure variation, the illumination variation, and the like performed by the main controller 50 is disclosed in detail, for example, in Japanese Patent Laid Open No. 09-213619 and is well acknowledged, a detailed description will therefore be omitted.

The XY stage 14 is driven two-dimensionally, in the Y direction, which is the scanning direction, and in the X direction, which is perpendicular to the Y direction (the direction perpendicular to the page surface of FIG. 1), by the wafer stage driving portion 56. The Z tilt stage 58 is mounted on the XY stage 14, and on the Z tilt stage 58, the wafer W is held via a wafer holder (not shown in Figs.) by vacuum chucking and the like. The Z tilt stage 58 has the function of adjusting the position of the wafer W in the Z direction by for example, three actuators (piezo elements or voice coil motors), and also the function of adjusting the tilting angle of the wafer W in respect to the XY plane (image plane of the projection optical system PL). In addition, the position of the XY stage 14 is measured via the movable mirror 52W fixed on the Z tilt stage 58 by the laser interferometer 54W, which is externally arranged, and the measurement values of the laser interferometer 54W is sent to the main controller 50.

As the movable mirror, in actual, an X movable mirror that has a reflection plane perpendicular to the X-axis and a Y movable mirror that has a reflection plane perpendicular to the Y-axis are arranged, and in correspondence with these mirrors, interferometers for an X-axis position measurement, Y-axis position measurement, and rotation (including yawing amount, pitching amount, and rolling amount) measurement are respectively arranged. In FIG. 1, however, these are representatively shown as the movable mirror 52W and the laser interferometer 54W.

In addition, on the Z tilt stage 58 close to the wafer W, an irradiation amount monitor 59, which has a photo-detecting surface arranged at the same height as that of the exposure surface on the wafer W, is arranged to detect the light amount of the exposure light IL that has passed through the projection optical system PL. The irradiation amount monitor 59 has a housing that is one size larger than the exposure area 42W, extends in the X direction, and is rectangular in a planar view. And in the center portion of this housing, an opening is formed, which has a slit-shape almost identical to the exposure area 42A. This opening is actually made by removing a portion of a light shielding film formed on the upper surface of the photo-detection glass made of materials such as synthetic quartz, which forms the ceiling surface of the housing. And, immediately below the opening via the lens, an optical sensor having a photodetection element such as the silicon PIN type photodiode is arranged.

The irradiation amount monitor 59 is used to measure the intensity of the exposure light IL irradiated on the exposure area 42W. The light amount signals according to the amount of light received by the photodetection element structuring the irradiation amount monitor 59 is sent to the main controller 50.

The optical sensor does not necessarily have to be arranged within the Z tilt stage 58, and it is a matter of course that the optical sensor may be arranged exterior to the Z tilt stage 58. In this case, the illumination beam relayed by the relay optical system may be guided to the optical sensor via an optical fiber.

On the Z tilt stage 58, the fiducial mark plate FM used when performing operations such as reticle alignment, which will be described later, is arranged. The fiducial mark plate FM is arranged so that the height of the surface is almost the same as that of the surface of the wafer W. On the surface of the fiducial mark plate FM, fiducial marks for reticle alignment, baseline measurement, and the like, are formed.

Also, it is omitted in FIG. 1 to avoid complication in the drawing, in actual, the exposure apparatus 10 comprises a reticle alignment system to perform reticle alignment.

When alignment is performed on the reticle R, first of all, the main controller 50 drives the reticle stage RST and the XY stage 14 via the reticle stage driving portion 49 and the wafer stage driving portion 56 so that the fiducial mark for reticle alignment on the fiducial mark plate is set within the exposure area 42W having a rectangular shape and the positional relationship between the reticle R and the Z tilt stage 58 is set so that the reticle mark image on the reticle R almost overlaps the fiducial mark. In this state, the main controller 50 picks up the image of both marks using the reticle alignment system, processes the pick-up signals, and calculates the positional shift amount of the projected image of the reticle mark in respect to the corresponding fiducial mark in the X direction and the Y direction.

In addition, it is also possible to obtain the focus offset and leveling offset (the focal position of the projection optical system PL, image plane tilt, and the like) based on information on contrast, which is included in the detection signals (picture signals) of the projected image of the fiducial marks obtained as a consequence of the reticle alignment described above.

Also, in the embodiment, when the reticle alignment is performed, the main controller 50 also performs baseline measurement of the off-axis alignment sensor on the wafer side (not shown in Figs.) arranged on the side surface of the projection optical system PL. That is, on the fiducial mark plate FM, fiducial marks for baseline measurement that are arranged in a predetermined positional relationship in respect to the fiducial marks for reticle alignment are formed. And when the positional shift amount of the reticle mark is measured via the reticle alignment system, the baseline amount of the alignment sensor, in other words, the positional relationship between the reticle projection position and the alignment sensor, is measured by measuring the positional shift of the fiducial marks for baseline measurement in respect to the detection center of the alignment sensor via the alignment sensor on the wafer side.

Furthermore, as is shown in FIG. 1, with the exposure apparatus 10 in the embodiment, it has a light source which on/off is controlled by the main controller 50, and a multiple focal position detection system (a focus sensor) based on the oblique incident method is arranged, consisting of an irradiation optical system 60a which irradiates light from an incident direction in respect to the optical axis AX to form multiple pinhole or slit images toward the image forming plane of the projection optical system PL, and of an photo-detection optical system 60b which photo-detects the light reflected off the surface of the wafer W. By controlling the tilt of the plane-parallel plate arranged within the photodetection optical system 60b (not shown in Figs.) in respect to the optical axis of the reflected light, the main controller 50 provides an offset corresponding to the focal change of the projection optical system PL to the focal detection system (60a, 60b) and performs calibration. With this operation, the image plane of the projection optical system PL within the exposure area 42 coincides with the surface of the wafer W within the range (width) of the depth of focus. Details on the structure of the multiple focal position detection system (a focus sensor) similar to the one used in the embodiment, are disclosed in, for example, Japanese Patent Laid Open No.

06-283403, and in the corresponding U.S. Pat. No. 5,448, 332. As long as the national laws in designated states or elected states, to which this international application is applied, permit, the disclosures cited above are fully incorporated herein by reference.

The main controller 50 performs automatic focusing and automatic leveling by controlling the Z position of the Z tilt stage 58 via the driving system (not shown in Figs.) so that the defocus becomes zero, based on the defocus signals such as the S-curve signals from the photodetection optical system 60b.

The reasons for arranging the plane-parallel plate within the photodetection optical system 60b to provide an offset to the focal detection system (60a, 60b) are, for example, because when the lens element 70a is vertically moved for magnification correction the focus also changes, and because the position of the image forming plane changes with the change in the image forming characteristics of the projection optical system due to the absorption of the exposure light IL. In such cases, an offset is provided to the focal detection system since it is necessary to make the focusing position of the focal detection system coincide with the position of the image forming plane of the projection optical system. Therefore, in the embodiment, the relationship between the vertical movement of the lens element 70a and the focus variation is also obtained in advance by experiment, and is for example, stored in the memory 51. Calculated values may be used for the relationship between the vertical movement of the lens element 70a and the focus variation. And, as for the automatic leveling, it may be performed in the non-scanning direction, which is perpendicular to the scanning direction, without being performed in the scanning direction.

The main controller 50 is structured including a so-called microcomputer (or workstation) made up of components such as a CPU (chief processing unit), a ROM (Read Only Memory), a RAM (Random Access Memory), and the like. Other than performing various controls described so far, the main controller 50 controls, for example, the synchronous scanning of the reticle R and the wafer W, the stepping operation of the wafer W, the exposure timing, and the like so that the exposure operation is performed accurately. In addition, in the embodiment, the main controller 50 has control over the whole apparatus, besides controls such as controlling the exposure amount on scanning exposure as will be described later, and calculating the variation amount of the image forming characteristics of the projection optical system PL and adjusting the image forming characteristics of the projection optical system PL based on the calculation via the image forming characteristics correction controller 78.

To be more precise, for example, on scanning exposure, the main controller 50 respectively controls the position and velocity of the reticle stage RST and the XY stage 14 via the reticle stage driving portion 49 and the wafer stage driving portion 56 so that the wafer W is scanned via the XY stage 14 at the velocity $V_W = \beta \cdot V$ ($\beta$ is the projection magnification from the reticle R to the wafer W) in the −Y direction (or +Y direction) in respect to the exposure area 42W, in synchronous with the reticle R scanned via the reticle stage RST at the velocity $V_R = V$ in the +Y direction (or −Y direction), based on the measurement values of the laser interferometers 54R and 54W. Also, when performing stepping operations, the main controller 50 controls the position of the XY stage 14 via the wafer stage driving portion 56, based on the measurement values of the laser interferometer 54W.

The exposure sequence of the exposure apparatus 10 in the embodiment will be described next, when exposure on predetermined slices (N slices) of wafers W is performed to transfer the reticle pattern onto the wafer W, while mainly referring to the controls performed by the main controller 50.

The premise is as follows:

① A shot map data (data deciding the exposure sequence of each shot area and the scanning direction) is made and stored in the memory 51 (refer to FIG. 1), based on necessary information such as the shot arrangement, size of shot, and exposure sequence of each shot, which are input by the operator through an input/output device 62 (refer to FIG. 1) such as a console.

② In addition, the output of the integrator sensor 46 is calibrated in advance in respect to the reference illuminometer that is arranged on the Z tilt stage 58 at the same height as of the image plane (that is, the surface of the wafer W). The calibration of the integrator sensor 46, in this case, means to obtain the conversion coefficient (or conversion function) to convert the output of the integrator sensor 46 to the exposure amount on the image plane. By using this conversion coefficient, measuring the exposure amount (energy) indirectly provided on the image plane by the output of the integrator sensor 46 becomes possible.

③ In addition, the output of: the energy monitor within the beam monitor mechanism 164; the photoconversion elements 180, 181 of the light amplifying portion 161; and the photoconversion element 182 of the wavelength conversion portion 163, and the like is calibrated in respect to the output of the integrator sensor 46 that has already been calibrated. The relative coefficient of the output of the respective sensors in respect to the output of the integrator sensor 46 are also obtained in advance, and stored in the memory 51.

④ Furthermore, in respect to the output of the integrator sensor 46 which has completed calibration, the output of the reflection light monitor 47 is calibrated. The relative coefficient of the output of the reflection light monitor 47 in respect to the output of the integrator sensor 46 is obtained in advance, and stored in the memory 51.

First of all, the operator inputs the exposure conditions including the illumination conditions (the numerical aperture of the projection optical system, the shape of the secondary light source (the type of aperture stop 24), the coherence factor σ and the type of reticle pattern (such as contact hole, line and space), the type of reticle (such as phase contrast reticle, half-tone reticle), and the minimum line width or the exposure amount permissible error) from the input/output device 62 (refer to FIG. 1) such as the console. According to the input, the main controller 50 sets the aperture stop (not shown in Figs.) of the projection optical system PL, selects and sets the aperture stop of the illumination system aperture stop plate 24, and sets the target exposure amount (which corresponds to the set light amount) in accordance with the resist sensitivity, and the like. While these are being performed, at the same time, the main controller 50 selects the channels to be turned on/off at the bundle-fiber 173 output so that the light amount emitted from the light source 16 in order to obtain the target exposure amount almost coincides with the set light amount, and gives instructions to the light amount controller 16C to select the specific channels. With this operation, on scanning exposure, which will be described later, the light amount controller 16C performs the on/off operation of the fiber amplifier 171$_n$ of each channel almost simultaneously with the emission of the laser light source 160A, based on the first function in accordance with the selection instructions. Thus, rough adjustment of the exposure amount is performed.

Next, the main controller 50 loads the reticle R subject to exposure on the reticle stage RST, using the reticle loader (not shown in Figs.).

Then, the reticle alignment described earlier is performed, using the reticle alignment system, as well as the baseline measurement.

And then, the main controller 50 instructs the wafer carriage system (not shown in Figs.) to exchange the wafer W. By the instructions, the wafer is exchanged (or simply loaded when there are no wafers on the stage) by the wafer carriage system and the wafer delivery mechanism (not shown in Figs.) on the XY stage 14. When this is completed, a series of operations in the alignment process are performed, such as the so-called search alignment which details are disclosed in Japanese Patent Laid Open No. 09-186061, Japanese Patent Laid Open No. 09-36202, and in the corresponding U.S. application Ser. No. 08/678788, and fine alignment (such as Enhanced Global Alignment (EGA), which is a process to obtain the arrangement coordinates of all the shot areas on the wafer W by a statistical method utilizing the least-squares method disclosed in, for example, Japanese Patent Laid Open No. 61-44429, and in the corresponding U.S. Pat. No. 4,780,617 and the like). The wafer exchange and the wafer alignment are performed likewise, as is performed with the well-acknowledged exposure apparatus. As long as the national laws in designated states or elected states, to which this international application is applied, permit, the disclosures cited above are fully incorporated herein by reference.

Next, the reticle pattern is transferred onto a plurality of shot areas on the wafer W based on the step-and-scan method by repeatedly performing the operation of moving the wafer W to the starting position for scanning to expose each shot area on the wafer W and the scanning exposure operation. During this scanning exposure, since the main controller 50 provides the target exposure amount to the wafer W, which is decided in accordance with exposure conditions and the resist sensitivity, the main controller 50 gives instructions to the light amount controller 16C while monitoring the output of the integrator sensor 46. And according to the instructions, in addition to the rough adjustment of the exposure amount based on the first function, the light amount controller 16C controls the frequency and the peak power of the laser beam (pulse ultraviolet light) from the light source 16 based on the second and third functions, thus performs fine adjustment of the exposure amount.

In addition, the main controller 50 controls the illumination system aperture stop plate 24 via the driving unit 40, and furthermore, controls the opening/closing of the movable reticle blind 30B in synchronous with the operation information of the stage system.

When exposure on the first wafer W is completed, the main controller 50 instructs the wafer carriage system (not shown in Figs.) to exchange the wafer W. Wafer exchange is thus performed, by the wafer carriage system and the wafer delivery mechanism (not shown in Figs.) on the XY stage 14, and after the wafer exchange is completed, search alignment and fine alignment is performed likewise as is described above to the wafer that has been exchanged. In addition, in this case, the main controller 50 calculates the irradiation change of the image forming characteristics (including the change in focus) of the projection optical system PL from the start of exposure on the first wafer W, based on the measurement values of the integrator sensor 46 and the reflection light monitor 47. The main controller 50 then provides instruction values to the image forming characteristics correction controller 78 to correct the irradiation change, as well as provide an offset to the photodetection optical system 60b. Also, the main controller 50 calculates the atmospheric change of the image forming characteristics of the projection optical system PL based on the measurement values of the atmospheric sensor 77, and provides instruction values to the image forming characteristics correction controller 78 to correct the irradiation change, as well as provide an offset to the photodetection optical system 60b.

And, in the manner described earlier, the reticle pattern is transferred onto the plurality of shot areas on the wafer W based on the step-and-scan method. When exposure on the second wafer is completed, hereinafter, the wafer exchange and exposure based on the step-and-scan method is repeatedly performed in sequence, likewise as above.

When exposure is performed on the wafer W, on N slices of wafers, the main controller 50 performs feedback control via the laser controller 16B based on the monitoring results of the beam monitor mechanism 164, in order to stably maintain the oscillation wavelength of the laser light source 160A at the set wavelength. Therefore, generation or change in aberration (image forming characteristics) of the projection optical system PL due to the change in wavelength is prevented, and the image characteristics (optical properties such as image quality) do not change during the transfer of the pattern.

Meanwhile, instead of driving the driving elements 74a, 74b, and 74c to correct the environmental change including the atmospheric change of the projection optical system PL referred to above by providing instructions to the image forming characteristics correction controller 78, the main controller 50 may obtain the change in pressure, temperature, and humidity from the standard state based on the measurement values of the environmental sensor 77 at every predetermined timing since exposure on the first wafer has started, and calculate the amount of wavelength change to almost cancel out the environmental change of the image forming characteristics of the projection optical system PL due to the change in pressure, temperature, and humidity. And, according to the amount of wavelength change calculated, the main controller 50 may positively change the oscillation wavelength of the laser light source 160A. The environmental sensor 77 may be a sensor to detect the atmosphere.

Such change in the oscillation wavelength, can be easily performed by the laser controller 16B positively controlling the temperature of the etalton element structuring the beam monitor mechanism 164 based on instructions from the main controller 50 and changing the set wavelength (target wavelength) that coincides with the resonance wavelength (detection reference wavelength) maximizing the transmittance of the etalon element, as well as by performing feedback control on the temperature of the DFB semiconductor laser 160A so that the oscillation wavelength of the DFB semiconductor laser 160A coincides with the set wavelength that has been changed.

In this manner, the change in aberration, projection magnification, and image characteristics such as the focal position in the projection optical apparatus PL due to the change in atmosphere, temperature, humidity and the like can be cancelled out at the same time while the exposure apparatus 10 is operating. That is, by changing of the oscillation wavelength of the DFB semiconductor laser 160A, a state can be created as if there were no environmental change from the standard state (that is, a state where the variation amount in optical performance is cancelled out).

Such wavelength change, or to be more concrete, change in set wavelength and the stabilizing control of the oscillation wavelength of the laser light source 160A having the changed set wavelength as the reference, are performed in the following cases.

For example, when focusing on the atmosphere, normally, the standard atmosphere is often set at the average atmosphere of the delivery place (such as factories) where the exposure apparatus is arranged. Accordingly, when there is an altitude difference between the places where the exposure apparatus is built and where the exposure apparatus will be arranged (delivered), for example, adjustment of the projection optical system and the like are performed at the place where the exposure apparatus is built by shifting the exposure wavelength by only the amount corresponding to the altitude difference as if the projection optical system were arranged under the standard atmospheric pressure (average atmospheric pressure), and adjusting the wavelength back to the exposure wavelength at the place where the exposure apparatus will be arranged. Or the adjustment of the projection optical system is performed at the place where the exposure apparatus is built with the exposure wavelength, and the exposure wavelength is shifted at the place where the exposure apparatus will be arranged so as to cancel out the altitude difference. The same can be said for other environmental conditions, that is, also for temperature, humidity, and the like. With these operations, the change in image forming characteristics (such as aberration) of the projection optical system PL due to the altitude difference, pressure difference, and furthermore, the environmental difference (the atmosphere within the clean room) between the building place and the delivery place of the exposure apparatus can be cancelled out, and it becomes possible to reduce the start-up time required at the delivery place. Furthermore, the change in aberration, projection magnification, and focal position in the projection optical system PL due to the atmospheric pressure change during the operation of the exposure apparatus can be cancelled out, and it becomes possible to transfer the pattern image onto the substrate in the best image forming state at all times.

As can be seen, the embodiment uses the fact that changing the wavelength of the illumination light with the projection optical system and changing the set environment (the pressure, temperature, humidity and the like of the surrounding gas) of the projection optical system is substantially equivalent. When the refraction element of the projection optical system is made of a single material, then the equivalence is complete, and in the case a plurality of materials are used, the equivalence is almost complete. Accordingly, by using the variation characteristics of the refractive index of the projection optical system (especially the refraction element) in respect to the set environment and changing only the wavelength of the illumination light, an equivalent state of when the set environment of the projection optical system has been changed can be substantially created.

The standard atmospheric pressure may be arbitrary, however, for example, it is preferable for it to be the reference atmospheric pressure when adjustment of the projection optical system and the like are performed to optimize the optical properties. In this case, at the standard atmospheric pressure, the variation amount of the optical properties of the projection optical system and the like is null.

In addition, when the projection optical system PL is to be arranged in an atmosphere other than air, the atmospheric pressure is the pressure of the surrounding atmosphere (gas) of the projection optical system PL. That is, in this description, atmospheric pressure is used in a broader sense than the usual sense meaning the pressure of atmosphere (air), and includes the pressure of the surrounding atmosphere (gas).

In the case the environmental change in the image forming characteristics of the projection optical system PL cannot be cancelled out by changing the wavelength in the manner described above, each time the set wavelength is changed the main controller 50 corrects the image forming characteristics change excluding the environmental change of the projection optical system PL that is corrected by changing the set wavelength, by driving the driving elements 74a, 74b, and 74c via the image forming characteristics correction controller 78. With this operation, a large part of the environmental change in the image forming characteristics of the projection optical system PL is corrected by the change in set wavelength described above, and the remaining environmental change, irradiation change, and the like of the projection optical system PL is corrected by driving the driving elements 74a, 74b, and 74c with the image forming characteristics correction controller 78. As a consequence, exposure with high precision is performed in a state where the image forming characteristics of the projection optical system PL is almost completely corrected.

Furthermore, in between the change in set wavelength described earlier, the main controller 50 may correct the image forming characteristics change with consideration of the environmental change. The change in set wavelength is performed at the predetermined timing described previously, however, when the interval between the change in set wavelength is long, the pressure, temperature, humidity, and the like changes during the interval. In such a case, however, the change in image forming characteristics of the projection optical system due to these changes can be corrected with the arrangement above.

The predetermined timing, here, may be each time when exposure on the wafer W has been completed in predetermined slices, or may be each time when exposure on each shot area on the wafer W has been completed. The predetermined slices may be one slice of wafer, or it may be the slices of wafers equivalent to one lot.

Or, the predetermined timing may be each time when the exposure conditions are changed. In addition, when the exposure conditions are changed, other than the change in illumination conditions, this change includes all the cases when conditions such as reticle exchange, which are related to exposure in a broad sense, are changed. For example, if the wavelength is changed in parallel with the reticle exchange during the so-called double exposure and the illumination system aperture stop change, reduction in throughput can be prevented since hardly any time is wasted.

Or, the predetermined timing may be the time when the change in physical quantity such as the atmospheric pressure obtained based on the measurement values of the environmental sensor 77 exceeds a predetermined amount. Or, the predetermined timing may be almost realtime, corresponding to the interval calculating the optical performance of the projection optical system (for example, several µs). Or, the predetermined timing may be every predetermined timing set in advance.

Furthermore, it is possible to cope with the correction including the correction of the irradiation change by changing the wavelength of the laser beam. In this case, it is preferable to make an irradiation change model of a plurality of typical wavelengths respectively, by experiment or by simulation. If the changed wavelength is in between the wavelengths of the irradiation change model, for example, the image forming characteristics or the variation amount is preferably obtained by interpolation calculation.

In addition, the sensitivity properties of the resist (photosensitive agent) coated on the wafer W may change due to the wavelength shift. In this case, the main controller 50 preferably controls the exposure amount by changing the exposure parameter, which will be described later, according to the change in the sensitivity properties, that is changing at least either the scanning velocity, the width of the illumination area, the intensity of the illumination light, or the oscillation frequency. It is preferable to obtain the sensitivity properties of the resist corresponding to the plurality of typical wavelengths by experiment or by simulation, moreover, in the case the changed wavelength is in between the wavelengths of the obtained sensitive properties, for example, the sensitive properties of the wavelength is preferably obtained by interpolation calculation.

The rough adjustment of the exposure amount (light amount) described earlier may be precisely controlled in the accuracy of 1% and under to the exposure amount set value, by performing test emission prior to the actual exposure.

The dynamic range of the rough adjustment of the exposure amount in the embodiment can be set within the range of $1-\frac{1}{128}$. The dynamic range normally required, however, is around $1-\frac{1}{7}$ in typical, therefore, the number of channels (the number of optical fibers) which light output should be turned on may be controlled in between 128–18. In this manner, in the embodiment, rough adjustment of the exposure amount in line with the difference of the resist sensitivity and the like of each wafer can be accurately performed by the exposure amount control individually turning on/off the light output of each channel.

Accordingly, with the embodiment, the rough energy adjuster such as the ND filter used in the conventional excimer laser exposure apparatus is not necessary.

In addition, since the light amount control based on the second and third function by the light amount controller 16C has the features of quick control velocity and high control accuracy, it is possible to satisfy the following control requirements required in the current exposure apparatus without fail.

That is, the light amount control satisfies all of: the dynamic range being around ±10% of the set exposure amount, which is a requirement for exposure amount control correcting the process variation of each shot area (chip) on the same wafer caused due to uneven resist film thickness within the same wafer; controlling the light amount to the set value within around 100 ms, which is the stepping time in between shots; control accuracy of around ±1% of the set exposure amount; setting the light amount to ±0.2% of the set exposure amount within 20 msec, which is the typical exposure time for one shot area as the exposure accuracy, being a requirement for exposure control to achieve line width uniformity within a shot area; and the control velocity of around 1 ms.

Accordingly, for light amount control, the light amount controller 16C only has to perform light amount control based on at least either the second function or the third function.

In addition, with the scanning exposure apparatus that has a laser light source (pulse light source) as in the exposure apparatus 10 of the embodiment, when the scanning velocity of the wafer W is $V_W$, the width of the slit shaped exposure area 42W on the wafer W in the scanning direction (slit width) is D, and the pulse repetition frequency of the laser light source is F, the distance in which the wafer W moves in between pulse emission is $V_W/F$, thus the number of pulse (the number of exposure pulse) N of the exposure light IL to be irradiated at one point on the wafer W is expressed as in the following equation (3).

$$N=D/(V_W/F) \qquad (3)$$

When the pulse energy is expressed as P, the energy that is to be provided at one point on the wafer W for a unit time is expressed as in the following equation (4).

$$E=NP=PD/(V_W/F) \qquad (4)$$

Accordingly, with the scanning exposure apparatus, exposure amount control is possible by controlling either the slit width D, the scanning velocity $V_W$, the pulse repetition frequency F of the laser light source, or the pulse energy P. Due to the problem of response velocity, since it is difficult to adjust the slit width D during scanning exposure, either the scanning velocity $V_W$, the pulse repetition frequency F of the laser light source, or the pulse energy P maybe adjusted.

Therefore, with the exposure apparatus 10 in the embodiment, as a matter of course, the exposure amount control can be performed by combining the light amount control based on either the second or third function by the light amount controller 16C and the scanning velocity.

For example, in the case the exposure conditions of the wafer W is changed in accordance with the reticle pattern to be transferred onto the wafer W, such as changing the intensity distribution of the illumination light (that is, the shape and size of the secondary light source) on the pupil surface of the illumination optical system, or inserting/removing the optical filter which shields the circular area having the optical axis as its center around the pupil surface of the projection optical system PL. The illuminance on the wafer W changes by these changes in exposure conditions, however, the illuminance on the wafer W also changes with the change in the reticle pattern. This is due to the difference in the occupied area by the shielding area (or the transmitting area) of the pattern. Therefore, when the illuminance changes due to the change of at least either the exposure conditions or the reticle pattern, it is preferable to control at least either the frequency or the peak power referred to above so as to provide the suitable exposure amount to the wafer (resist). On this control, in addition to adjusting at least either the frequency or the peak power, the scanning velocity of the reticle and the wafer may also be adjusted.

As is obvious from the description so far, in the embodiment, the main controller 50 plays the part of the first controller, the second controller, and the third controller. These controllers can, of course, be structured separately with different controllers.

The light amount controller 16C of the embodiment, has the functions of light amount control by individually performing on/off operation on the light output from the optical path (the first function), light amount control by controlling the frequency of the pulse light emitted from the EOM160C (the second function), and light amount control by controlling the peak power of the pulse light emitted from the EOM160C (the third function) as is previously described. Therefore, in addition to the sequential light amount control by individually performing on/off operation on the light output from the optical path 172$_n$ based on the first function and at least either the second or third function, fine adjustment of the light amount at each stage becomes possible by controlling at least either the frequency or the peak power of the pulse light emitted from the EOM160C. As a consequence, continuous control of the light amount becomes possible, and if the set light amount is within a predetermined range the light amount of the output light can be made to coincide with the set light amount, whatever value the set light amount may be.

In addition, since the light amount controller 16C can further control the peak power in addition to the frequency of the pulse light emitted from the EOM160C by the second function and the third function, light amount control with high precision is possible even in the case when there is a change in the peak power of the pulse light.

However, the present invention is not limited to this, and the light amount controller structuring the light source unit related to the present invention may only have at least one of the first to third functions described above.

With the exposure apparatus 10 related to the embodiment, the main controller 50 performs the absolute wavelength calibration previously described and the set wavelength calibration that follows the absolute wavelength calibration prior to exposure. And during exposure, the main controller 50 feedback controls the temperature and current of the laser light source 160A via the laser controller 16B, based on the monitoring results of the beam monitor mechanism which set wavelength calibration has been completed. That is, the main controller 50 transfers the pattern of the reticle R onto the wafer W via the projection optical system PL by irradiating the laser beam on the reticle R, while performing wavelength stabilizing control to maintain the center wavelength of the laser beam to the predetermined set wavelength without fail, based on the monitoring results of the beam monitor mechanism 146 that has completed the set wavelength calibration. Thus, exposure with high precision, which is hardly influenced by the temperature change and the like of the atmosphere, becomes possible.

In addition, with the exposure apparatus 10, at each predetermined timing after the exposure on the wafer W begins, the main controller 50 calculates the amount of wavelength change to almost cancel out the change in image forming characteristics of the projection optical system PL caused by the change in environment (pressure, temperature, humidity, and the like) from the standard state, based on the measurement values of the environmental sensor 77, and changes the set wavelength in accordance with the amount of wavelength change calculated. As a result, various aberrations of the projection optical system PL is simultaneously corrected, and the main controller 50 irradiates the laser beam on the reticle R and performs exposure, that is, transfers the reticle pattern onto the wafer W via the projection optical system PL, while performing wavelength stabilizing control using the beam monitor mechanism 164 with the changed set wavelength as a reference to maintain the center wavelength of the laser beam to the predetermined set wavelength without fail. In this case, exposure can be precisely performed, in a state as if there were no change in environment from the standard state (that is, a state where the variation amount in optical performance is cancelled out).

Also, with the exposure apparatus 10 in the embodiment, each time the set wavelength is changed, the main controller 50 corrects the change in image forming characteristics excluding the environmental change of the projection optical system PL that is corrected by changing the set wavelength, by driving the driving elements 74a, 74b, and 74c via the image forming characteristics correction controller 78. With this operation, a large part of the environmental change in the image forming characteristics of the projection optical system PL is corrected by the change in set wavelength described above, and the remaining environmental change, irradiation change, temperature change, and the like of the projection optical system PL is corrected by driving the driving elements 74a, 74b, and 74c with the image forming characteristics correction controller 78. As a consequence, exposure with high precision is performed in a state where the image forming characteristics of the projection optical system PL is almost completely corrected.

In the embodiment above, to control the oscillation wavelength of the laser light source 160A, the laser beam is monitored by the beam monitor mechanism 164 arranged immediately after the laser light source 160A. The present invention, however, is not limited to this, and as is shown in FIG. 5 in dotted lines, the laser beam may be separated within the wavelength conversion portion 163 (or downstream in the wavelength conversion portion 163), and may be monitored by the beam monitor mechanism 183, which is similar to the beam monitor mechanism 164. And, the main controller 50 detects whether the wavelength conversion is performed accurately based on the monitoring results of the beam monitor mechanism 183, and based on the detection results may feedback control the laser controller 16B. Naturally, the monitoring results of both beam monitor mechanisms may be used to perform oscillation wavelength control of the laser light source 160A. Furthermore, when the set wavelength is changed to correct the environmental change (for example, including at least the atmospheric pressure) of the projection optical system PL, the set wavelength may be changed to the detection reference wavelength of the etalon element structuring the beam monitor mechanism 183.

Instead of utilizing the temperature dependence of the resonance wavelength of the wavelength detection unit in the embodiment described above, the resonator length of the Fabry-Perot etalon structuring the wavelength detection unit may be made variable with the piezo element and the like, and the resonator length dependence of the resonance wavelength may be utilized. This allows wavelength conversion at a high speed.

In the embodiment above, the case has been described when the on/off operation of the light output of each optical path (each channel) is performed, by switching the intensity of the pumped light of the fiber amplifier. The present invention, however, is not limited to this, and for example, various cases may be considered such as a mechanical or an electrical shutter being arranged to cut off the light incident on each optical path, or a mechanical or an electrical shutter being arranged so as to prevent the light from each optical path from being emitted.

In addition, in the embodiment above, the case has been described when the optical path of the light amplifying portion 161 is 128 channels, however, the channel of the light amplifying portion may be only one channel. Even in such a case, the frequency control of the pulse light emitted from the optical modulator such as the EOM, and light amount, exposure amount control by peak power control can be suitably applied.

In the embodiment above, the polarization adjustment unit 16D performs circular polarization adjustment on the emitted light of the optical fiber amplifier $171_n$. However, in the case the polarization is an elliptical polarization, which adjustment is similar to the circular polarization, instead of the quarter-wave plate 162, a combination of a half-wave plate that rotates the plane of polarization and a quarter-wave plate which is optically connected in series to the half-wave plate can be used to convert the plurality of beams emitted from the optical fiber amplifier $171n$ to a linear polarized beam in the same polarized direction. Either of the half-wave plate or the quarter-wave plate may be arranged upstream, in the series connection.

In addition, in the embodiment above, the light incident on the quarter-wave plate 162 is the emitted light from the optical fiber amplifier $171_n$, however, a plurality of beams emitted from a plurality of optical fiber for optical waveguiding may be incident on the quarter-wave plate 162.

Also, in the embodiment above, the case has been described when the light amplifying portion 161 has optical paths of 128 channels, and the 128 optical fibers making up the emitting end of the optical paths structure the bundle-fiber. However, the number of optical paths, accordingly, the number of fibers forming the bundle-fiber, may be any number, and the number can be determined depending on the product in which the light source unit related to the present invention is applied, such as, the specification (illuminance on the wafer) and optical properties required in the exposure apparatus, that is, the transmittance of the illumination optical system and the projection optical system, the conversion efficiency of the wavelength conversion portion, and the output of the optical path. Even in such a case, the frequency control of the pulse light emitted from the optical modulator referred to earlier, and light amount, exposure amount control by peak power control can be suitably applied.

Furthermore, the wavelength of the ultraviolet light is set almost the same as that of the ArF excimer laser or the $F_2$ laser in the embodiment above, however, the set wavelength may be of any wavelength, and the oscillation wavelength of the laser light source 160A, the structure of the wavelength conversion portion 163, and the magnification of the harmonic wave may be decided according to the set wavelength. As an example, the set wavelength may be set in accordance with the design rule (such as the line width and pitch) of the pattern to be transferred onto the wafer, moreover, on deciding the set wavelength, the exposure conditions and the type of reticle (whether the reticle is the phase shift type or not) previously referred to may be considered.

In the embodiment above, the case has been described when the polarization adjustment unit 16D is arranged to perform circular polarization on the respective lights emitted from the optical fiber amplifier $171_n$, and the beams are linearly polarized in the same polarized direction by a quarter-wave plate 162. However, for example, in the case the arrangement of the light amplifying portion is changed, the polarization adjustment unit or the quarter-wave plate 162 are not necessarily required.

MODIFIED EXAMPLE

FIG. 7 shows a modified example of the arrangement of the light amplifying portion 161 that does not require the polarization adjustment unit or the quarter-wave plate (polarized direction conversion unit). Hereinafter, in order to avoid repetition, structures and components identical or equivalent to those described in the embodiment above are designated with the same reference numerals, and the description thereabout is briefly made or is entirely omitted.

The light amplifying portion 161 shown in FIG. 7 amplifies the pulse light emitted from the EOM160 described earlier. The structure of the light amplifying portion 161 includes: a branch and delay portion 167 which divides and branches (for example, into 128 branches) the pulse light from the EOM160C temporally and periodically; and a fiber amplifier 190 serving as a plurality of optical amplifiers.

The fiber amplifier 190 comprises: an amplifying fiber 175 arranged linearly which serves as an optical waveguiding member; a pumping semiconductor laser 178 generating the pumped light; and a WDM179 which synthesizes the light emitted from the EOM160C and the pumped light, and supplies the synthetic light to the amplifying fiber 175. And the amplifying fiber 175 and the WDM179 is housed in a container 191.

The amplifying fiber 175 is mainly made of phosphate glass, and has a core and a cladding. An optical fiber is used for the amplifying fiber 175, which uses dopants Er, or Er and Yb with high density as the core. With such a phosphate glass optical fiber, rare earth elements such as Er can be doped with a higher density than that of the conventional silica glass optical fiber, and the fiber length required to obtain the same amplification is around 1/100 compared with the conventional silica glass optical fiber. For example, the required fiber length was conventionally around several m to several tens of m, whereas, now only several cm to several tens of cm is needed. Therefore, it becomes possible to arrange the amplifying fiber 175 in a linear state, and in the modified example in FIG. 7, the amplifying fiber 175 is arranged in a linear state by arranging the amplifying fiber 175 in a linear V groove formed on the surface (plane) of the base member (not shown in Figs.). For the amplifying fiber 175, it is possible to employ a dual cladding fiber that has a dual cladding structure.

With the fiber amplifier 190 having the structure described above, when the pulse light is incident on the amplifying fiber 175 via the WDM179 in a state where the pumped light generated by the pumping laser semiconductor 178 is supplied to the amplifying fiber 175 via the WDM179, and proceeds through the core of the amplifying fiber 175, stimulated emission is generated and the pulse light is amplified. On such amplifying, since the amplifying fiber 175 is much shorter than the conventional fiber, and has high amplification, a pulse light with high luminance is emitted while maintaining the polarized state when the pulse light was incident on the amplifying fiber 175. In addition, since the length of the amplifying fiber 175 is extremely short, the spectral broadening due to guided Raman scattering or self-phase modulation is small.

That is, in the case of doping Er, which has the density 100 times compared with the conventional silica glass, to a phosphate glass, the Raman gain coefficient, which is a factor of deciding the threshold value of the Raman scattering, is around twice as much compared with the conventional silica glass. However, even with consideration of this point, the Er doped phosphate glass can emit light having the intensity of around 50 times more than in the case of conventional silica glass. In addition, since the amplification per unit length can be increased by around 100 times, the fiber length required to obtain the same amplification can be reduced to around 1/100. Furthermore, since trial calculation can be made that the threshold value of the guided Raman scattering is inversely proportional to the fiber length, by reducing the fiber length to 1/100, light having an intensity of around 100 times can be emitted without being affected by the Raman scattering.

In addition, the spectral broadening due to self-phase modulation is almost proportional to the length of the amplifying fiber 175, however, since the length of the amplifying fiber 175 is extremely short compared with the conventional fiber, the spectral broadening due to self-phase modulation can be sufficiently suppressed so that it is much smaller than before.

Accordingly, the fiber amplifier 190 in the modified example can obtain an amplified light having a higher intensity than before, and an amplified light which spectral broadening is narrow. Therefore, a narrow-banded light can be effectively obtained.

In addition, since the amplifying fiber 175 is arranged linearly, and is also housed in the container 191 that has a structure nearly sealed so as to maintain a fixed surrounding environment of the amplifying fiber 175, the emitted light from the amplifying fiber 175 canal most maintain the polarized state at the incident stage.

The pumping semiconductor laser 178 generates light having a wavelength shorter (for example, 980 nm) than the oscillation wavelength of the DFB semiconductor laser 160A as the pumped light. The pumped light is supplied to the amplifying fiber 175 via the WDM 179, and with this operation, the Er is pumped and the so-called population inversion of the energy level is generated. Likewise with the previous description, the pumping semiconductor laser 178 is controlled by the light amount controller 16C.

Also, in the modified example, in order to suppress the gain difference in each fiber amplifier 190, a part of the output is branched in the fiber amplifier 190, and the output is photo-electrically converted by the photoconversion element 181 arranged on the end of the branch, respectively. The output signals of these photoconversion elements 181 are sent to the light amount controller 16C.

The light amount controller 16C feedback controls the drive current of each pumping laser semiconductor 178, so as to make the light emitted from each fiber amplifier 190 constant (in other words, balanced).

In addition, the light amount controller 16C monitors the light intensity of the wavelength conversion portion 163 based on the output signals from the photoconversion element 182, and feedback controls the driver current of the pumping semiconductor laser 178 so that the light emitted from the wavelength conversion portion 163 is a predetermined light output.

With this arrangement, since the amplification of each fiber amplifier 190 is made constant, a uniform light intensity can be obtained as a whole without an unbalanced load between the fiber amplifiers 190. Also, by monitoring the light intensity of the wavelength conversion portion 163, the predetermined light intensity expected is fed back so as to obtain a stable output of the desired ultraviolet light.

The light amplifying portion in FIG. 7, can be employed in place of the light amplifying portion in FIG. 3, and with the light source employing the light amplifying portion 161 in FIG. 7, the incident light can be amplified with high amplification by the amplifying fiber 175 that has a short length. Therefore, the change in the polarized state that occur when the incident light passes through the amplifying fiber 175 can be reduced, while supplying light with high intensity to the wavelength conversion portion 163. In addition, since the length of the path the light proceeds through on amplification is shorter, the spectral broadening due to the guided Raman scattering and self-phase modulation can be suppressed. Accordingly, a wavelength converted light having a narrow bandwidth can be effectively generated with a simple arrangement.

In addition, since the amplifying fiber 175 is arranged in a linear state, asymmetric stress being generated in the diameter direction, which causes change in the polarized state, can be prevented, therefore, the light emitted from the amplifying fiber 175 can almost maintain the polarized state at the incident stage.

Also, since the amplifying fiber 175 is housed in the container 191 having a nearly sealed structure, change in the surrounding environment of the amplifying fiber 175, which is the cause of change in the polarized state, can be prevented, thus a stable wavelength conversion can be performed.

As is described above, as a consequence, with the light source unit employing the light amplifying portion 161 in FIG. 7, the polarization adjustment unit and the quarter-wave plate (polarized direction conversion unit) do not necessarily have to be arranged.

In the description above, as the amplifying fiber 175, the optical fiber mainly made of phosphate glass is used, however, it is possible to use an optical fiber mainly made of bismuth oxide glass ($Bi_2O_3B_2O_3$). With the bismuth oxide glass, the amount of erbium doped can be 100 times and over, compared with the conventional silica glass, and can obtain similar effect as in the case of phosphate glass. In addition, with the modified example, as the amplifying fiber, the Er-doped fiber is employed, however, it is possible to employ the Yb-doped fiber and other rare-earth element doped fibers. Also, the amplifying optical waveguide member is not limited to the optical fiber type member, and it is possible to use other options, such as the planar type waveguide member.

In addition, although it is not specifically referred to in the description above, with the exposure apparatus which performs exposure using the wavelength of 193 nm and under as in the embodiment, measures such as filling or creating a flow of clean air that has passed through a chemical filter, dry air, $N_2$ gas, or inert gas such as helium, argon, or krypton in the passage of the exposure beam, or vacuuming the passage of the exposure beam, need to be taken.

The exposure apparatus in the embodiment above is made by assembling various subsystems including elements defined in the claims of the present application so as to keep a predetermined mechanical precision, electrical precision, and optical precision. In order to ensure these areas of precision, prior to and after the assembly, adjustment (for example, optical axis adjustment) is performed on various optical systems such as the illumination optical system 12 and the projection optical system PL to attain a predetermined optical precision, adjustment is performed on various mechanical systems to attain a predetermined mechanical precision, and adjustment is performed on various electrical systems to attain a predetermined electrical precision, respectively. Of these adjustments, since the light source for adjustment (testing) does not require high power when the properties of various optical systems are adjusted, with the light source 16 previously described, the arrangement can be simplified so as to use one or several fiber amplifiers 168 as the light source. In such a case, light having almost the same wavelength as the wavelength of the exposure light can be easily generated, and can be used for adjustment. Therefore, an accurate adjustment can be made with a cost effective light source having a simple arrangement. In the case of simplifying the arrangement so that only one fiber amplifier 168 is used, then the branch and delay portion 167 will not be required.

The process of incorporating various subsystems into an exposure apparatus includes mechanical connection of various subsystems, by wiring electrical circuits, piping pressure circuits, and the like. Obviously, before the process of incorporating various subsystems into an exposure apparatus, the process of assembling the respective subsystems is performed. After the process of assembling various subsystems into the exposure apparatus is completed, total adjustment is performed to ensure preciseness in the overall exposure apparatus. In such overall adjustment as well, the simplified light source can be used when necessary. The exposure apparatus is preferably made in a clean room in which temperature, degree of cleanliness, and the like are controlled.

In addition, with the embodiment above, the example has been described when the light source unit related to the present invention is used for the light source to generate the illumination light for exposure, however, it is possible to use the light source for reticle alignment described above, which requires almost the same wavelength as that of the illumination light for exposure. In this case, it is a matter of course that the light source of the simplified arrangement described above is used.

Also, in the embodiment above, the case has been described when the light source unit is used in a scanning exposure apparatus based on the step-and-scan method, however, the light source unit related to the present invention can be applied in units besides the exposure apparatus, for example, in a laser repair unit used to cut off a part of a circuit pattern (such as a fuse) formed on a wafer. In addition, the light source unit in the present invention can also be applied to inspection units using visible light or infrared light. And in this case, there is no need to incorporate the wavelength conversion portion into the light source. That is, the present invention is also effective with not only the ultraviolet laser unit, bus also with the laser unit that generates a fundamental wave in the visible light region or the infrared light region having no wavelength conversion portion.

Furthermore, the light source of the present invention can be utilized in units other than the exposure apparatus, for example, as the light source unit in the optical testing unit and the like. Also, the light source of the present invention can be used as the light source in the unit to perform eyesight correction by irradiating ultraviolet light on the eye ground. Moreover, the light source of the present invention can be used in various exposure apparatus using the excimer laser beam.

In addition, the present invention is not limited to the scanning exposure apparatus based on the step-and-scan method, and can be suitably applied to the static exposure type, for example, to the exposure apparatus based on the step-and-repeat method (such as the stepper). Furthermore, the present invention can also be applied to the exposure apparatus based on the step-and-stitch method, to the mirror projection aligner, and the like.

The projection optical system and the illumination optical system referred to above in the embodiment, is a mere example, and it is a matter of course that the present invention is not limited to this. For example, the projection optical system is not limited to the refraction optical system, and a reflection system made up on only reflection optical elements or a reflection refraction system (a catadioptric system) that is made up of both the reflection optical elements and the refraction optical elements may be employed. With the exposure apparatus using vacuum ultraviolet light (VUV light) having the wavelength of around 200 nm and under, the use of the reflection refraction system can be considered. As the projection optical system of the reflection/refraction type, for example, a reflection/refraction system having a beam splitter and concave mirror as reflection optical elements, which details are disclosed in, for example, Japanese Patent Laid Open No. 08-171054 and the corresponding U.S. Pat. No. 5,668,672, Japanese Patent Laid Open No. 10-20195 and the corresponding U.S. Pat. No. 5,835,275 can be used. Or, the reflection/refraction system having a concave mirror and the like as reflection optical elements without using any beam splitter, which details are disclosed in, for example, Japanese Patent Laid Open No. 08-334695 and the corresponding U.S. Pat. No. 5,689,377, Japanese Patent Laid Open No. 10-3039 and the corresponding U.S. patent application Ser. No. 873,605 (application date: Jun. 12, 1997) can also be used. As long as the national laws in designated states or elected states, to which this international application is applied, permit, the disclosures cited above are fully incorporated herein by reference.

Besides the systems referred to above, the reflection/refraction system in which a plurality of refracting optical elements and two mirrors (a concave mirror serving as a main mirror, and a sub-mirror serving as a back-mirror forming a reflection plane on the side opposite to the incident plane of a refracting element or a parallel flat plate) are arranged on the same axis, and an intermediate image of the reticle pattern formed by the plurality of refracting optical elements is re-formed on the wafer by the main mirror and the sub-mirror, may be used. The details of this system is disclosed in, U.S. Pat. No. 5,488,229, and the Japanese Patent Laid Open No. 10-104513. In this reflection/refraction system, the main mirror and the sub-mirror are arranged in succession to the plurality of refracting optical elements, and the illumination light passes through a part of the main mirror and is reflected on the sub-mirror and then the main mirror. It then further proceeds through a part of the sub-mirror and reaches the wafer. As long as the national laws in designated states or elected states, to which this international application is applied, permit, the disclosures cited above are fully incorporated herein by reference.

In addition, with the embodiment above, the fly-eye lens system is used as the optical integrator (homogenizer), however, instead of this arrangement, the rod integrator may be used. In the illumination optical system that uses the rod integrator, the rod integrator is arranged so that its outgoing surface is almost conjugate with the pattern surface of the reticle R, therefore, for example, the fixed reticle blind 30A and the movable reticle blind 30B may be arranged in the vicinity of the outgoing surface of the rod integrator.

Of course, the present invention can be suitably applied to not only the exposure apparatus used to manufacture a semiconductor device, but also to the exposure apparatus used to manufacture a display including the liquid crystal display device that transfers the device pattern onto a glass plate, to the exposure apparatus used to manufacture a thin-film magnetic head that transfers the device pattern onto a ceramic wafer, to the exposure apparatus used to manufacture a pick-up device (such as a CCD), a micromachine, a DNA chip, and furthermore, to the exposure apparatus used to manufacture a mask or a reticle.

Device Manufacturing Method

A device manufacturing method using the exposure apparatus and the exposure method described above in a lithographic process will be described next.

Figure 8:
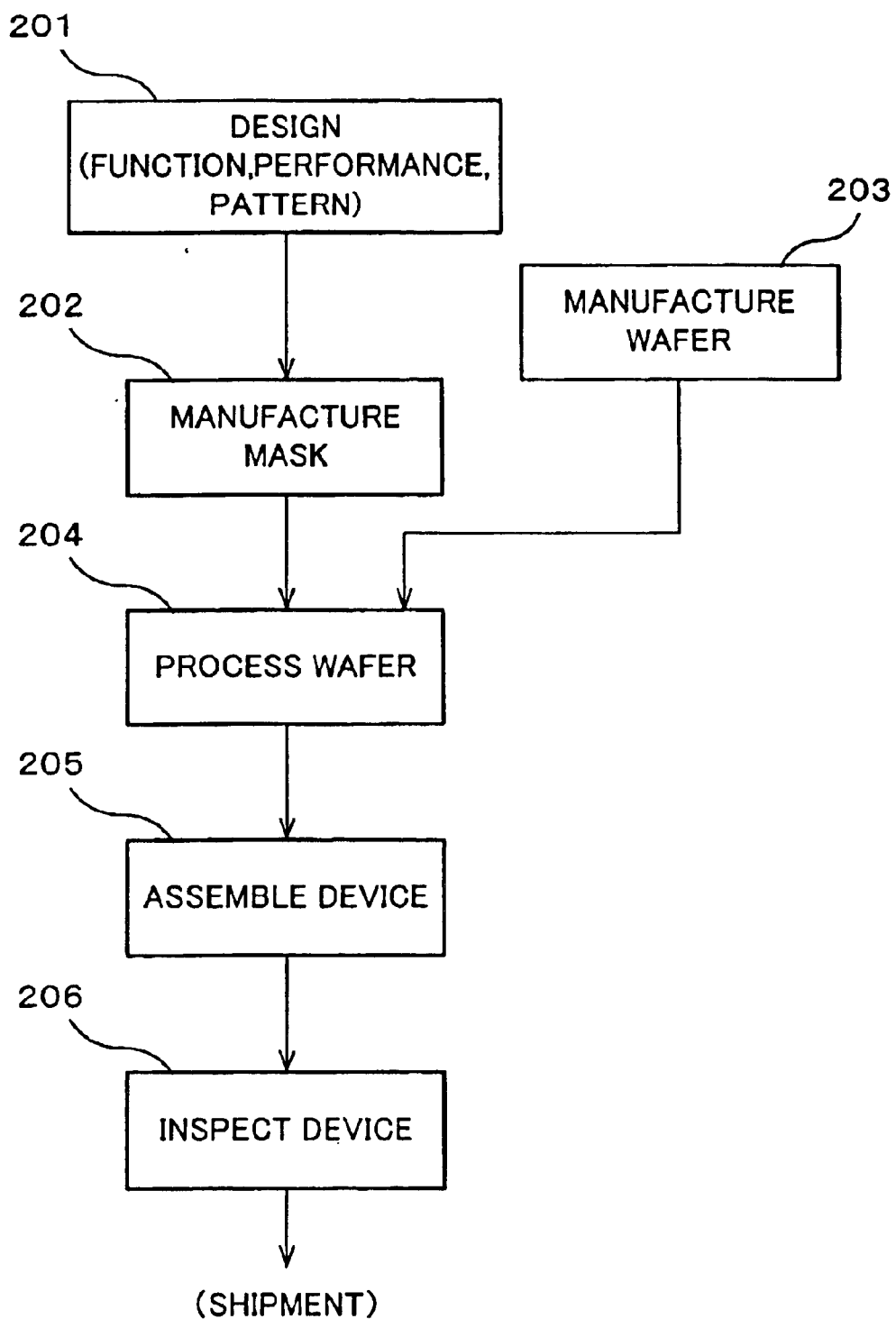
FIG. 8 is a flow chart explaining an embodiment of a device manufacturing method according to the present invention.

FIG. 8 is a flowchart showing an example of manufacturing a device (a semiconductor chip such as an IC or LSI, a liquid crystal panel, a CCD, a thin magnetic head, a micromachine, or the like). As shown in FIG. 8, in step 201 (design step), function/performance is designed for a device (e.g., circuit design for a semiconductor device) and a pattern to implement the function is designed. In step 202 (mask manufacturing step), a mask on which the designed circuit pattern is formed is manufactured. In step 203 (wafer manufacturing step), a wafer is manufacturing by using a silicon material or the like.

Next, in step 204 (wafer processing step), an actual circuit and the like is formed on the wafer by lithography or the like using the mask and wafer prepared in steps 201 to 203, as will be described later. In step 205 (device assembly step), a device is assembled using the wafer processed in step 204. Step 205 includes processes such as dicing, bonding, and packaging (chip encapsulation).

Finally, in step 206 (inspection step), a test on the operation of the device, durability test, and the like are performed. After these steps, the device is completed and shipped out.

Figure 9:
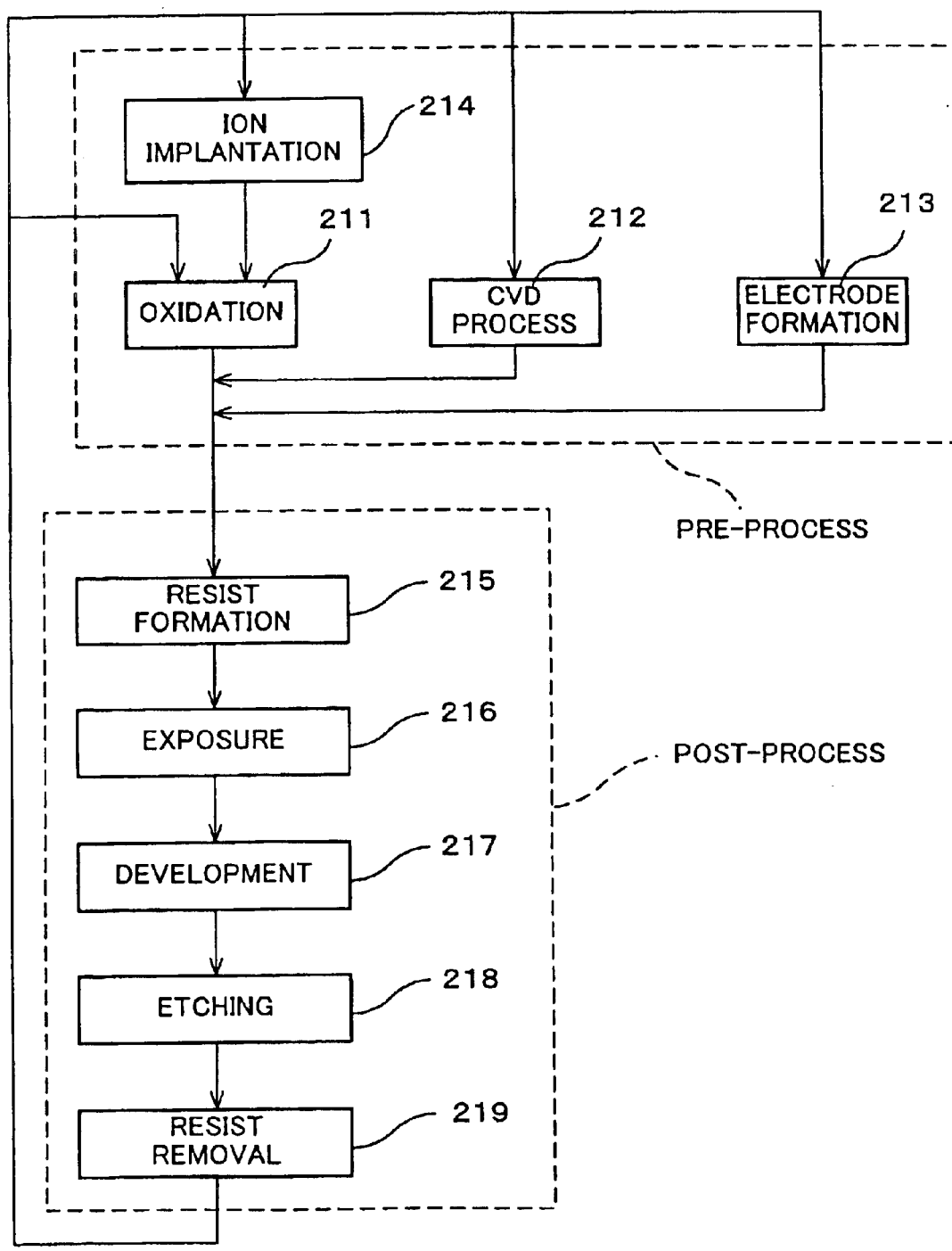
FIG. 9 is a flow chart showing the processing in step 204 in FIG. 8.

FIG. 9 is a flow chart showing a detailed example of step 204 described above in manufacturing the semiconductor device. Referring to FIG. 9, in step 211 (oxidation step), the surface of the wafer is oxidized. In step 212 (CVD step), an insulating film is formed on the wafer surface. In step 213 (electrode formation step), an electrode is formed on the wafer by vapor deposition. In step 214 (ion implantation step), ions are implanted into the wafer. Steps 211 to 214 described above constitute a pre-process for the respective steps in the wafer process and are selectively executed in accordance with the processing required in the respective steps.

When the above pre-process is completed in the respective steps in the wafer process, a post-process is executed as follows. In this post-process, first, in step 215 (resist formation step), the wafer is coated with a photosensitive agent. Next, as in step 216, the circuit pattern on the mask is transcribed onto the wafer by the above exposure apparatus and method. Then, in step 217 (developing step), the exposed wafer is developed. In step 218 (etching step), an exposed member on a portion other than a portion where the resist is left is removed by etching. Finally, in step 219 (resist removing step), the unnecessary resist after the etching is removed.

By repeatedly performing these pre-process and post-process steps, multiple circuit patterns are formed on the wafer.

As described above, according to the device manufacturing method of the embodiment, the exposure apparatus 10 and the exposure method in the embodiment above is used in the exposure process (step 216). Therefore, by improving the exposure accuracy, a device with high integration can be manufactured with high yield.

INDUSTRIAL APPLICABILITY

As is described, the light source related to the present invention is suitable to perform light amount control with high precision. In addition, the wavelength stabilizing control method related to the present invention is suitable to set and maintain the center wavelength of the laser beam to a predetermined set wavelength. Also, the exposure apparatus and the exposure method related to the present invention is suitable to form a fine pattern onto a substrate such as a wafer in a lithographic process when manufacturing microdevices such as an integrated circuit. And, the device manufacturing method according to the present invention is suitable to manufacture a device having a fine pattern.

What is claimed is:

1. A light source unit that generates light with a single wavelength, said light source unit comprising:
    a light generating portion which generates a single wavelength laser light having a wavelength of around 1.5 µm;
    a light amplifying portion optically connected with said light generating portion, which includes at least one stage of a fiber amplifier to amplify said single wavelength laser light;
    a fiber group made up of a plurality of optical fibers arranged in parallel on an output side of said light generating portion;
    a light amount control unit which controls light amount emitted from said fiber group by individually turning on/off light output from each optical fiber of said fiber group; and
    a wavelength conversion portion which generates one of an eighth-harmonic wave and a tenth-harmonic wave of said single wavelength laser light having said wavelength of around 1.5 µm from said fiber group.

2. The light source unit according to claim 1, wherein at least an output end of each of said plurality of optical fibers making up said fiber group is bundled so as to structure a bundle-fiber.

3. The light source unit according to claim 1, wherein
    said at least one stage of the fiber amplifier is arranged on a part of each optical path, which is structured including said each optical fiber, and
    said light amount control unit performs on/off operation of said light output from said each optical fiber by switching intensity of pumped light from a pumping light source of said fiber amplifier.

4. The light source unit according to claim 3, wherein said light amount control unit performs said switching of pumped light intensity by selectively setting intensity of pumped light from said pumping light source to one of a predetermined level and a zero level.

5. The light source unit according to claim 4, wherein said light amount control unit selectively sets said intensity of pumped light from said pumping light source to one of said predetermined level and said zero level by performing on/off operation on said pumping light source.

6. The light source unit according to claim 3, wherein said light amount control unit performs said intensity switching of said pumped light by selectively setting said pumped light intensity from said pumping light source to one of a predetermined first level and a second level smaller than said first level.

7. The light source unit according to claim 3, wherein
    said each optical path has a plurality of said fiber amplifiers arranged, and
    said light amount control unit performs on/off operation of said light output from said each optical fiber by switching intensity of pumped light from a pumping light source of a fiber amplifier arranged at a final stage.

8. The light source unit according to claim 7, wherein a mode field diameter of said fiber amplifier arranged most downstream directly before said light output is large, when compared with other fiber amplifiers arranged before said fiber amplifier.

9. The light source unit according to claim 1, said light source further comprising:
    a memory unit which has an output intensity map corresponding to an on/off state of light output from said each optical fiber stored in advance, and
    said light amount control unit individually turns on/off light output from said each optical fiber based on said output intensity map and a predetermined set light amount.

10. The light source unit according to claim 9, wherein said output intensity map is made based on dispersion of light output from said each optical fiber measured in advance.

11. The light source unit according to claim 9, wherein
    said output intensity map is made with consideration on light output dispersion due to dispersion in wavelength conversion efficiency, which corresponds to light output from said each optical fiber measured in advance.

12. The light source unit according to claim 1, wherein
said light generating portion includes a light source and an optical modulator of which at least one is connected to said light amount control unit, and pulse-emits said single wavelength laser light by at least one of the light source and the optical modulator.

13. The light source unit according to claim 12,
an optical unit which suppresses broadening of a wavelength width of light between said light source and said wavelength conversion portion.

14. The light source unit according to claim 1, wherein
said light generating portion includes a light source which generates light having a single wavelength and an optical modulator which converts and emits said light from said light source into a pulse light having a predetermined frequency, and
said light amount control unit further controls at least one of a frequency and a peak power of said pulse light emitted from said optical modulator.

15. The light source unit according to claim 1, said light source unit further comprising a delay portion, which individually delays light output from said plurality of optical fibers respectively so as to stagger said light output temporally.

16. The light source unit according to claim 1, wherein
said light generating portion has a laser light source to oscillate a laser beam, and said light source unit further comprises:
a beam monitor mechanism which monitors the optical properties of said laser beam related to wavelength stabilizing to maintain a center wavelength of said laser beam to a predetermined set wavelength; and
a wavelength calibration control unit which performs wavelength calibration based on temperature dependence data of detection reference wavelength of said beam monitor mechanism.

17. The light source unit according to claim 16, said light source further comprising:
a polarization adjustment unit which orderly arranges a polarized state of a plurality of light beams with the same wavelength having passed through said plurality of optical fibers; and
a polarized direction conversion unit which converts all light beams having passed through said plurality of optical fibers into a plurality of linearly polarized light beams that have the same polarized direction.

18. The light source unit according to claim 17, wherein
at least a fiber amplifier that can perform optical amplification is arranged on a part of each optical path, which is structured including said each optical fiber, and
said fiber amplifier has an optical fiber, which main material is one of phosphate glass and bismuth oxide glass doped with a rare-earth element, serving as an optical waveguide member.

19. An apparatus used in a device manufacturing process, comprising:
a light source unit according to claim 1; and
a main body optically connected to the light source unit to irradiate light generated from the light source unit onto an object.

20. An apparatus according to claim 19, wherein
said object includes a substrate having a pattern illuminated with said light from said light source unit.

21. A light source unit that generates light with a single wavelength, said light source unit comprising:

a light generating portion that has a single wavelength laser light source and an optical modulator to generate a single wavelength pulse light having a wavelength of around 1,5μm;
a light amplifying portion which includes at least one fiber amplifier to amplify said pulse light generated by said light generating portion;
a light amount control unit which controls light amount emitted from said light amplifying portion by controlling a frequency of said pulse light; and
a wavelength conversion portion which generates one of an eighth-harmonic wave and a tenth-harmonic wave of said pulse light having said wavelength of around 1.5μm.

22. The light source unit according to claim 21, said light source unit further comprising:
a memory unit which has an output intensity map corresponding to a frequency of said pulse light entering said light amplifying portion stored, and
said light amount control unit controls said frequency of said pulse light emitted from said optical modulator based on said output intensity map and a predetermined set light amount.

23. The light source unit according to claim 21, wherein said light amount control unit further controls a peak power of said pulse light emitted from said optical modulator.

24. The light source unit according to claim 21, wherein
said optical modulator is an electrooptical modulator, and
said light amount control unit controls said frequency of said pulse light by controlling a frequency of voltage pulse impressed on said optical modulator.

25. The light source unit according to claim 21, wherein
said light amplifying portion is arranged in plural and in parallel, and
an output end of each said light amplifying portion is each made up of an optical fiber.

26. The light source unit according to claim 25, wherein a plurality of said optical fibers that respectively make up said light amplifying portion in plural are bundled so as to structure a bundle-fiber.

27. The light source unit according to claim 21, wherein
said light generating portion has a laser light source serving as said light source that oscillates a laser beam, and said light source unit further comprises:
a beam monitor mechanism which monitors the optical properties of said laser beam related to wavelength stabilizing to maintain a center wavelength of said laser beam to a predetermined set wavelength; and
a wavelength calibration control unit which performs wavelength calibration based on temperature dependence data of detection reference wavelength of said beam monitor mechanism.

28. The light source unit according to claim 27, wherein
said light amplifying portion is arranged in plural and in parallel, and said light source unit further comprises:
a polarization adjustment unit which orderly arranges a polarized state of a plurality of light beams with the same wavelength having passed through said plurality of optical fibers that respectively structure said plurality of light amplifying portions; and
a polarized direction conversion unit which converts all light beams having passed through said plurality of optical fibers into a plurality of linearly polarized light beams that have the same polarized direction.

29. The light source unit according to claim 28, wherein said fiber amplifier has an optical fiber, which main material is one of phosphate glass and bismuth oxide glass doped with a rare-earth element, serving as an optical waveguide member.

30. An apparatus used in a device manufacturing process, comprising:
   a light source unit according to claim 21; and
   a main body optically connected to the light source unit to irradiate light generated from the light source unit onto an object.

31. An apparatus according to claim 30, wherein said object includes a substrate having a pattern illuminated with said light from said light source unit.

32. A light source unit that generates light with a single wavelength, said light source unit comprising:
   a light generating portion that has a single wavelength laser light source and an optical modulator to generate a single wavelength pulse light having a wavelength of around 1.5 µm
   a light amplifying portion which includes at least one fiber amplifier to amplify said pulse light generated by said light generating portion;
   a light amount control unit which controls light amount emitted from said light amplifying portion by controlling a peak power of said pulse light; and
   a wavelength conversion portion which generates one of an eighth-harmonic wave and a tenth-harmonic wave of said pulse light having said wavelength of around 1.5 µm.

33. The light source unit according to claim 32, said light source unit further comprising:
   a memory unit which has an output intensity map corresponding to intensity of said pulse light entering said light amplifying portion stored, and
   said light amount control unit controls said peak power of said pulse light emitted from said optical modulator based on said output intensity map and a predetermined set light amount.

34. The light source unit according to claim 32, wherein said optical modulator is an electrooptical modulator, and
   said light amount control unit controls said peak power of said pulse light by controlling a peak level of voltage pulse impressed on said optical modulator.

35. The light source unit according to claim 32, wherein said light amplifying portion is arranged in plural and in parallel, and
   an output end of each said light amplifying portion is each made up of an optical fiber.

36. The light source unit according to claim 35, wherein a plurality of said optical fibers that respectively make up said light amplifying portion in plural are bundled so as to structure a bundle-fiber.

37. The light source unit according to claim 35, said light source unit further comprising a delay portion, which individually delays light output from said plurality of light amplifying portions respectively so as to stagger said light output temporally.

38. The light source unit according to claim 32, wherein said light generating portion has a laser light source serving as said light source that oscillates a laser beam, and said light source unit further comprises:
   a beam monitor mechanism which monitors the optical properties of said laser beam related to wavelength stabilizing to maintain a center wavelength of said laser beam to a predetermined set wavelength; and
   a wavelength calibration control unit which performs wavelength calibration based on temperature dependence data of detection reference wavelength of said beam monitor mechanism.

39. A The light source unit according to claim 38, wherein said light amplifying portion is arranged in plural and in parallel, and said light source unit further comprises:
   a polarization adjustment unit which orderly arranges a polarized state of a plurality of light beams with the same wavelength having passed through said plurality of optical fibers that respectively structure said plurality of light amplifying portions; and
   a polarized direction conversion unit which converts all light beams having passed through said plurality of optical fibers into a plurality of linearly polarized light beams that have the same polarized direction.

40. The light source unit according to claim 39, wherein said fiber amplifier has an optical fiber, which main material is one of phosphate glass and bismuth oxide glass doped with a rare-earth element, serving as an optical waveguide member.

41. An apparatus used in a device manufacturing process, comprising:
   a light source unit according to claim 32; and
   a main body optically connected to the light source unit to irradiate light generated from the light source unit onto an object.

42. An apparatus according to claim 41, wherein said object includes a substrate having a pattern illuminated with said light from said light source unit.

43. A light source unit, said unit comprising:
   a laser light source which oscillates a laser beam;
   a fiber amplifying portion which amplifies said laser beam from said laser light source;
   a beam monitor mechanism which monitors an optical property of said laser beam related to wavelength stabilizing to maintain a center wavelength of said laser beam to a predetermined set wavelength; and
   a first control unit which performs wavelength calibration based on temperature dependence data of detection reference wavelength of said beam monitor mechanism.

44. The light source unit according to claim 43, said light source unit further comprising:
   an absolute wavelength provision source which provides an absolute wavelength close to said set wavelength, and
   said first control unit performs an absolute wavelength calibration to make said detection reference wavelength of said beam monitor mechanism almost coincide with said absolute wavelength provided by said absolute wavelength provision source, and also a set wavelength calibration to make said detection reference wavelength coincide with said set wavelength based on said temperature dependence data.

45. The light source unit according to claim 44, wherein said beam monitor mechanism includes a Fabry-Perot etalon,
   said temperature dependence data includes data based on measurement results on temperature dependence of a resonance wavelength of said Fabry-Perot etalon, and
   said first control unit performs said absolute wavelength calibration and said set wavelength calibration on said detection reference wavelength by controlling a temperature of said Fabry-Perot etalon structuring said beam monitor unit.

46. The light source unit according to claim 44, wherein said temperature dependence data further includes data on temperature dependence of a center wavelength of said laser beam oscillated from said laser light source, and said first control unit performs wavelength control of said laser light source together, when performing said absolute wavelength calibration.

47. The light source unit according to claim 44, wherein said absolute wavelength provision source is an absorption cell on which said laser beam is incident, and said first control unit maximizes absorption of an absorption line closest to said set wavelength of said absorption cell, as well as maximize transmittance of said Fabry-Perot etalon, when performing said absolute wavelength calibration.

48. The light source unit according to claim 43, further comprising:
a wavelength conversion portion which includes a non-linear optical crystal to convert a wavelength of said laser beam from said fiber amplifying portion.

49. The light source unit according to claim 48, wherein said laser beam has a single wavelength of around 1.5 μm, and said wavelength conversion portion generates one of an eighth-harmonic wave and a tenth-harmonic wave of said laser beam having said wavelength of around 1.5 μm.

50. The light source unit according to claim 43, said light source unit further comprising a second control unit which feedback controls a wavelength of said laser beam from said laser light source after said set wavelength calibration is completed, based on monitoring results of said beam monitor mechanism which has completed said set wavelength calibration.

51. The light source unit according to claim 43, said light source unit further comprising:
a plurality of light amplifying portions arranged in parallel that respectively include fiber amplifiers on the output side of said laser light source;
a polarization adjustment unit which orderly arranges a polarized state of a plurality of light beams with the same wavelength having passed through said plurality of optical fibers that respectively structure said plurality of light amplifying portions; and
a polarized direction conversion unit which converts all light beams having passed through said plurality of optical fibers into a plurality of linearly polarized light beams that have the same polarized direction.

52. The light source unit according to claim 51, wherein said fiber amplifier has an optical fiber, which main material is one of phosphate glass and bismuth oxide glass doped with a rare-earth element, serving as an optical waveguide member.

53. An apparatus used in a device manufacturing process, comprising:
a light source unit according to claim 43, wherein said amplified laser beam having a single wavelength in a range from an infrared region to a visible region, and the light source unit including a wavelength conversion portion that generates light having a wavelength in an ultraviolet region with said amplified laser beam; and
a main body optically connected to the light source unit to irradiate the light generated from the light source unit onto an object.

54. An apparatus according to claim 53, wherein said object includes a substrate having a pattern illuminated with said light from said light source unit.

55. A light source unit, said unit comprising:
a plurality of optical fibers;
a polarization adjustment unit which orderly arranges a polarized state of a plurality of light beams with the same wavelength having passed through said plurality of optical fibers; and
a polarized direction conversion unit which converts all light beams having passed through said plurality of optical fibers into a plurality of linearly polarized light beams that have the same polarized direction.

56. The light source unit according to claim 55, wherein said polarization adjustment unit polarizes respectively said plurality of light beams having passed through each of said optical fibers into a state nearly circular, and said polarized direction conversion unit has a quarter-wave plate.

57. The light source unit according to claim 56, wherein said optical fibers have an almost cylindrical-symmetric structure; and
said polarization adjustment unit polarizes respectively said plurality of light beams incident on each of said optical fibers into a state nearly circular.

58. The light source unit according to claim 55, wherein said polarization adjustment unit polarizes respectively said plurality of light beams having passed through each of said optical fibers into an elliptic state almost identical, and
said polarized direction conversion unit has a half-wave plate that rotates a plane of polarization and a quarter-wave plate which is optically connected in series to said half-wave plate.

59. The light source unit according to claim 55, wherein said plurality of optical fibers respectively are optical fibers making up an optical fiber amplifier, which amplifies a plurality of light beams subject to amplifying incident on said plurality of optical fibers, and waveguide said beams subject to amplifying.

60. The light source unit according to claim 56, wherein said optical fiber is made mainly of one of phosphate glass and bismuth oxide glass doped with a rare-earth element.

61. The light source unit according to claim 55, wherein said plurality of light beams incident on said plurality of optical fibers are respectively a pulse train.

62. The light source unit according to claim 55, wherein said plurality of light beams incident on said plurality of optical fibers are respectively a light beam that has been amplified by at least one stage of an optical fiber amplifier before entering said plurality of optical fibers.

63. The light source unit according to claim 55, wherein said polarization adjustment unit performs polarization adjustment by controlling optical properties of optical components arranged on the optical path further upstream of said plurality of optical fibers.

64. The light source unit according to claim 55, wherein said plurality of optical fibers are bundled almost in parallel.

65. The light source unit according to claim 55, said light source unit further comprising a wavelength conversion portion which performs wavelength conversion on light beams emitted from said polarized direction conversion unit by said light beams passing through at least one nonlinear optical crystal.

66. The light source unit according to claim 65, wherein
light emitted from said plurality of optical fibers has a single wavelength in a range from an infrared region to a visible region, and
light emitted from said wavelength conversion portion has a wavelength in an ultraviolet region.

67. The light source unit according to claim 66, wherein
said light emitted from said plurality of optical fibers has a wavelength of around 1547 µm, and
said light emitted from said wavelength conversion portion has a wavelength of around 193.4 µm.

68. An apparatus used in a device manufacturing process, comprising:
a light source unit according to claim 55, wherein the same wavelength of said polarized light beams being a single wavelength in a range from an infrared region to a visible region, and the light source unit including a wavelength conversion portion that generates light having a wavelength in an ultraviolet region with said polarized light beams; and
a main body optically connected to the light source unit to irradiae the light generated from the light source unit onto an object.

69. An apparatus according to claim 68, wherein
said object includes a substrate having a pattern illuminated with said light from said light source unit.

70. A light source unit, said unit comprising:
a light amplifying unit which includes an optical waveguiding member mainly made of any one of phosphate glass and bismuth oxide glass doped with a rare-earth element, and amplifies incident light; and
a wavelength conversion unit which converts a wavelength of light emitted from said light amplifying unit.

71. The light source unit according to claim 70, wherein said optical waveguiding member is an optical fiber which has a core to waveguide light, and a cladding arranged in the periphery of said core.

72. The light source unit according to claim 71, wherein said optical fiber is arranged linearly.

73. The light source unit according to claim 71, wherein said light amplifying unit further includes at least a container to house said optical fiber.

74. The light source unit according to claim 70, wherein said wavelength conversion unit includes at least one non-linear optical crystal to perform wavelength conversion.

75. A making method of an exposure apparatus that forms a predetermined pattern on a substrate by irradiating an exposure light on said substrate via an optical system, wherein adjustment of properties in said optical system is performed by using light which wavelength belongs to a predetermined bandwidth including a wavelength of said exposure light, said light generated by a light source unit according to claim 70.

76. An apparatus used in a device manufacturing process, comprising:
a light source unit according to claim 70, wherein said amplified light having a single wavelength in a range from an infrared region to a visible region, and said wavelength conversion unit generating light having a wavelength in an ultraviolet region; and
a main body optically connected to the light source unit to irradiate the light generated from the light source unit onto an object.

77. An apparatus according to claim 76, wherein
said object includes a substrate having a pattern illuminated with said light from said light source unit.

78. A wavelength stabilizing control method to maintain a center wavelength of a laser beam oscillated from a laser light source to a predetermined set wavelength, said wavelength stabilizing control method including:
a first step of measuring in advance temperature dependence of a detection reference wavelength of a wavelength detection unit used to detect a wavelength of said laser beam;
a second step of performing an absolute wavelength calibration to make said detection reference wavelength of said wavelength detection unit almost coincide with an absolute wavelength provided from an absolute wavelength provision source, said absolute wavelength close to said set wavelength;
a third step of setting said detection reference wavelength of said wavelength detection unit to said set wavelength, based on said temperature dependence obtained in said first step; and
a fourth step of controlling a wavelength of said laser beam from said laser light source, based on a detection result of said wavelength detection unit which said detection reference wavelength is set to said set wavelength in said third step.

79. The wavelength stabilizing control method according to claim 78, wherein
said wavelength detection unit is a Fabry-Perot etalon, and
in said first step, temperature dependence of a resonance wavelength of said wavelength detection unit is measured;
in said second step, said resonance wavelength is made to almost coincide said absolute wavelength by controlling temperature of said wavelength detection unit; and
in said third step, said resonance wavelength is set as said set wavelength by controlling temperature of said wavelength detection unit.

80. The wavelength stabilizing control method according to claim 79, wherein
said absolute wavelength provision source is an absorption cell on which said laser beam is incident, and
in said second step, absorption of an absorption line closest to said set wavelength of said absorption cell and transmittance of said wavelength detection unit are maximized.

81. The wavelength stabilizing control method according to claim 78, wherein
in said first step, temperature dependence of said center wavelength of said laser beam is further measured in advance; and
in said second step, a wavelength control of said laser beam is performed together.

82. The wavelength stabilizing control method according to claim 81, wherein said wavelength control is performed, by controlling at least one of a temperature and a current supplied to said laser light source.

\* \* \* \* \*

UNITED STATES PATENT AND TRADEMARK OFFICE
CERTIFICATE OF CORRECTION

PATENT NO. : 7,098,992 B2  Page 1 of 1
APPLICATION NO. : 10/618590
DATED : August 29, 2006
INVENTOR(S) : Tomoko Ohtsuki et al.

It is certified that error appears in the above-identified patent and that said Letters Patent is hereby corrected as shown below:

Title Page # 56
    Page 2, U.S. Patent Documents insert --5,631,773   5/1997   SUZUKI--
    Page 2, U.S. Patent Documents insert --5,694,408   12/1997   BOTT et al.--
    Page 2, Foreign Patent Documents insert --JP60-165626   8-1985   JAPAN--
    Page 2, Foreign Patent Documents insert --JP61-206585   9-1986   JAPAN--
    Page 2, Foreign Patent Documents insert --FR 2 601 787 Al   1-1988   FRANCE--
    Page 2, Foreign Patent Documents insert --3-214123   9-1991   JAPAN--
    Page 2, Foreign Patent Documents insert --4-111484   4-1992   JAPAN--
    Page 2, Foreign Patent Documents insert --5-102565   4-1993   JAPAN--
    Page 2, Foreign Patent Documents insert --5-110102   4-1994   JAPAN--
    Page 2 after Foreign Patent Documents insert:

--Other References
    F. Masetti, et al. "Fiber Delay Lines Optical Buffer for ATM Photonic Switching Applications". Networking: Foundation for the Future. San Francisco, March 28 - April 1, 1993, Proceedings of the Annual Joint Conference of the Computer and Communications Societies (INFOCOM), Los Alamitos, IEEE Comp. Soc. Press, Vol. 2 Conf. 12, March 28, 1993, pages 935-942, XP010032305. ISBN: 0-8186-3580-0

Jeffrey P. Koplow, et al. "UV Generation by Frequency Quadrupling of a Yb-Doped Fiber Amplifier". IEEE Photonics Technology Letters, Vol. 10, No. 1, January 1998. Pgs 75-77. XP000737128. ISSN: 1041-1135.--

Signed and Sealed this

Third Day of April, 2007

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,098,992 B2 |
| APPLICATION NO. | : 10/618590 |
| DATED | : August 29, 2006 |
| INVENTOR(S) | : Tomoko Ohtsuki et al. |

Page 1 of 1

It is certified that error appears in the above-identified patent and that said Letters Patent is hereby corrected as shown below:

Title Page 2, Item (56), References Cited:

Foreign Patent Documents, change "5-110102" to --6-110102--.

Signed and Sealed this

Eighteenth Day of September, 2007

JON W. DUDAS
*Director of the United States Patent and Trademark Office*